(12) United States Patent
Sugiyama

(10) Patent No.: US 6,446,692 B1
(45) Date of Patent: Sep. 10, 2002

(54) APPARATUS AND METHOD FOR MOUNTING ELECTRONIC PARTS

(75) Inventor: Osamu Sugiyama, Kanagawa (JP)

(73) Assignee: Sony Corporation, Tokyo (JP)

( * ) Notice: Subject to any disclaimer, the term of this patent is extended or adjusted under 35 U.S.C. 154(b) by 15 days.

(21) Appl. No.: 09/702,113

(22) Filed: Oct. 31, 2000

Related U.S. Application Data

(62) Division of application No. 09/147,508, filed on Apr. 19, 1999, now Pat. No. 6,331,225.

(30) Foreign Application Priority Data

| May 16, 1997 | (JP) | 9-126572 |
| Jun. 6, 1997 | (JP) | 9-149597 |
| Oct. 7, 1997 | (JP) | 9-274155 |
| Oct. 13, 1997 | (JP) | 9-278545 |
| Oct. 13, 1997 | (JP) | 9-278546 |
| May 15, 1998 | (WO) | PCT/JP98/02164 |

(51) Int. Cl.[7] .......................... H05K 13/02; H05K 3/00

(52) U.S. Cl. ..................... 156/561; 414/798; 221/270

(58) Field of Search .................. 156/556, 564, 156/565; 414/797.4, 798; 221/232, 268, 270

(56) References Cited

U.S. PATENT DOCUMENTS

| 4,401,234 A | * | 8/1983 | Droira et al. ............... 221/103 |
| 4,548,667 A | * | 10/1985 | Wical ......................... 156/356 |
| 4,889,229 A | * | 12/1989 | Yamamoto et al. ......... 206/723 |
| 4,965,927 A | * | 10/1990 | Holzman .................... 156/246 |

* cited by examiner

Primary Examiner—Michael W. Ball
Assistant Examiner—John T. Haran
(74) Attorney, Agent, or Firm—Jay H. Maioli

(57) ABSTRACT

An apparatus for mounting electronic parts on a printed circuit board in which a number of electronic parts to be mounted on a printed circuit board are arranged as a set and loaded in a loading member for electronic parts. A set of such loading members for electronic parts, each carrying a set of electronic parts of the same type, are arrayed in a loading member furnishing casing. This set of the loading members for electronic parts, arrayed and held in the loading member furnishing casings inserted and held by a loading member holder by which the set of the loading members for electronic parts can be held in register with an electronic part mounting portion of the printed circuit board. The loading member holder holding the set of the loading members for electronic parts is loaded on an electronic part loading device. The set of the electronic parts held by the loading member holder is loaded at one time on the sole printed circuit board by the electronic part loading device.

3 Claims, 45 Drawing Sheets

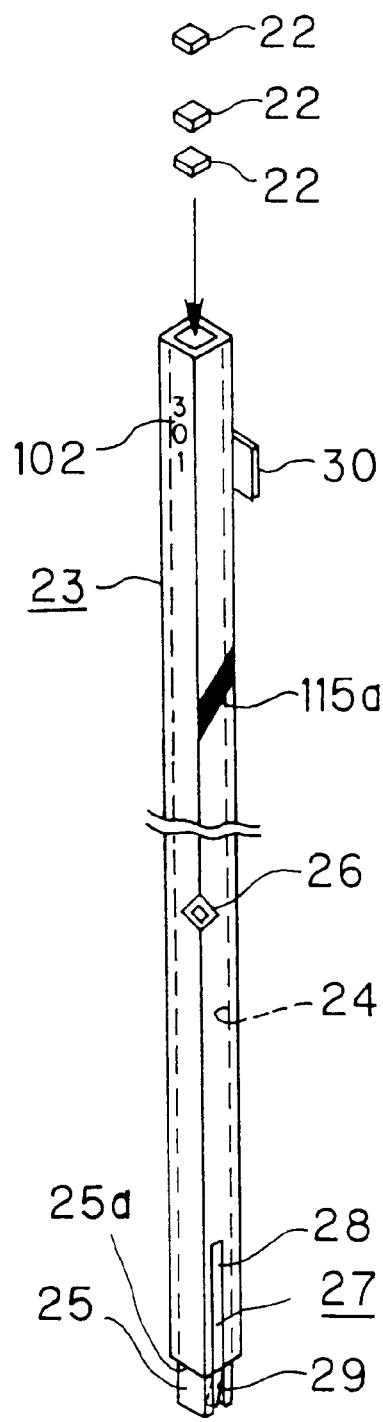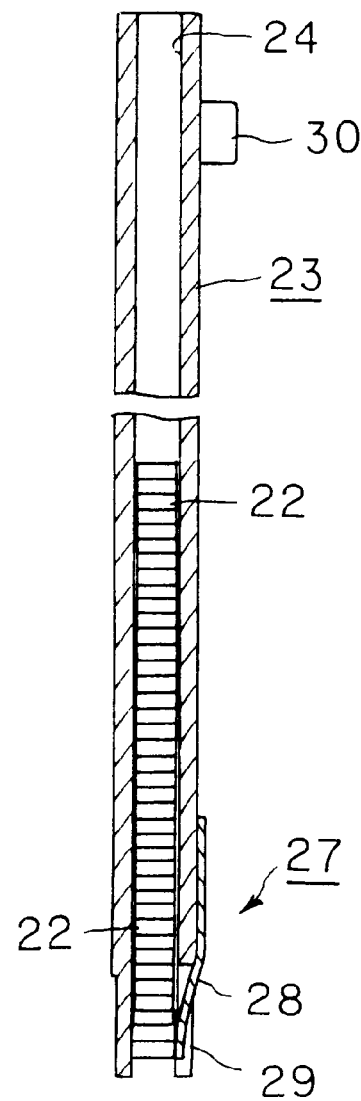
FIG.3　　　　FIG.4

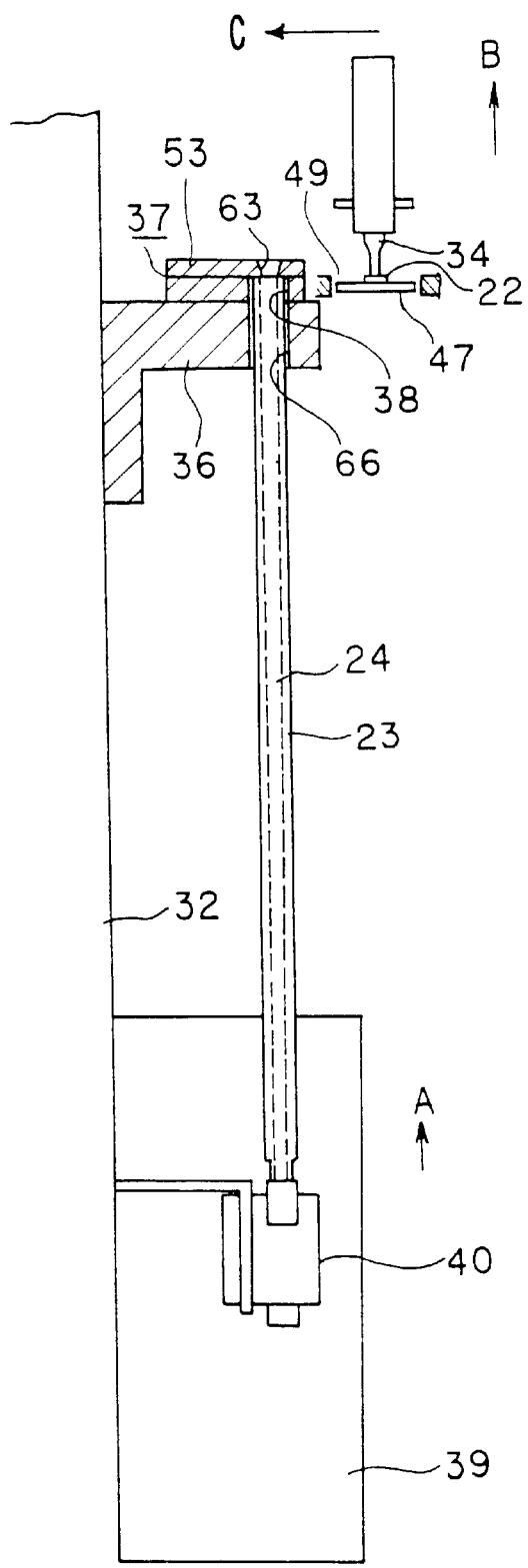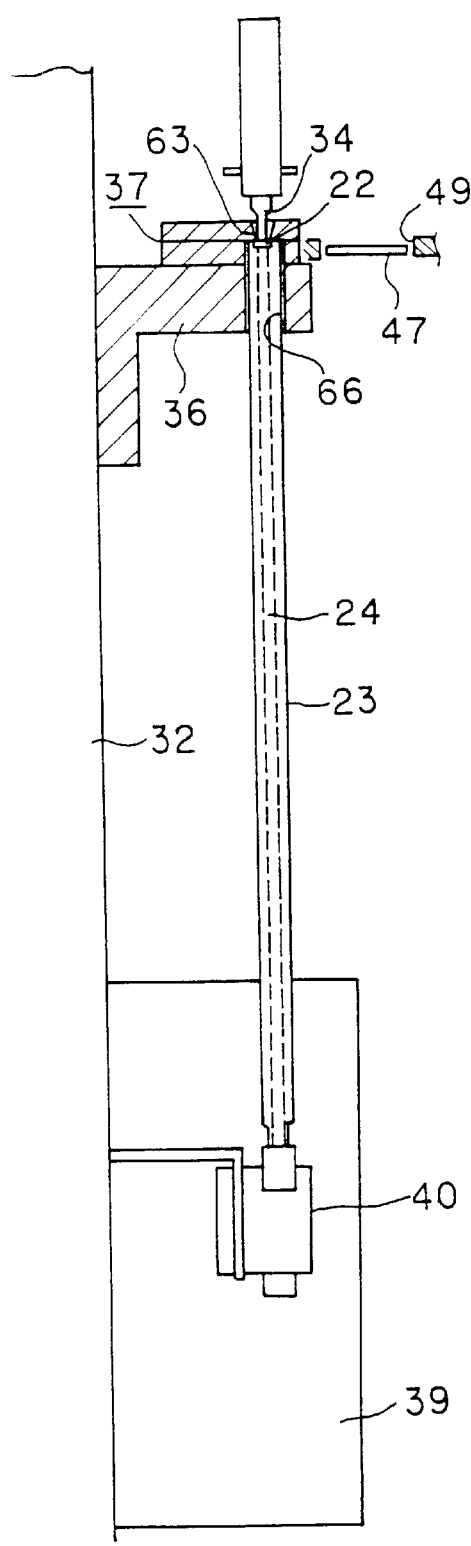
FIG.9 FIG.10

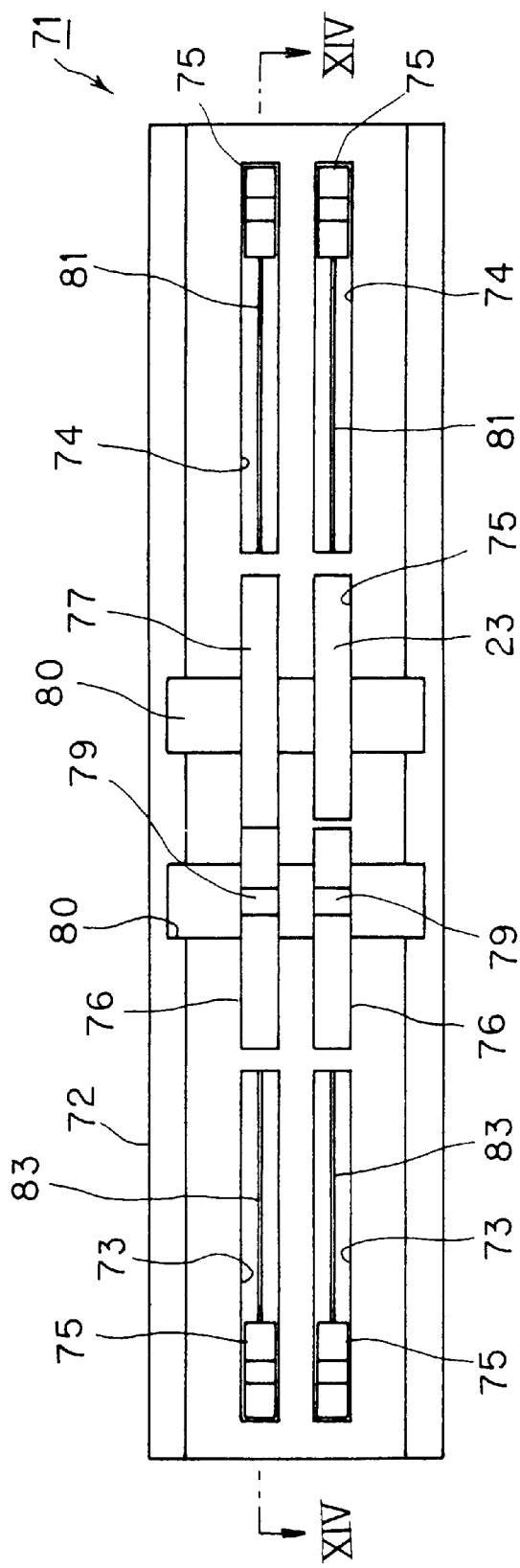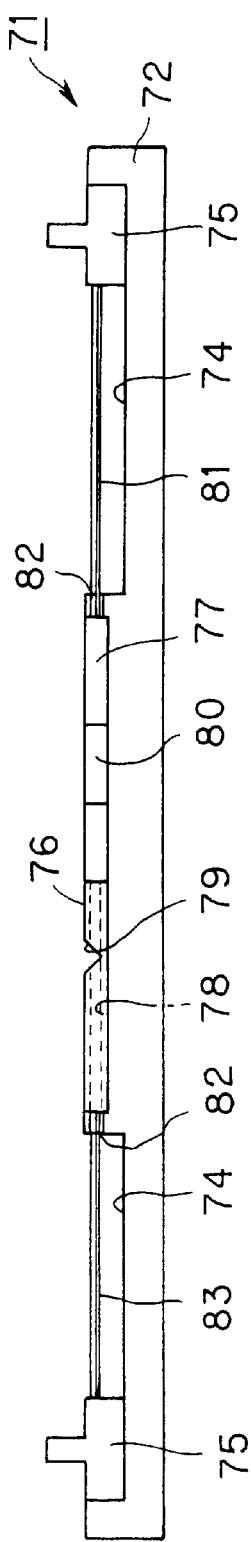
FIG.15
FIG.16

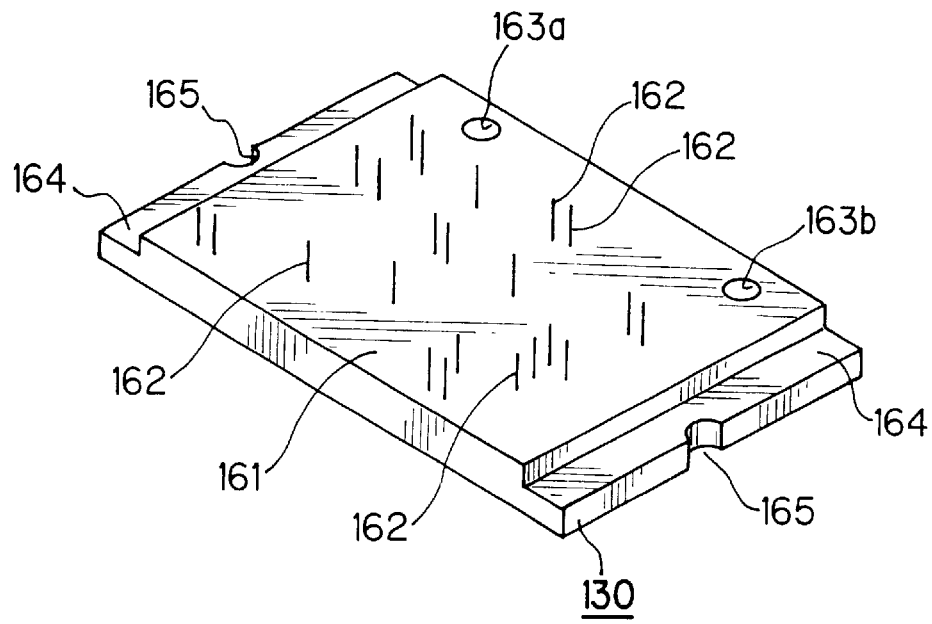
FIG.36
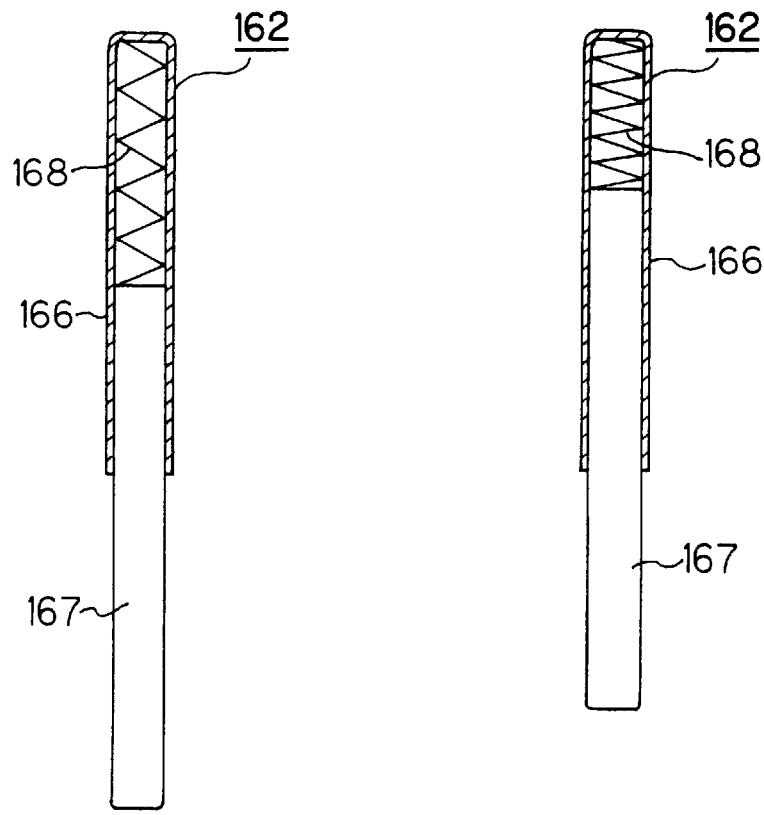
FIG.37A  FIG.37B

APPARATUS AND METHOD FOR MOUNTING ELECTRONIC PARTS

This is a division of prior application Ser. No. 09/147,508 filed Apr. 19, 1999, now U.S. Pat. No. 6,331,225.

TECHNICAL FIELD

This invention relates to an apparatus and a method for mounting electronic parts, such as chips, on a printed circuit board. More particularly, it relates to such apparatus and method for accurately supervising plural sorts of electronic parts for accurately mounting these electronic parts at pre-set positions on a sole printed circuit board without using a large-sized mounting device. Further, it relates to an apparatus for mounting electronic parts and an apparatus for applying an adhesive used in the mounting apparatus for electronic parts.

BACKGROUND ART

Up to now, electronic parts, in the form of chips, mounted on the printed circuit board such as by setting them thereon, without using terminals for connection, have been in use.

For mounting the electronic parts in the form of chips on the printed circuit board, an automatic mounting apparatus for electronic parts, controlled by a computer, is m use.

As this sort of the automatic mounting apparatus for electronic parts, such an apparatus shown in FIG. 1 is in use. The mounting apparatus for electronic parts, shown in FIG. 1, includes a furnishing unit for electronic parts 2, for continuously furnishing electronic parts in the form of chips, a mounting head 5 for transporting a suction nozzle 3 adapted for sucking and holding the electronic parts 1 by air to a pre-set mounting position on a printed circuit board 4, a positioning unit 6 for positioning the electronic parts 1 and an XY table 7 for supporting the printed circuit board 4 in the XY directions perpendicular to each other.

The electronic parts 1 used in the automatic mounting apparatus for electronic parts are shipped in a state of being accommodated in a supply reel 8 for electronic parts, and transported by the automatic mounting apparatus for electronic parts shown in FIG. 1 to a working site for mounting the electronic parts 1.

The supply reel 8 is comprised of a reel 9 on which an elongated carrier tape 10 is wound, as shown in FIG. 2. On the carrier tape 10, electronic parts of the same sort, for example, are arrayed longitudinally of the carrier tape 10 one-by-one and provisionally secured, such as with an adhesive. The supply reels 8 for electronic parts are loaded on plural part cassettes 11 provided on the furnishing unit for electronic parts 2, as shown in FIG. 1, and are stored in this state in an automatic mounting apparatus for electronic parts. The carrier tapes 10, wound on the supply reels 8 for electronic parts, loaded on the parts cassettes 11, are pulled out towards the loading head 5.

The mounting head 5, constituting the automatic mounting apparatus for electronic parts, has a rotary table 12, rotatable about a center axis, and plural suction nozzles 3. These suction nozzles are arrayed circumferentially of the rotary table 12, about the center axis of the rotary table 12 as center. By rotation of the rotary table 12, the suction nozzles 3 are moved between a suction position of sucking the electronic parts 1 supported on the carrier table 10, a position setting position of positioning the electronic parts 1 by the positioning unit 6, and a mounting position of mounting the electronic parts on the printed circuit board 4.

For mounting the electronic parts on the printed circuit board 4 using the above-described automatic mounting apparatus for electronic parts, the printed circuit board 4 is transported from a loading station and loaded on the XY table 7. The electronic parts 1 are then sucked by the suction nozzles 3 in the suction position and the rotary table 12 is rotated for moving the suction nozzle 3 to the position-setting position. At the position-setting position of the suction nozzle 3, the electronic parts 1 are positioned by the position-setting unit 6. After the end of the position setting of the electronic parts 1, the rotary table 12 is rotated for moving the suction nozzle 3 to a pre-set mounting position on the printed circuit board 4 for mounting the electronic parts 1 sucked by the suction nozzle 3. When the suction nozzle 3 is moved to the mounting position on the printed circuit board 4, the suction nozzle is lowered towards the printed circuit board 4 to mount the electronic part held thereby on the printed circuit board 4.

When the mounting of the electronic parts comes to a close, the XY table 7 is moved to the mounting position for the next electronic parts. This sequence of operations is repeated. After mounting all of the electronic parts, the printed circuit board 4 is returned to its initial position. After the end of the pre-set electronic parts 1, the printed circuit board is discharged from the XY table 7 to an unloading station.

In the conventional automatic mounting apparatus for electronic parts, the vertical movement of the suction nozzle 3 and the rotary movement of the rotary table 12 are performed in a pre-set sequence each time an electronic part 1 is mounted on the printed circuit board 4, and again the suction nozzle 3 performs vertical movement. The plural electronic parts 1 are mounted on the printed circuit board 4 by the repetition of these series of operations.

Meanwhile, the structure of the electronic circuits used for electronic apparatus such as personal computers is changed for each type of the electronic apparatus used. That is, the printed circuit boards of different structures of the electronic circuits are used for different types of the electronic apparatus of the same kind. Therefore, multiple species small quantity type production is used for printed circuit boards used in electronic apparatus such as computers.

With the above-described automatic mounting apparatus for electronic parts, the production efficiency is high and the production cost is inexpensive for producing a large quantity of the printed circuit boards of the same kind. However, the automatic mounting apparatus for electronic parts itself is large-sized so that limitations are imposed on the mounting space. Moreover, the mechanical portions of the apparatus and hence the operation are complex to render it difficult for plural operators to use the apparatus easily. For manufacturing the multi-species small-quantity type printed circuit boards, it is necessary to use such an apparatus in which the mounting positions of the electronic parts can be easily changed responsive to design changes in the printed circuit boards.

Also, for manufacturing the multi-species small-quantity type printed circuit boards, it is desirable to lower equipment cost for the manufacturing apparatus or to improve the operational efficiency as well as to accord a degree of freedom to the installment environment of the manufacturing, apparatus.

OBJECTS AND SUMMARY OF THE INVENTION

It is an object of the present invention to provide a novel apparatus and method for mounting electronic parts whereby electronic parts can be mounted on the printed circuit board without employing a large-sized apparatus such that the entire process from furnishing electronic parts to mounting on the printed circuit board is controlled by a computer.

It is another object of the present invention to provide a novel apparatus and method for mounting electronic parts whereby plural kinds of the electronic parts to be mounted on a sole printed circuit board can be accurately mounted at pre-set positions on the printed circuit board.

It is a further object of the present invention to provide a novel apparatus and method for mounting electronic parts whereby plural kinds of the electronic parts can be reliably mounted on the printed circuit board without dependency on the thickness or size of the electronic parts mounted on the printed circuit board.

It is a further object of the present invention to provide an adhesive coating apparatus whereby an adhesive for provisionally securing the electronic parts to the printed circuit board may be applied easily in a manner useful for application to the apparatus and method for mounting electronic parts according to the present invention.

It is a further object of the present invention to provide an apparatus for correcting the arraying of the electronic parts whereby plural electronic parts can be loaded on a loading member for loading the electronic parts in a regular arraying appearance.

It is yet another object of the present invention to provide an apparatus for reliably loading electronic parts without dependancy on the thickness or size of the electronic parts mounted on the printed circuit board.

For accomplishing the above object, the present invention provides a loading apparatus for electronic parts including a plurality of loading members for electronic parts, each having a loading through-hole extending in the up-and-down direction for loading plural electronic parts to be mounted on a printed circuit board, and a detachment preventative mechanism for prohibiting incidental descent of the electronic parts from the loading through-hole. The electronic parts are loaded in a stacked state in groups of the same sorts. The apparatus also includes a loading member furnishing casing in which is arrayed at least a set of loading members for electronic parts each accommodating at least a set of electronic parts to be loaded on the printed circuit board, a loading member holder having a plurality of holding portions each holding the set of the electronic parts arrayed and held in the loading member furnishing casing, and a loading device for electronic parts having the loading member holder mounted therein. The loading device for electronic parts includes a plurality of extruder members arranged for being inserted via upper opening ends of the loading through-holes of the loading members for electronic parts held by the loading member holder and an extruder member descent control mechanism adapted for controlling the descent by the self-gravity of these extruder members and for annulling the controlled state to permit descent of the extruder members. The extruder members descend by their own gravity through the insides of the loading through-holes when the extruder member descent control mechanism enables descent of the extruder members to thrust the electronic parts loaded in the loading through-holes to eject the electronic parts from the loading members for electronic parts via lower end openings in order to put the electronic parts at pre-set positions on the printed circuit board arranged below the loading member holder.

Preferably, the loading member holder carries identification symbols in association with plural holding portions provided on the holder and the loading members for electronic parts are each provided with identification symbols associated with the identification symbols provided in each holding portion.

Preferably, the identification symbols provided on the loading members for electronic parts are numerical figures or letters indicating the arraying sequence of the plural holding portions and the identification symbols provided on the loading members for electronic parts are numerical figures or letters associated with the numerical figures or symbols indicating the numerical figures or symbols specifying the arraying sequence of the plural holding portions.

Preferably, the loading member furnishing casing has a series of identification symbols comprised of numerical figures or letters associated with the numerical figures or letters specifying the arraying sequence of the plural holding portions. The one set of the loading members for electronic parts is arrayed in the loading member furnishing casing with the identification symbols of the loading members for electronic parts in agreement with the numerical figures or letters provided on the loading member furnishing casing.

Preferably, the identification symbols provided on the loading member holder are in agreement with the identification symbols for electronic parts for mounting provided on the printed circuit board.

Preferably, there are provided portions of a pre-set pattern on main body portions of the loading members for electronic parts, the portions completing the preset pattern when the loading members for electronic parts are arranged in the loading member furnishing casing with the identification symbols provided on the loading members for electronic parts in agreement with the identification symbols provided on the loading member furnishing casing.

Preferably, the mounting apparatus for electronic parts also includes a loading device for electronic parts having a storage portion for electronic parts for storing a large number of electronic parts loaded in the loading members for electronic parts, a loading member holding unit for holding the loading members for electronic parts and the storage portion for electronic parts at a pre-set relative position to each other, and a loading unit for electronic parts for taking out the electronic parts from the storage portion for electronic parts for holding the electronic parts thus taken out and for loading the electronic parts thus held in the loading through-holes in the loading members for electronic parts.

Preferably, an electronic part holder holding electronic parts stored in the storage portion has identification symbols associated with the identification symbols provided on the loading members for electronic parts held by the part holder.

Preferably, the mounting apparatus for electronic parts also includes a loading member storage casing for housing a plurality of loading members for electronic parts for mounting on the printed circuit board in groups of electronic parts each of a specified type, the loading members for electronic parts housing the electronic parts for mounting on the printed circuit board in the groups of the specified types.

Preferably, the loading member storage casing has identification symbols in association with the housing positions of housing the loading members for electronic parts housing specified types of the electronic parts. The identification symbols are associated with identification symbols provided on the loading members for electronic parts housing the specified types of the electronic parts.

Preferably, the mounting apparatus for electronic parts also includes an adhesive applicator device for applying an adhesive for provisionally securing the electronic parts supplied from the loading members for electronic parts to the printed circuit board.

The present invention also provides a method for mounting electronic parts including housing plural electronic parts of plural specified types in a plurality of loading members for electronic parts, each having a loading through-hole extending in the up-and-down direction for loading plural electronic parts to be mounted on a printed circuit board, and a detachment preventative unit for prohibiting incidental descent of the electronic parts from the loading through-hole. The electronic parts are loaded in a stacked state in groups of the same sorts. The method also includes housing a set of loading members for electronic parts, each accommodating at least a set of electronic parts to be loaded on the printed circuit board, in a loading member furnishing casing, holding the set of the loading members for electronic parts in a plurality of holding portions of the loading member holder each holding the set of the electronic parts arrayed and held in the loading member finishing casing, loading the loading member holder holding on the set of the loading members for electronic loading members for electronic parts on a loading device for electronic parts so that the holder is disposed above the printed circuit board arranged in the loading device for electronic parts, and inserting extruder members provided in the loading device for electronic parts into the loading through-holes of the loading members for electronic parts via the upper opening ends for lowering the extruder members for extruding and ejecting the electronic parts loaded in the loading through-holes from the loading members for electronic parts via lower opening ends of the loading through-holes to put the electronic parts at pre-set positions on the printed circuit board arranged below the loading member holder.

Other objects and advantages of the present invention will become more apparent from the explanation of the following embodiments of the invention.

BRIEF DESCRIPTION OF THE DRAWINGS

FIG. 3 is a perspective view showing a loading member for electronic parts according to the present invention.

FIG. 4 is a longitudinal cross-sectional view of the loading member for electronic parts.

FIGS. 9 and 10 are side views showing the relative positions of the suction nozzle and the loading member for electronic parts loaded on the loading device for electronic parts, FIG. 9 showing the state of suction of an electronic part and FIG. 10 showing the state of loading the electronic part on the loading member for electronic parts.

FIG. 15 is a plan view showing the array correction device for correcting the arraying of electronic parts and FIG. 16 is a cross-sectional view taken along line XIV—XIV of FIG. 15.

FIG. 36 is a perspective view showing a pin block.

FIGS. 37A and 37B are cross-sectional views showing the structure of a pin.

DETAILED DESCRIPTION OF PREFERRED EMBODIMENTS

Figure 1:
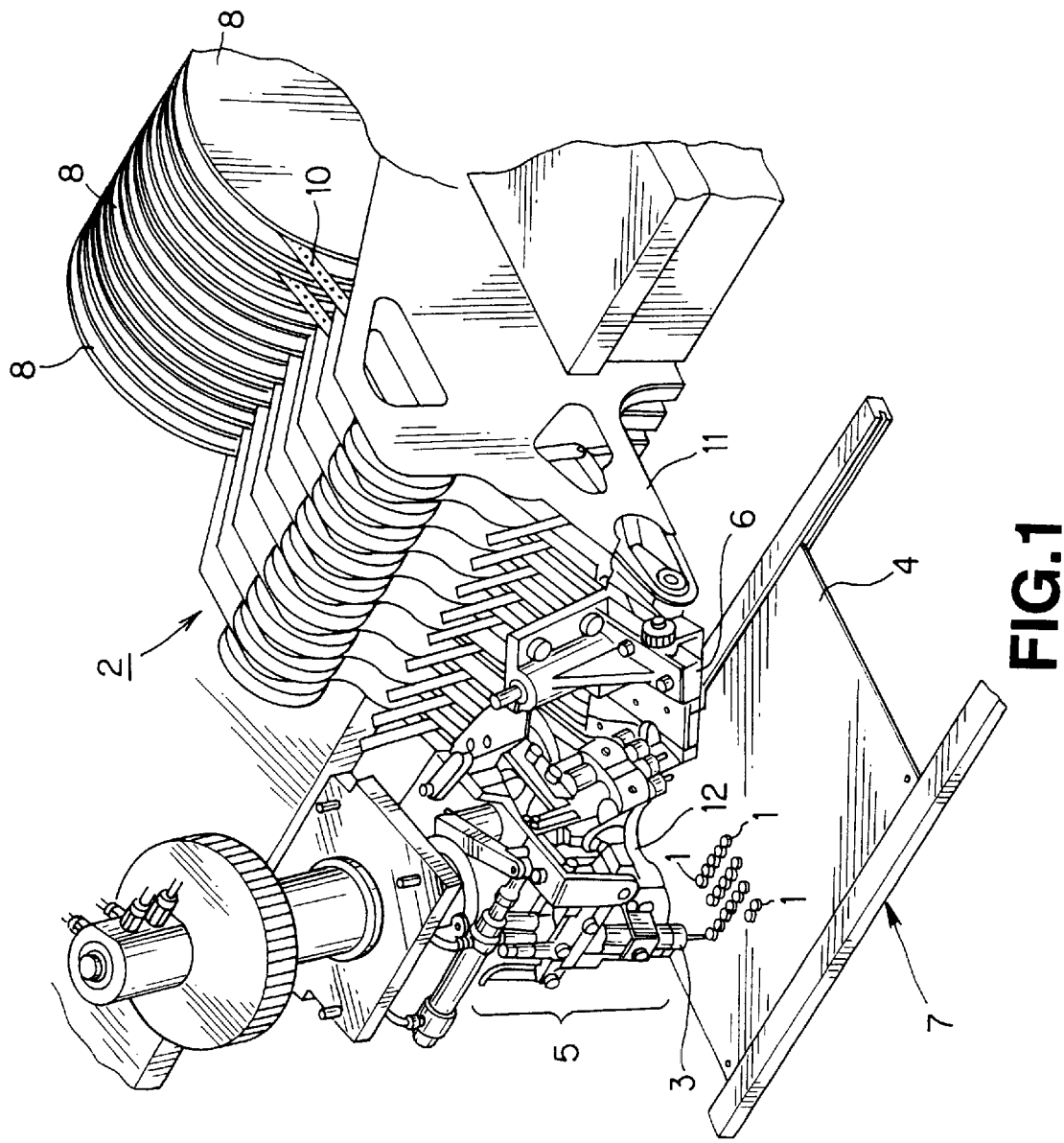
FIG. 1 is a perspective view showing a conventional automatic mounting apparatus for electronic parts.
Figure 2:
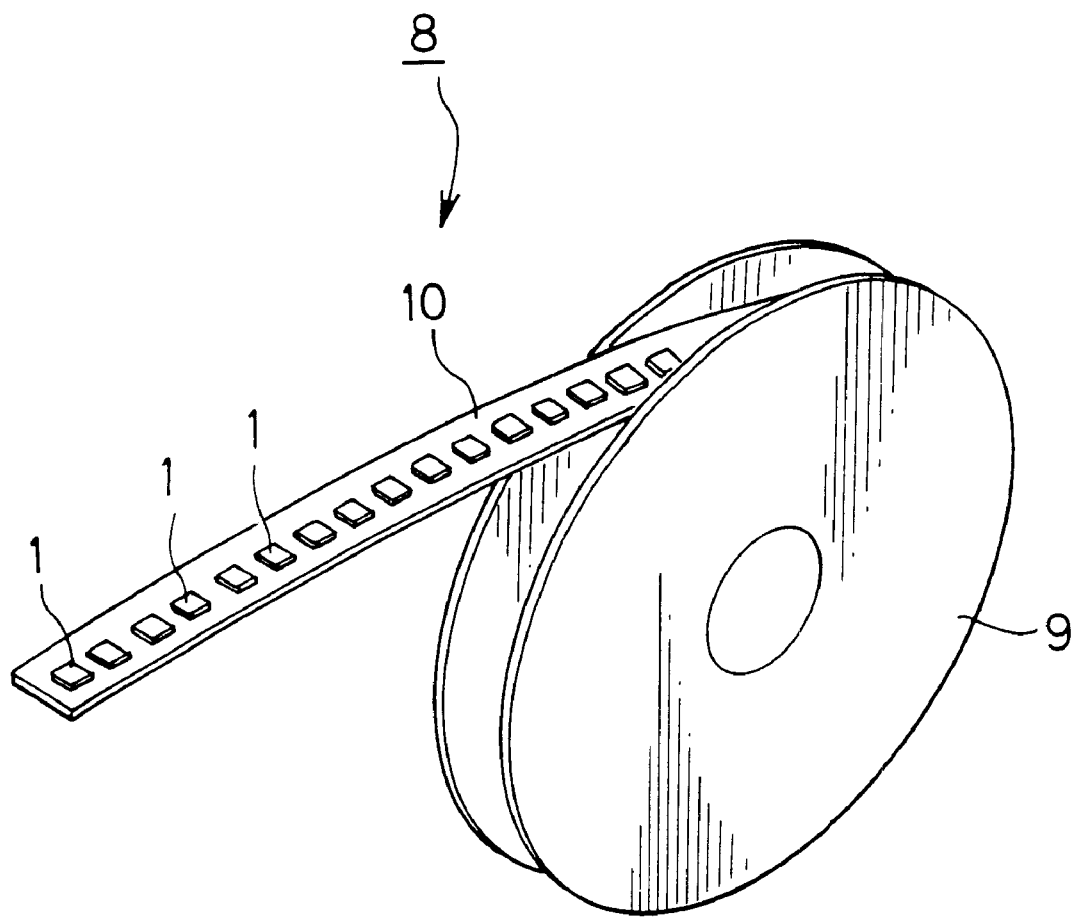
FIG. 2 is a perspective view showing a furnishing reel for electronic parts in which electronic parts are accommodated.

Referring to the drawings, an apparatus and a method for mounting electronic parts and a variety of devices used for this apparatus and method according to the present invention to the present invention will be explained in detail.

In the apparatus and the method for mounting electronic parts according to the present invention, a loading member for electronic parts 23 for accommodating a variety of electronic parts, to be mounted at pre-set positions of a printed circuit board 21, for each of the sorts of the electronic parts, is used. The loading member for electronic parts 23 used in the present invention is formed as an elongated tube having a rectangular cross-section, and has a center loading through-hole 24 extending from its upper end to its lower end, as shown in FIG. 3. The loading through-hole 24 is of a size and the shape conforming to the electronic parts 22 actually loaded therein. It is noted that the loading through-hole 24 is of a cross-sectional size and shape sufficient to permit the electronic parts loaded therein to be passed smoothly therethrough. Thus, plural sorts of the loading member for electronic parts 23 are readied in order to cope with a variety of electronic parts of different shapes to be mounted on the printed circuit board 21.

The electronic parts 22, loaded on the loading member for electronic parts 23, are formed as-one with connection terminals which are provided on the main body units of the parts without protruding lead terminals or the like from the main body units of the parts, so that the electronic parts 22 are generally in the form of rectangular-, circular- or elliptically-shaped chips.

The loading member for electronic parts 23 are formed of a transparent synthetic resin material so that the sorts or the loading state of the electronic parts can be confirmed from outside.

The lower end in FIG. 3 of the loading member for electronic parts 23 is formed on the peripheral surface thereof with a step 25a to provide a reduced-diameter portion 25. The mid portion of the loading member for electronic parts 23 is formed with a communication hole 26 communicating with the loading through-hole 24. The role of the communication hole 26 is to permit a suitable tool such as a driver or a dedicated jig for correcting the state of the electronic parts 22 when the electronic parts are not inserted correctly in the loading through-hole 24 but are clogged therein.

The lower end side of the loading member for electronic parts 23 is provided with a mechanism for prohibiting incidental descent of electronic parts 27 as shown in FIGS. 3 and 4. The mechanism for prohibiting incidental descent of electronic parts 27 operates for prohibiting the electronic parts loaded in the loading through-hole 24 from being incidentally detached via the lower opening end of the loading through-hole 24. The mechanism for prohibiting incidental descent of electronic parts 27 is comprised of a detachment preventative piece 28 formed by a spring plate and which is mounted on a lateral side on the lower end of the loading member for electronic parts 23 so that the distal end of the detachment preventative piece 28 faces the loading through-hole 24 via a cut-out 29 formed for extending from the lower end to a mid part of the loading member for electronic parts 23. The electronic parts 22 loaded in the loading through-hole 24 are thrust against the distal end of the detachment preventative piece 28 facing the inside of the loading through-hole 24 for preventing detachment thereof from the loading through-hole 24.

The electronic parts 22, retained by the mechanism for prohibiting incidental descent of electronic parts 27, are thrust by an extrusion member, such as an extrusion rod, inserted into the loading through-hole 24, as later explained, for elastically moving the detachment preventative piece 28 to outside of the loading through-hole 24 to release retention of the electronic parts 22 by the detachment preventative piece 28 to eject the electronic parts 22 via the loading through-hole 24.

Meanwhile, the mechanism for prohibiting incidental descent of electronic parts 27 may be configured so that the elastic piece intruded into the loading through-hole 24 is formed as-one with the lower end of the loading member for electronic parts 23. This elastic piece is formed by slitting a thin-walled portion formed at the lower end of the loading member for electronic parts 23.

On one side of the uppermost end of the loading member for electronic parts 23 is integrally formed a detachment preventative piece 30 adapted for retaining the loading member holder to prohibit incidental descent of the loading member for electronic parts 23 when the loading member for electronic parts 23 is inserted into and held by a holding portion of the loading member holder as later explained. This detachment preventative piece 30 is provided only if necessary and need not be separately provided if a shoulder provided for forming the reduced-diameter portion 25 is used as a retainer for prohibiting detachment of the loading member for electronic parts 23.

Figure 5:
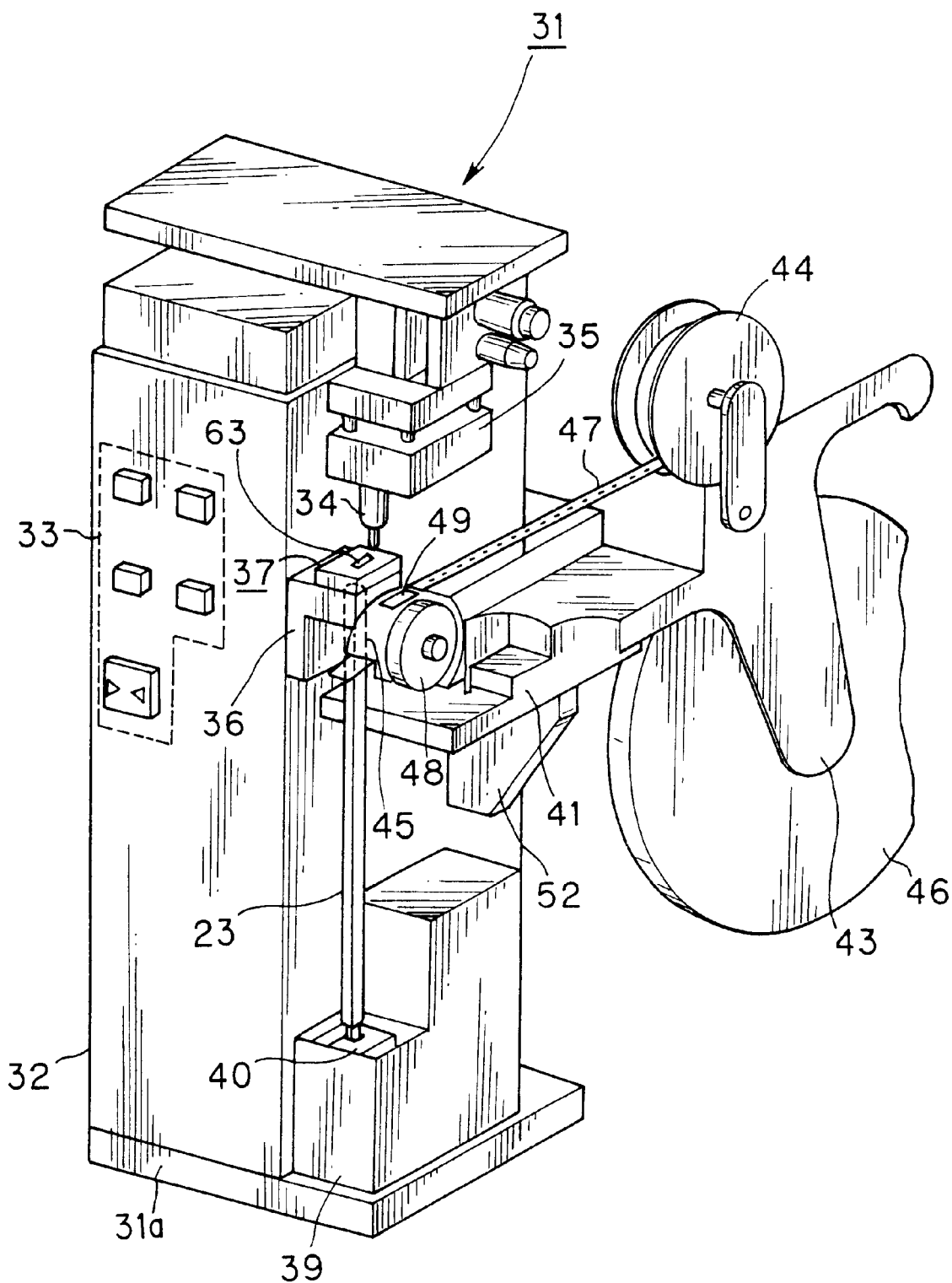
FIG. 5 is a perspective view showing an apparatus for loading electronic parts according to the present invention.

The electronic parts 22 in the form of chips are loaded on the loading member for above-described tubular electronic parts 23 using a loading device for electronic parts 31 configured as shown in FIG. 5. On a base block 31a of this loading device for electronic parts 31 is mounted a main body unit of the loading device 32. On a front panel of the main body unit of the loading device 32 is mounted a switch panel 33 carrying switches for effectuating various operations. Within the inside of the main body unit of the loading device 32 are mounted a mechanism and a control circuit for controlling the suction by a suction nozzle 34 and a suction nozzle movement control mechanism for controlling the movement mechanism for a nozzle supporting block 35 supporting the suction nozzle 34 in order to shift the suction nozzle 34 in a pre-set direction.

On the right hand side of the main body unit of the loading device 32 in FIG. 5 is mounted a substantially L-shaped loading member supporting block 36. In the loading member supporting block 36 is formed a loading member inserting hole 66 for facing the upper opening end of the loading through-hole 24 formed in the loading member for electronic parts 23 to a loading member inserting hole 38 provided in a suction nozzle guide block 37, in a manner not shown. The suction nozzle guide block 37 is mounted at a pre-set position on the upper surface of the loading member supporting block 36, as shown in FIG. 5, and has a function of properly positioning the distal end of the upper end of the loading member for electronic parts 23 and a function of holding a proper loading position in the loading through-hole 24 of the electronic parts 22 loaded by the suction nozzle 34 in the upper opening end of the loading member for electronic parts 23.

On the lower side of the right-hand side lateral surface of the main body unit of the loading device 32, shown in FIG. 5, there is mounted a loading member supporting block 39, as shown in FIG. 5. In the inside of the loading member supporting block 39 is mounted a loading member supporting unit 40 for supporting the loading member for electronic parts 23 such as by thrusting it from the lower side, as shown in FIG. 5. This loading member supporting unit 40 is movable vertically in a pre-set range for supporting the loading member supporting unit 40 as will be explained subsequently.

On the right-hand side of the main body unit of the loading device 32, shown in FIG. 5, there is mounted a supporting block 41 for supporting other mechanical units making up the loading device for electronic parts 31 so that the supporting block 41 is disposed slightly below the loading member supporting block 36. The supporting block 41 is reinforced in its mounting strength by being supported on the main body unit of the loading device 32 via a reinforcement block 52 placed below the supporting block 41.

The supporting block 41 is fitted with a tape guide unit composed of a reel supporting unit 43, a tape guide roll 44 and a tape guide plate 45.

The reel supporting unit 43 rotatably supports a supply reel for electronic parts 46 holding the electronic parts 22. The reel supporting unit 43 is provided with a tape guide roll 54 operating as a guide for a carrier tape 47 holding the electronic parts 22 pulled out from the supply reel for electronic parts 46. The carrier tape 47, pulled out further from the tape guide roll 54, is taken up by another guide roll 48 rotatably supported on the lateral surface of the main body unit of the loading device 32 so as to be pulled out forwardly of the main body unit of the loading device 32. On top of the guide roll 48 is mounted a tape guide plate 45 in which there is formed a part suction hole 49 operating as a window for sucking the electronic parts 22 held by the suction nozzle 34 on the carrier tape 47.

The carrier tape 47, pulled out from the supply reel for electronic parts 46, is pulled forwardly of the main body unit of the loading device 32, each time the guide roll 48 performs partial rotation through a pre-set angle, for facing the electronic parts 22 held on the carrier tape 47 to the part suction hole 49.

Figure 6:
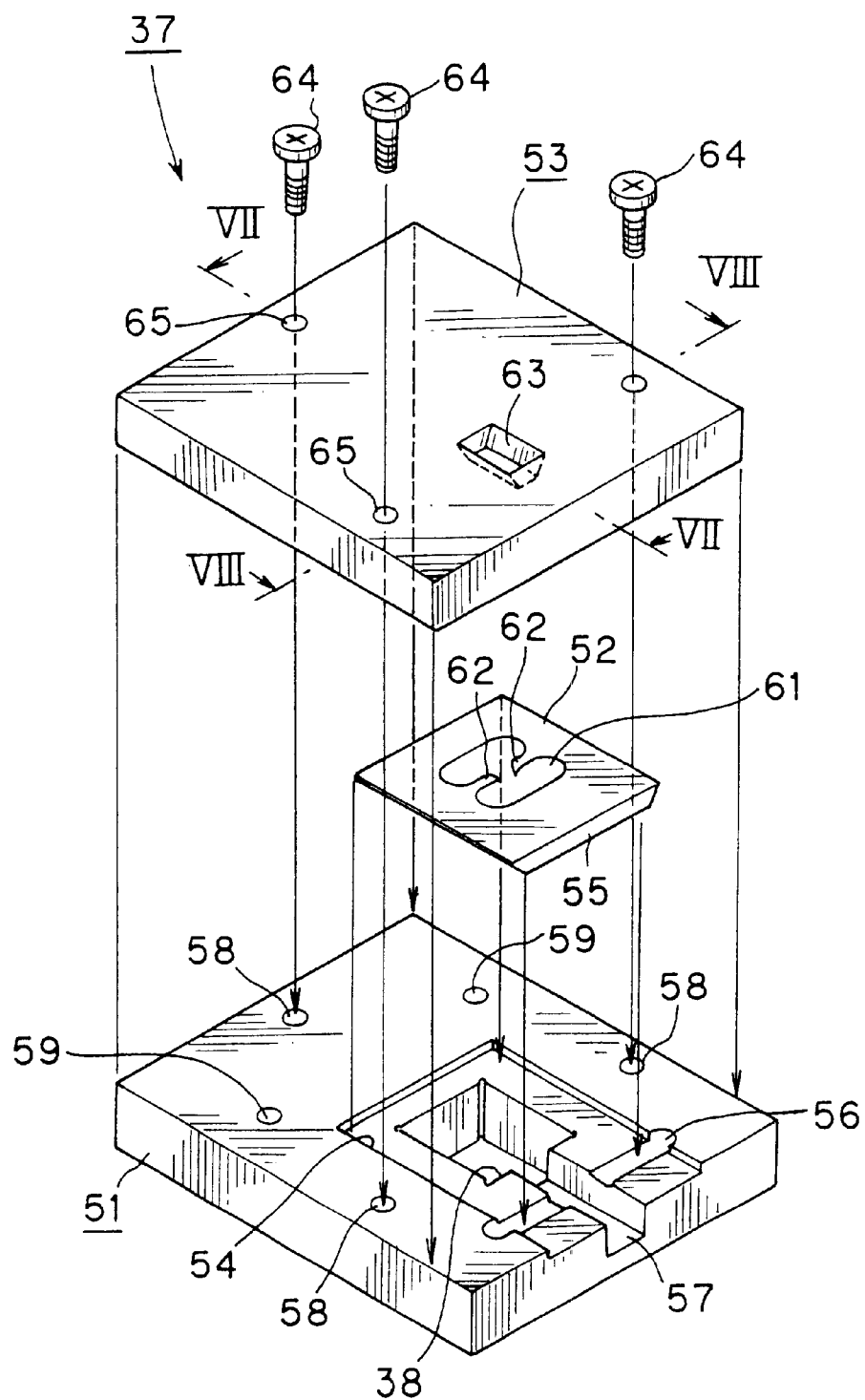
FIG. 6 is an exploded perspective view showing a suction nozzle guide block used in the apparatus for loading electronic parts.

The suction nozzle guide block 37, constituting the above-described loading device for electronic parts 31, is made up of a lower block 51, an intermediate plate 52 and an upper block 53, as shown in FIG. 6. The lower block 51, intermediate plate 52 and the upper block 53 are formed of metal. In particular, the intermediate plate 52 is formed of a thin resilient metal plate.

In the lower block 51 is formed the loading member inserting hole 38 for inserting the upper end of the loading member for electronic parts 23. Around the loading member inserting hole 38 is formed a recess 54 for accommodating the intermediate plate 52. In the portion of the recess 54 shown in FIG. 6 is formed an engagement groove 56 engaged by a retention piece 55 provided on one side of the intermediate plate 52. In the lower block 51 is formed an observation groove 57 communicating with the loading member inserting hole 38. In the upper surface of the lower block 51 facing the upper block 53 are formed three tapped holes 58. Also, in the upper surface of the lower block 51, there are formed two tapped holes 59 for securing the suction nozzle guide block 37 to the loading member supporting block 36, as shown in FIG. 5.

The intermediate plate 52 is formed by a sole thin metal plate in which there is formed a part inserting hole 61 positioned at a mid position facing the loading member inserting hole 38 provided in the lower block 51 to permit insertion of the electronic parts 22 when the intermediate plate 52 is inserted in the recess 54 with the retention piece 55 engaging in an engagement groove 54 provided in the lower block 51. On facing left and right side edges of the parts inserting hole 61 are formed a pair of part holding pieces 62, 62 for holding the electronic parts 22 in the vicinity of the upper opening end of the loading through-hole 24 formed in the loading member for electronic parts 23, so as to be intruded into the part inserting hole 61, as will be explained subsequently.

Figure 7:
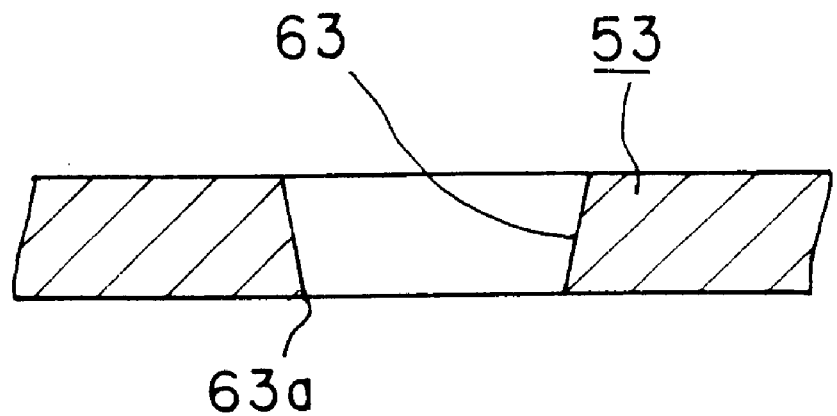
FIG. 7 is a cross-sectional taken along line VII to VII of FIG. 6.
Figure 8:
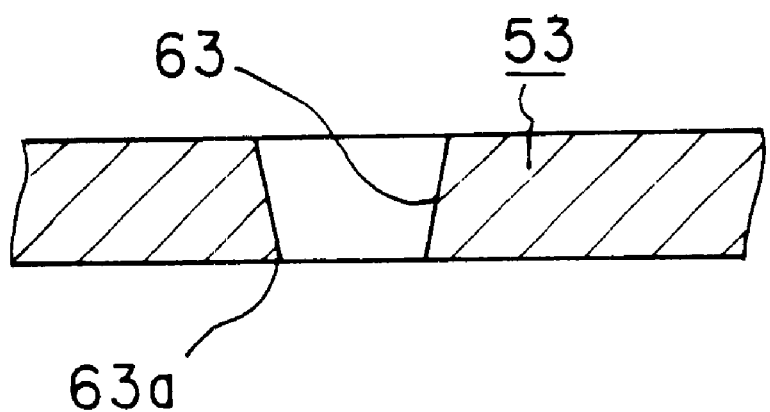
FIG. 8 is a cross-sectional taken along line VIII to VIII of FIG. 6.

In the upper block 53 is formed a nozzle guide opening 63 for conveying electronic parts 22 supplied by suction by the suction nozzle 34 to the parts inserting hole 61 provided in the intermediate plate 52 as will be explained subsequently. This nozzle guide opening 63 is tapered from the upper surface side towards the lower surface side of the upper block 53, as shown in FIG. 7 and 8, with its lower opening end 63a corresponding in shape and the size to the upper opening end of the 124 of the loading member for electronic parts 23.

In the upper block 53 is formed a tapped hole 65 into which is screwed a set screw 64 used for securing the upper block 53 to the lower block 51. For securing the upper block 53 to the lower block 51, the upper block 53 is superimposed on the lower block 51 and the set screws 64 are screwed into the tapped holes 65 into meshing with the taped holes 59 in the lower block 51. The upper block 53 is abutted against the lower block 51 and the intermediate plate 52 is inserted into a space between the upper block 53 and the lower block 51 from the lateral side in which is opened the observation groove 57 formed in the lower block 51. When the intermediate plate 52 is properly inserted into the recess 54, the part inserting hole 61 of the intermediate plate 52 faces the loading member inserting hole 38 provided in the lower block 51, whilst the retention piece 55 provided on the intermediate plate 52 is engaged in the engagement groove 56 formed in the lower block 51 for mounting the intermediate plate 52 in the recess 54 in the correct inserting position with reference to the lower block 51.

For dismounting the intermediate plate 52 from the suction nozzle guide block 37, pincers or the like are inserted via the observation groove 57, having its opening end faced by lateral side of the lower block 51 of the suction nozzle guide block 37. By these pincers, a portion of the retention piece 55 of the intermediate plate 52, engaged in the engagement groove 56, is gripped and flexed to disengage it from the engagement groove 56. With the intermediate plate 52 disengaged from the engagement groove 56 of the retention piece 55, the intermediate plate 52 is pulled out with the pincers to dismount the intermediate plate 52 from the suction nozzle guide block 37.

Since the intermediate plate 52 can be loaded/unloaded in this manner for the suction nozzle guide block 37, only the intermediate plate 52 can be exchanged without exchanging the suction nozzle guide block 37 in its entirety if the parts holding pieces 62 or the like provided on the intermediate plate 52 are worn out or destroyed, so that the cost of consumable items can be reduced, while the loading device for electronic parts 31 can be improved in durability.

The suction nozzle guide block 37, configured by combining the lower block 51, intermediate plate 52 and the upper block 53, is screwed to the loading member supporting block 36 by utilizing the tapped holes 59 formed in the lower block 51.

The suction nozzle guide block 37, constituted by combining the lower block 51, intermediate plate 52 and the upper block 53, is screwed to the loading member supporting block 36 using the tapped holes 59 for mounting to the loading member supporting block 36.

The state of loading the electronic parts 22 to the loading member for electronic parts 23 using the above-described loading device for electronic parts 50 is explained step-by-step.

For loading the electronic parts 22 on the loading member for electronic parts 23, the supply reel for electronic parts 46 holding the electronic parts 22 of the type to be loaded on the particular loading member for electronic parts 23 is loaded on the reel supporting unit 43 and the carrier tape 47 wound about the supply reel for electronic parts 46 is pulled out and placed about the tape guide rolls 54, 56.

The loading member for electronic parts 23 associated with and adapted for the loading of the particular electronic parts 22 is readied and its upper end is inserted through the loading member inserting hole 66 bored in the loading member supporting block 36 as shown in FIG. 9 and subsequently through the loading member inserting hole 38 formed in the suction nozzle guide block 37. The loading member for electronic parts 23 is held in an upstanding state by the loading device for electronic parts 50.

The loading member supporting unit 40, located below the loading member supporting block 39, is moved upwards towards the loading member supporting block 36 as indicated by arrow A in FIG. 9 for uplifting the loading member for electronic parts 23. The loading member for electronic parts 23, thus uplifted in the direction indicated by arrow A in FIG. 9 by the loading member supporting unit 40, is abutted against the lower surface of the upper block 53 of the suction nozzle guide block 37 so as to be held in position between the loading member supporting unit 40 and the upper block 53.

With the loading member for electronic parts 23, held in position in the loading device for electronic parts 50, as shown in FIG. 9, the nozzle guide opening 63 formed in the suction nozzle guide block 37 communicates with the loading through-hole 24 formed in the loading member for electronic parts 23. FIG. 9 shows the relative position between the suction nozzle guide block 37 and the part suction hole 49 in the loading device for electronic parts 50. The parts suction hole 49 is proximate to the lateral side of the suction nozzle guide block 37, as shown in FIG. 9.

If, after the loading member for electronic parts 23 is loaded in the loading device for electronic parts 50, the guide roll 48 is rotated a pre-set angle, the carrier tape 47 is fed out in a pre-set amount so that the electronic part held on the carrier tape 47 faces the part suction hole 49. If, from this state, the suction nozzle 34 is moved to the position of the part suction hole 49 faced by the electronic part 22, and is lowered to the side of the part suction hole 49, the distal end of the suction nozzle 34 is positioned substantially in abutting contact with the upper surface of the electronic part 22. If the electronic parts suction mechanism is driven in this state, the electronic parts 22 held on the carrier tape 47 are sucked towards the suction nozzle 34. If, after sucking the electronic parts 22, the suction nozzle 34 is moved upwards away from the carrier tape 47 in the direction indicated by arrow B in FIG. 9, the suction nozzle 34 acquires the electronic parts held on the carrier tape 47.

The suction nozzle 34, which has sucked and held the electronic parts 22, is moved in the direction indicated by arrow C in FIG. 9 to a position overlying the suction nozzle guide block 37. The electronic part 22 is positioned on the nozzle guide opening 63, as shown in FIG. 10, and is gradually lowered towards the suction nozzle guide block 37. When the suction nozzle 34 is lowered towards the suction nozzle guide block 37, the electronic part 22 sucked by the suction nozzle 34 is inserted into the nozzle guide opening 63 and, under guidance by the nozzle guide opening 63, is inserted through the upper opening end of the loading through-hole 24 of the loading member for electronic parts 23 which is in communication with the nozzle guide opening 63.

Figure 11:
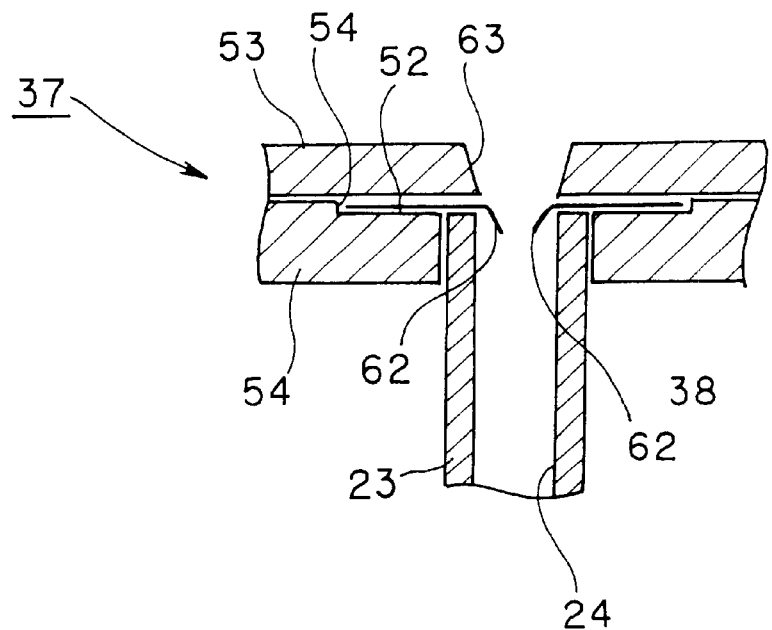
FIG. 11 is a cross-sectional view showing a part holding piece provided on a suction nozzle guide block.
Figure 12:
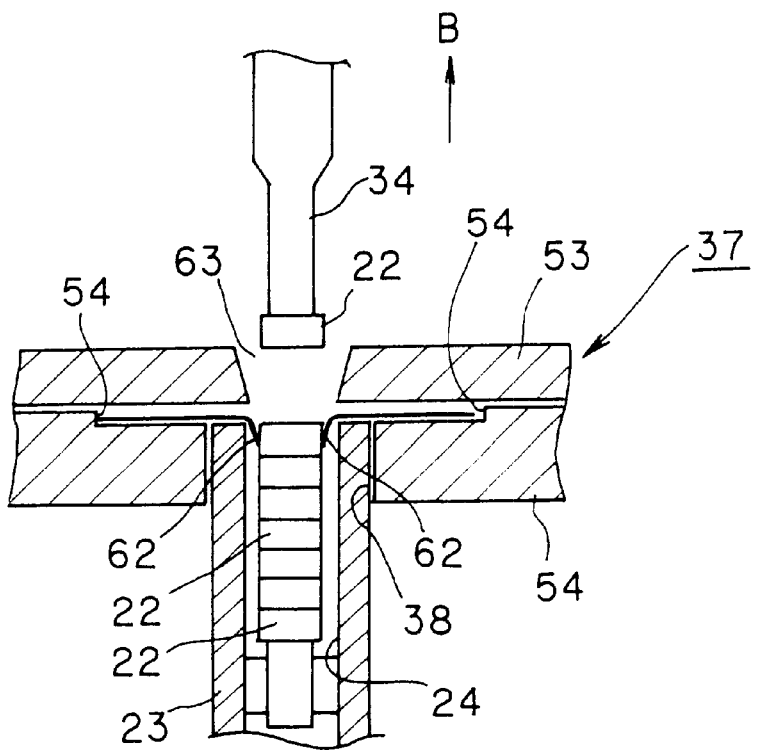
FIG. 12 is a cross-sectional view showing the state in which an electronic part to be loaded on the loading member is held by a part holding piece.

The state in which the electronic part 22 is loaded in the loading through-hole 24 of the loading member for electronic parts 23 is explained with reference to FIGS. 11 and 12.

In the state in which the electronic part is not loaded in the loading through-hole 24 of the loading member for electronic parts 23, electronic part holding pieces 62, 113, provided on the intermediate plate 52 of the suction nozzle guide block 37, are intruded into the loading through-hole 24 of the loading member for electronic parts 23. If now the electronic part 22 is inserted via the nozzle guide opening 63 into the loading through-hole 24, the electronic part 22, loaded at the upper most position in the loading through-hole 24, has its both sides held by the electronic part holding pieces 62, 113.

The electronic parts 22, loaded in a stacked state in the loading through-hole 24, are prohibited from incidental descent from the loading through-hole 24 since the electronic part 22 at the lower end of the loading through-hole 24 is supported by the mechanism for prohibiting incidental descent of electronic parts 27.

If a new electronic part 22 is inserted into the loading through-hole 24 with descent of the suction nozzle 34 the electronic parts 22, 22, . . . loaded so far in the loading through-hole 24 are extruded downwards by the electronic part 22 held by the suction nozzle 34, so that the electronic part 22 newly held by the suction nozzle 34 is clinched by the paired part holding pieces 62, 62 provided on the intermediate plate 52. If, in this state, the suction nozzle 34 ceases to descend and halts its suction operation, the electronic part 22 ceases to be held by suction. If then the suction nozzle 34 is moved upwards away from the suction nozzle guide block 37 in the direction indicated by arrow B in FIG. 12, the electronic part 22 conveyed by the suction nozzle 34 last time is positioned at the upper opening end of the loading through-hole 24, as shown in FIG. 12, and is held by being clinched between the part holding pieces 62, 62.

By repetition of the suction transport and cessation of suction of the electronic parts 22, the electronic parts 22 are stacked and loaded one-by-one by being intruded into the loading through-hole 24 of the loading member for electronic parts 23. The state of loading of the electronic parts in the loading through-hole 24 can be observed visually via the observation groove 57 provided in the suction nozzle guide block 37.

Figures 13A, 13B, 13C, 13D:
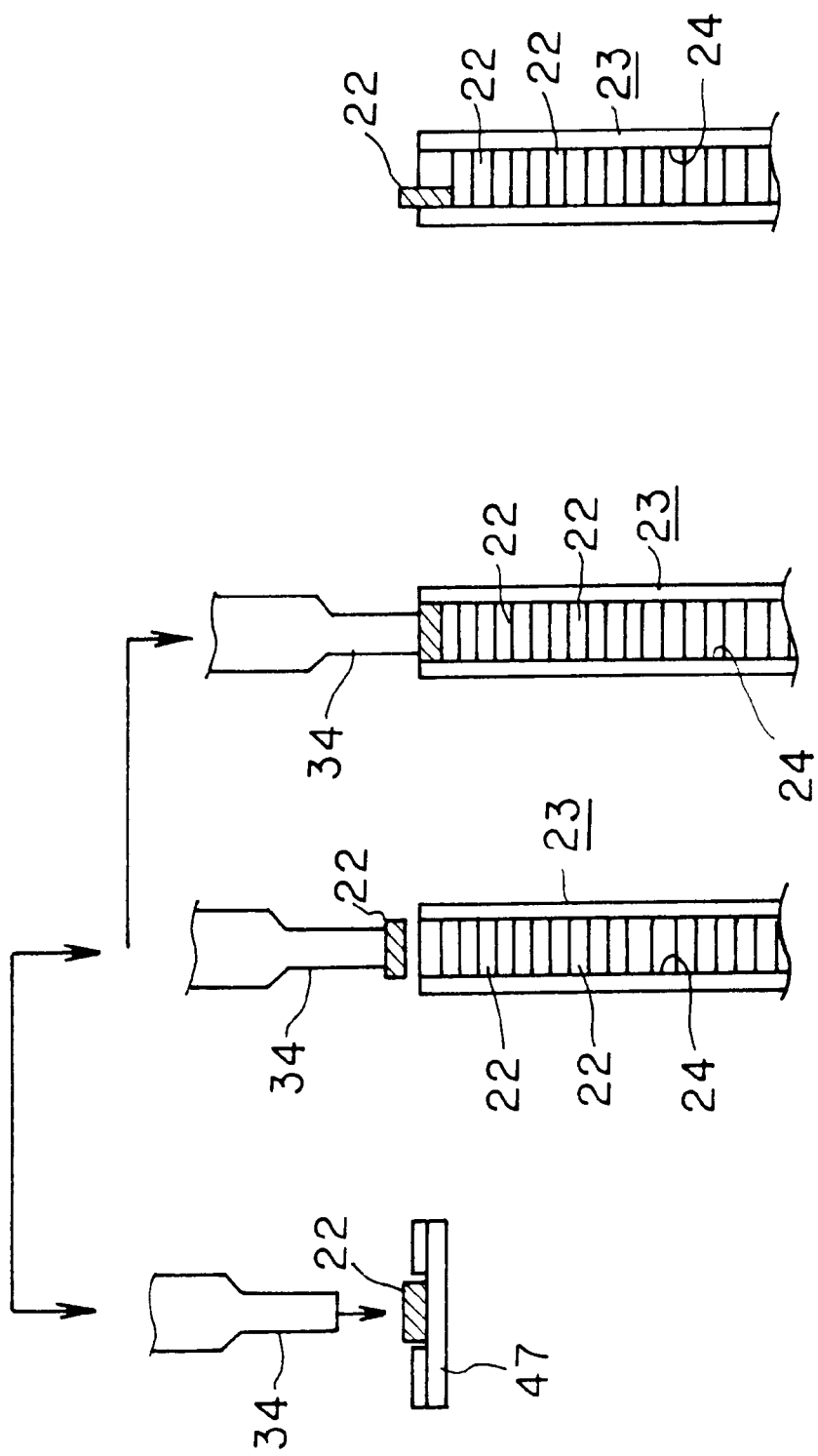
FIGS. 13A to 13D are cross-sectional views of the suction nozzle and the loading member for electronic parts showing the state of loading the electronic parts on the loading member for electronic parts without using a suction nozzle guide block.

If, in the course of the loading of the electronic parts in the loading through-hole 24 of the loading member for electronic parts 23, such a situation arises in which the guidance of the electronic parts 22 by the nozzle guide opening 63 or holding of the electronic parts 22 by the part holding pieces 62, 62 provided on the intermediate plate 52 cannot be performed, the electronic parts on the carrier tape 47 can be held by suction by the suction nozzle 34, as shown in FIG. 13A, and the suction nozzle 34 can then be moved so that the electronic part 22 is positioned directly above the loading through-hole 24 of the loading member for electronic parts 23, as shown in FIG. 13B.

If, in the absence of the guide mechanism for guiding the electronic parts 22 to the loading through-hole 24 of the loading member for electronic parts 23, the electronic part 22 held by suction by the suction nozzle 34 is to be positioned at all times at an optimum position relative to the loading through-hole 24, the tolerance of the movement error in the movement mechanism of the suction nozzle 34 becomes extremely small, such that movement control of the suction nozzle 34 needs to be performed precisely.

Moreover, higher precision is required of the mechanism for positioning and securing the loading member for electronic parts 23, while adjustment of high precision is required of the relative positioning between the suction nozzle 34 and the loading member for electronic parts 23.

If high precision is maintained in the relative positioning between the suction nozzle 34 and the loading member for electronic parts 23, and the electronic parts 22 held by the suction nozzle 34 are inserted appropriately in the loading through-hole 24 of the loading member for electronic parts 23, but if there is provided no holding means for holding the electronic parts 22 by the part holding pieces 62, 62, such a phenomenon tends to occur in which, when the suction nozzle 34 ceases its suction operation to cease to hold the electronic parts 22 and is uplifted, the electronic part 22 last loaded in the loading through-hole 24 is erected to shift its orientation. If the loading of the electronic parts 22 is continued under this condition, the loading member for electronic parts 23 loads thereon the loading member for electronic parts 23 on which the electronic parts have been arrayed incorrectly. If the electronic parts have not been loaded in the optimum loading orientation on the loading member for electronic parts 23, it becomes necessary to remove the loaded electronic parts from the loading through-hole 24 to re-load the electronic parts from the outset, or to optimize the arraying state in the loading through-hole 24 using a special device, thus significantly worsening the loading operation. If the electronic parts of the printed circuit board 21 are loaded with the use of the loading member for electronic parts 23 on which the electronic parts were not loaded in an optimum orientation, it becomes impossible to load the electronic parts 22 in the correct mounting state at the pre-set position on the printed circuit board 21.

If the nozzle guide opening 63 of the suction nozzle guide block 37 is provided with the guide function for the electronic parts 22, it becomes possible to evade high precision adjustment or requirements for high precision for a movement mechanism for the suction nozzle 34 or a positioning securing structure of the loading member for electronic parts 23. By having the electronic parts 22 held on the intermediate plate 52 by part retention pieces 62, 62, the electronic part 22 last loaded on the loading member for electronic parts 23 can be maintained at all times in the loaded state in an optimal position to prevent the electronic part 22 from being loaded in a non-optimum state in the loading through-hole 24, as shown in FIG. 13D.

In the above-described loading device for electronic parts 50, the carrier tape 47 holding the electronic parts 22 is wound on the supply reel for electronic parts 46 operating as storage section for electronic parts in order to feed out the carrier tape 47 sequentially to furnish the electronic parts 22. Alternatively, the electronic parts in the bulk state may be stored in a pre-set storage section from which the electronic parts are sequentially furnished towards the suction nozzle 34 using a feed mechanism in order to load the electronic parts on the loading member for electronic parts 23. When supplied from the storage section towards the suction nozzle 34, the electronic parts are corrected in the loading direction with respect to the loading member for electronic parts 23.

If the electronic parts 22 are not loaded in an optimum loading state on the loading member for electronic parts 23, the arraying state can be corrected to an optimum arraying state using the arraying correction device for electronic parts 71 as now explained.

Figure 14:
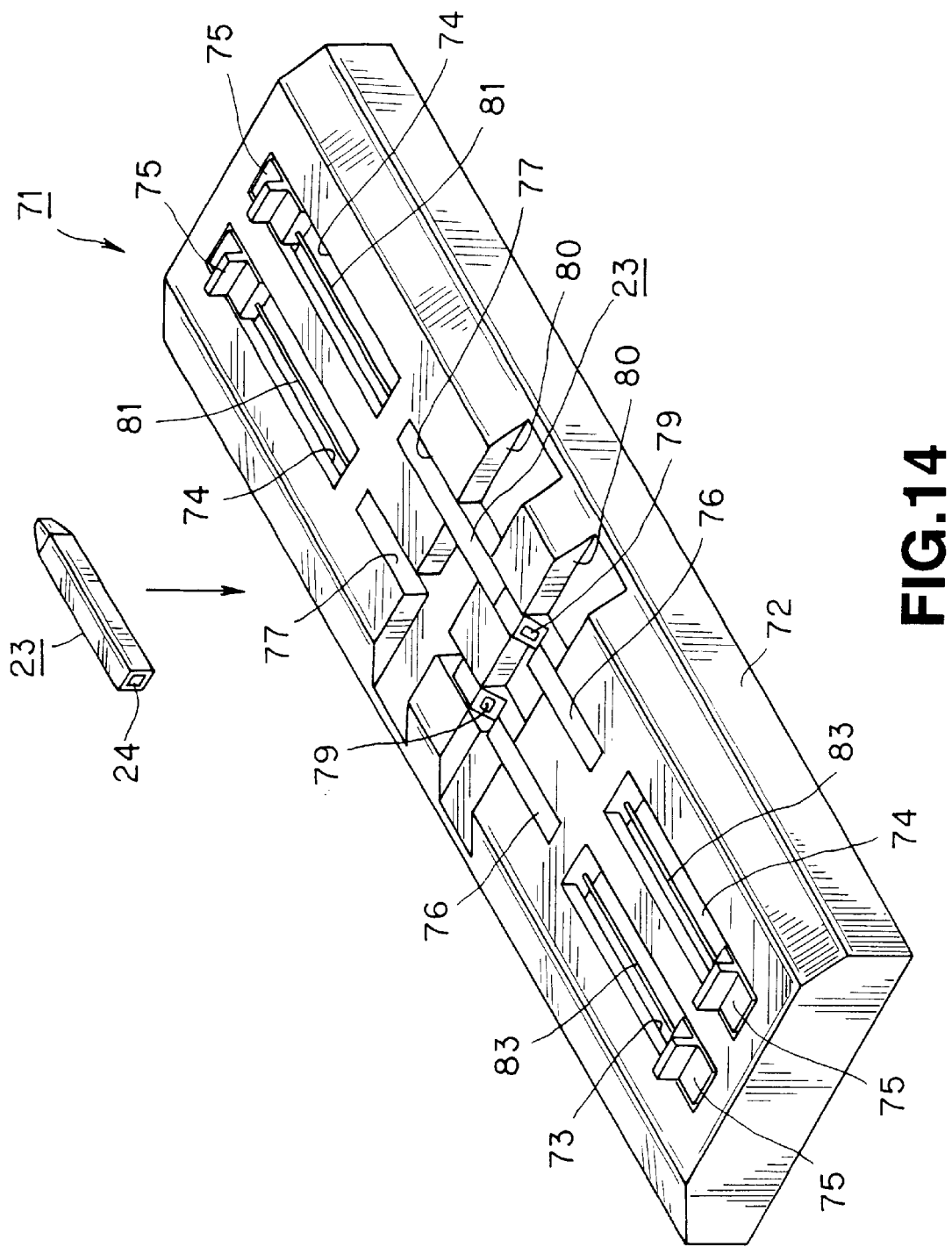
FIG. 14 is a perspective view showing an array correction device for correcting the arraying of electronic parts according to the present invention.

Referring to FIGS. 14 and 15, an electronic parts arraying correcting device 71 includes a substantially plate-shaped base member 72 formed of synthetic resin, such as ABS resin. On both ends on the upper surface of the base member 72 are formed two sets of paired grooves 73, 74 for arraying first and second correction members. In these grooves 73, 74, there are accommodated operating knobs 75, 75 for movement in the longitudinal direction of the grooves 73, 74.

Between the grooves 73, 74 for arraying first and second correction members, there are arranged loading member arranging portions 77, 77 in which the loading member for electronic parts 23 and the arraying correcting loading member 76 of the same shape as the loading member for electronic parts 23 are arrayed in succession. These loading member arranging portions 77, 77 are formed as elongated grooves sized to be large enough to hold in position the loading member for electronic parts 23 and the arraying correcting loading member 76 aligned with each other.

In FIGS. 14 to 16, the loading member for electronic parts 23 and the arraying correcting loading member 76 are accommodated in one of the loading member arranging portions 77, while only the arraying correcting loading member 76 is arranged in the other loading member arranging portion 77.

Meanwhile, the electronic parts arraying correcting device 71 corrects the state in which the electronic parts loaded on the loading member for electronic parts 23 have been loaded in the obliquely levelled arraying position along the stacking direction of the electronic parts in the loading member for electronic parts 23.

That is, if the electronic parts loaded on the loading member for electronic parts 23 are rectangular in shape, there are occasions wherein the electronic parts 22 loaded on the loading member for electronic parts 23 are levelled down along the long sides or along the short side of the rectangle. In order to cope with the arraying defects of the electronic parts 22, the plural loading member arranging portions 77, 77 are designed so that the loading member for electronic parts 23 and the arraying correcting loading member 76 are arranged depending on the levelling state of the electronic parts 22. One of the loading member arranging portions 77,77 corrects the state of levelling down of the electronic parts 22 along the long side direction, and the arraying correcting loading member 76 is designed so that the long side direction of a loading through-hole 58 formed to conform to the shape of the electronic parts 22 loaded on a loading member 76 is parallel to the surface of the base member 72. The opposite side loading member arranging portion 77 corrects the state in which the electronic parts 22 have been levelled down along the short side, while the arraying correcting loading member 76 is designed so that the short side direction of the loading through-hole 58 is parallel to the surface of the base member 72.

In the lateral surface of the arraying correcting loading member 76 is formed a vee-shaped opening 79, for example, sized to be just large enough to correct the arraying of the electronic parts 22 loaded in the loading hole 78 formed in the arraying correcting loading member 76, such as with pincers, as shown in FIGS. 14 and 16. The shape of the opening 79 is not limited to the vee-shape.

For facilitating mounting/detachment of the arraying correcting loading member 76 and the loading member for electronic parts 23 for the loading member arranging portion 77, the upper surface of the base plate 51 is formed with a cut-out operating as a finger support.

To an end face of an operating knob 75 arranged in a groove 74 used for arraying the second correction member is secured the proximal end of a feed shaft 81 constituting a correction member used for correcting the arraying state of the electronic parts loaded on the loading member for electronic parts 23. The feed shaft mounted on each operating knob 75 is inserted in a through-hole 82 formed between the groove 74 for arraying the second correction member therein and the loading member arranging portion 77. The mounting position of the feed shaft 81 and the position of the through-hole 82 are the positions faced by the opening end of the loading through-hole 24 provided in the loading member for electronic parts 23 when the loading member for electronic parts 23 is arranged in the loading member arranging portion 77.

If, in the state in which the operating knob 75 has been shifted to a position remotest from the loading member arranging portion 77 as shown in FIGS. 15 and 16, the loading member for electronic parts 23 is arranged on the loading member arranging portion 77 and subsequently the operating knob 75 is moved towards the loading member for electronic parts 23, the feed shaft 81 is moved along with the operating knob 75 so as to be inserted in the loading through-hole 24 of the loading member for electronic parts 23.

On an end face of the operating knob 75 arranged towards the groove 73 in which to array the first correction member is mounted a return shaft 83 similar to the feed shaft 81. If the operating knob 75 is moved from the loading member arranging portion 77 from the rearmost position remotest from the loading member arranging portion 77, a return shaft 83 is moved along with the operating knob 75 so as to be inserted into a loading hole 78 of the arraying correcting loading member 76.

The manner in which the arraying state of the electronic parts 22 loaded on the loading member for electronic parts 23 is corrected using the above-mentioned electronic parts arraying correcting device 71 is hereinafter explained.

For correction the arraying state of the electronic parts, loaded on the loading member for electronic parts 23, the loading member for electronic parts 23, on which some of the electronic parts have not been loaded in normal state due to, for example, levelling, is arranged in one of the loading member arranging portions 77. In which of the loading member arranging portions 77 the loading member for electronic parts 23 carrying defective electronic parts 22 is to be arrayed is suitably selected depending on whether the electronic parts loaded on the loading member for electronic parts 23 have been levelled along the long side direction or the short side direction.

Figure 17A:
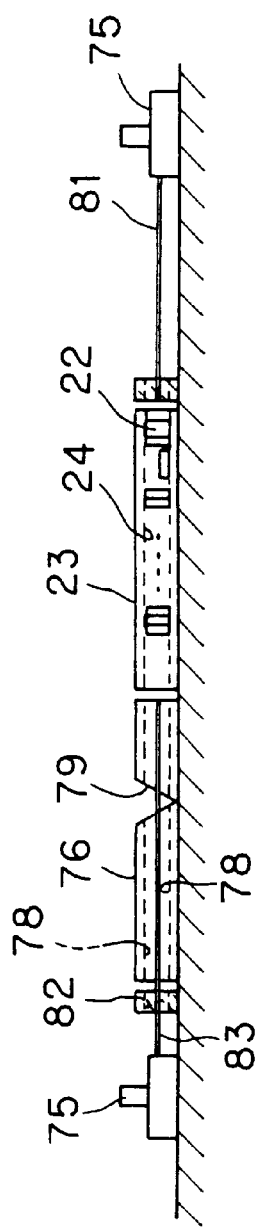
FIGS. 17A to 17D are side views showing the state of correcting the arraying of electronic parts loaded on the loading member for electronic parts using array correction device for correcting the arraying of electronic parts.

For arraying the loading member for electronic parts 23 carrying incorrectly oriented electronic parts 22, the operating knob 75 is moved to its rearward position remotest from the loading member for electronic parts 23, as shown in FIG. 17A. At this time, the distal end of the feed shaft 81 faces the through-hole 65, with the feed shaft 81 not being intruded into the loading through-hole 24 of the loading member for electronic parts 23.

Figure 17B:
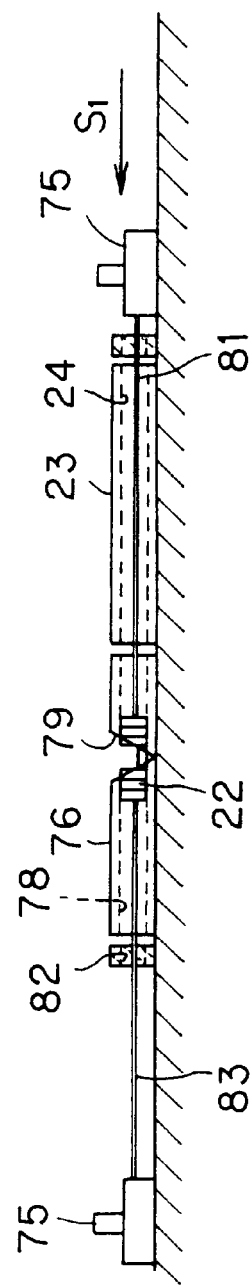
Figure 17C:
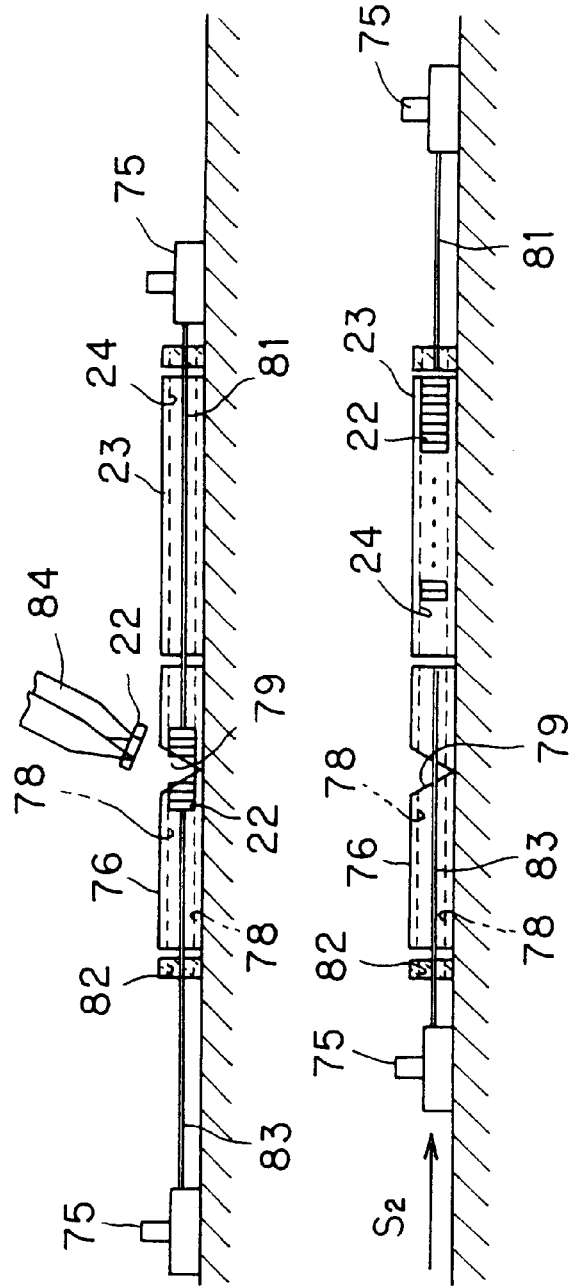

If, with the loading member for electronic parts 23 mounted on the loading member arranging portion 77, the operating knob 75 is moved in the direction indicated by arrow S I in FIG. 17B, as shown in FIG. 17B, the feed shaft 81 is loaded into the loading through-hole 24 of the loading member for electronic parts 23, until its distal end compresses against the electronic parts 22 loaded in the loading through-hole 24. If the feed shaft 81 is further intruded into the loading through-hole 24, the electronic parts 22 are moved from the loading through-hole 24 of the loading member for electronic parts 23 to the loading hole 78 of the arraying correcting loading member 76, while the arraying state of the electronic parts 22 is maintained.

When the operating knob 75 is moved in the direction indicated by arrow S1 in FIG. 17B until the electronic parts suffering from incorrect orientation such as levelling is moved as far as the opening 79 of the arraying correcting loading member 76 used for correcting the orientation, the electronic parts suffering from incorrect orientation are removed or corrected to normal orientation with pincers 84 in order to correct the orientation of the electronic parts 22 in the loading hole 78 of the arraying correcting loading member 76.

Figure 17D:
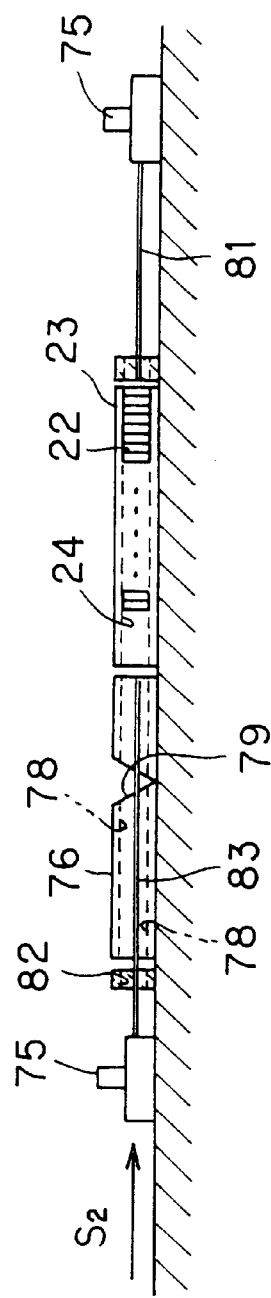

If, after correcting the arraying of the electronic parts in the loading hole 78 of the arraying correcting loading member 76, the operating knob 75 is moved in the direction indicated by arrow S2 in FIG. 17D, as shown in FIG. 17D, the return rod 52 is inserted into the loading hole 78 into abutment against the electronic parts 22 corrected for orientation. The electronic parts 22 are moved in the corrected state in the loading through-hole 24 of the loading member for electronic parts 23 so that the electronic parts 22 in the loading through-hole 24 of the loading member for electronic parts 23 are corrected to correct orientation.

In the above-described arraying correction apparatus for electronic parts, a set of two arraying correction units are arranged on the base plate 51 in order to cope with the levelling of the electronic parts 22 along the long side direction and with that along the short side direction. This, however, is not limitative because a set of plural orientation correction units may be provided on one base plate 51 in association with plural sizes of the electronic parts 22.

The loading members for electronic parts 23, loaded with plural sorts of plural electronic parts to be mounted on the printed circuit board 21 using the loading device for electronic parts 31 as described above, and which has the orientation of the electronic parts 22 corrected using the above-mentioned electronic parts arraying correcting device 71, are held on a loading member holder 91 in readiness for loading on a loading device for electronic parts which will be explained subsequently.

It is noted that plural loading members for electronic parts 23 each carrying the same sort of the electronic parts 22 to be mounted on the printed circuit board 21 are handled as a set. That is, a set of plural loading members for electronic parts 23, each carrying the same sort of the electronic parts 22 to be mounted on the printed circuit board 21, is readied.

Figure 18:
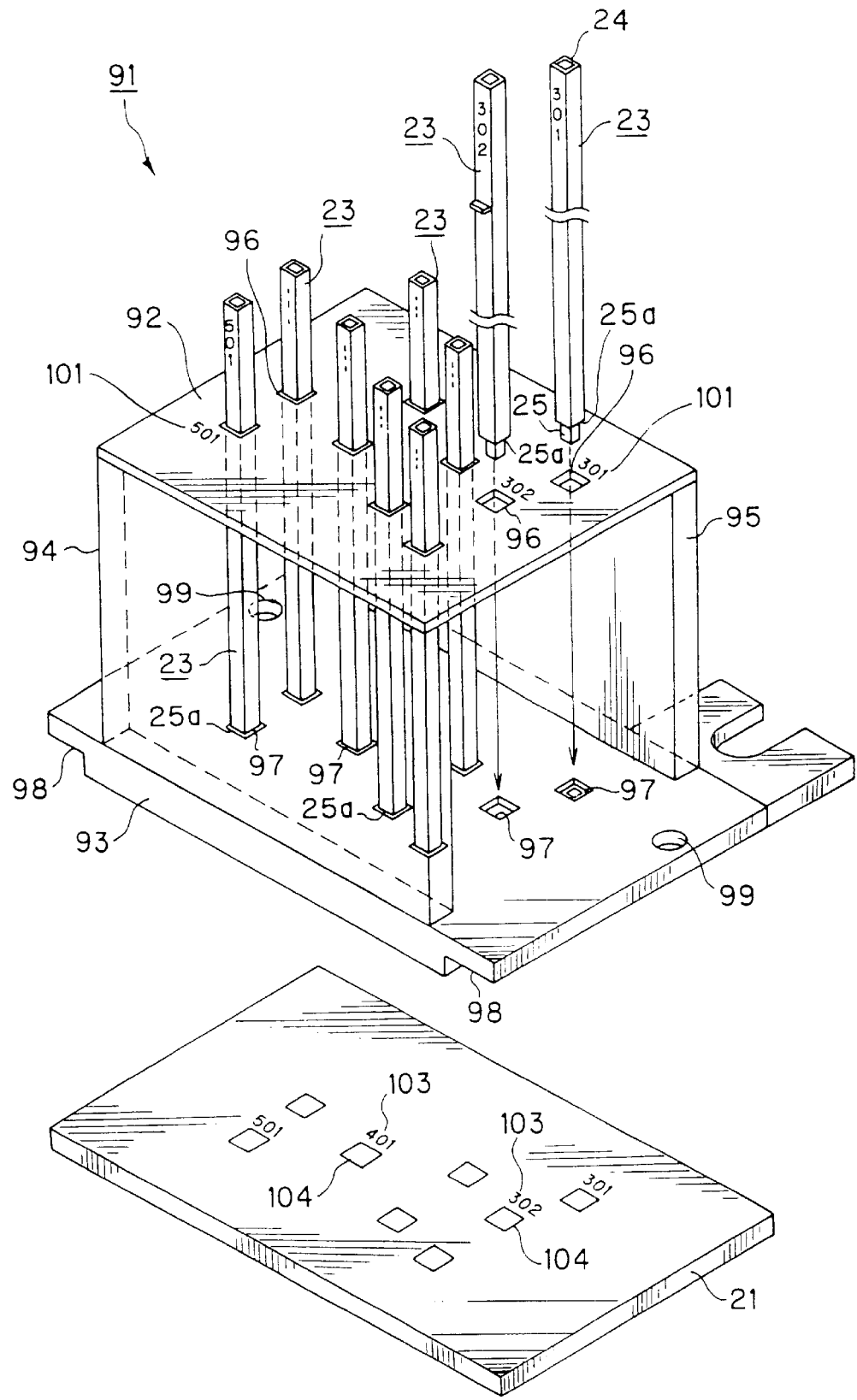
FIG. 18 is a perspective view showing a loading member holder for holding a set of the loading members for electronic parts.

The loading member holder 91, carrying a set of the loading members for electronic parts 23, in register with the mounting positions of the electronic parts on the printed circuit board 21, is removably mounted on the loading device for electronic parts, and is made up of a flat-plate-shaped top plate 92, a bottom plate 93 arranged parallel to the top plate 92, a front plate and a back plate 95 interconnecting the top plate 92 and the bottom plate 93, as shown in FIG. 18. The loading member holder 91 in its entirety constitutes a rectangular-shaped casing. This loading member holder 91 is mounted on the electronic part loading device in a correct loading position on the printed circuit board 21 loaded on the electronic part loading device.

The top plate 92 and the bottom plate 93 are formed with through-holes 96, 97, respectively, for holding the set of loading members for electronic parts 23. The set of through-holes 96, 97, bored in register with each other in the top plate 92 and in the bottom plate 93, respectively, make up a sole holder for holding the sole loading member for electronic parts 23.

The through-holes 96, 97 are shaped in meeting with the cross-sectional shape of the loading member for electronic parts 23 so that the loading member for electronic parts 23 will be positioned in its holding orientation for the loading member holder 91. Meanwhile, the through-hole 97, in which is inserted the reduced-diameter portion 25 at the lower end of the loading member for electronic parts 23, is shaped in meeting with the cross-sectional shape of the reduced-diameter portion 25.

Each loading member for electronic parts 23 is inserted into the associated through-hole 96, 97 from its lower end carrying the reduced-diameter portion 25 first. The loading member for electronic parts 23, inserted and held across these through-holes 96, 97, is inserted into the through-hole 97 in the bottom plate 93, so that the shoulder 25a of the reduced-diameter portion 25 compresses against the upper surface of the bottom plate 93 to control detachment of the loading member for electronic parts 23 from the through-holes 96, 97 to prohibit incidental descent of the loading member for electronic parts 23 from the loading member holder 91.

If the loading member holder 91 provided with the detachment preventative piece 30 is inserted into the through-holes 96, 97, the detachment preventative piece 30 may be retained by the upper surface of the top plate 92 for controlling the detachment from the through-holes 96, 97 to prohibit incidental descent of the loading member for electronic parts 23 from the loading member holder 91.

Meanwhile, the loading member for electronic parts 23 inserted into and held by the loading member holder 91 shown in FIG. 18 is not provided with the detachment preventative piece 30. The loading member holder 91 shown in FIG. 18 is configured so that the shoulder 25a provided on the reduced-diameter portion 25 is retained by the rim of the through-hole 97 formed in the bottom plate 93 to prohibit detachment of the loading member for electronic parts 23 from the through-holes 96, 97 of the loading member for electronic parts 23, so that the loading member for electronic parts 23 need not be provided with the detachment preventative piece 30.

The left and right sides of the bottom plate 93 of the loading member holder 91 are formed with cut-out steps 98, 98. The portions of the loading member holder 91 carrying the steps 98, 98 are formed with positioning holes 99, 99 engaged by positioning protrusions provided on the side of the loading device for electronic parts, as later explained, when the loading member holder 91 is loaded on the loading device for electronic parts.

The through-holes 96, 97, constituting the holder of the loading member for electronic parts 23 provided on the loading member holder 91, are bored in the top plate 92 and in the bottom plate 93, respectively, in register with the mounting positions of the electronic parts 22 provided on the printed circuit board 21.

The upper surface of the top plate 91 constituting the loading member holder 91 carries identification symbols 101 for identifying the loading member for electronic parts 23 inserted through the through-hole 96 formed in the top plate 91 for constituting the holder. These identification symbols 101 are provided by printing, stamping or bonding a label carrying the identification symbols 101.

The loading member for electronic parts 23 carries an identification symbol 102 in association with the identification symbols 101 provided for the through-hole 96 in which the loading member 23 is inserted, as shown in FIG. 3. That is, the loading member for electronic parts 23 carries the same identification symbols 102 as the identification symbols 101 associated with the through-hole 96 in which is inserted the loading member for electronic parts 23. The identification symbols 102 is provided on the loading member for electronic parts 23 by printing, stamping or bonding a label carrying the identification symbols 101 on a readily visible portion of the lateral side of the upper end of the loading member for electronic parts 23.

By providing the associated identification symbols 101, 102 on the through-hole 96 of the loading member holder 91 and on the loading member for electronic parts 23, the loading members for electronic parts 23 carrying different electronic parts for loading can be easily and correctly inserted into and held by the pre-set through-holes 96.

Meanwhile, the identification symbols 101 on the loading member holder 91 may also be provided on the bottom plate 93.

It is noted that the identification symbols 101 on the loading member holder 91 are constituted by numerical figures or letters specifying the arraying order of the through-holes 96, 97 constituting the plural holding portions. That is, the identification symbols 101 are constituted by symbols such as numerical figures or letters specifying the right-and-left or up-and-down arraying order in accordance with the arraying order of the through-holes 96, 97 constituting the plural holding portions. Since the identification symbols 101 are constituted by the symbols specifying the arraying sequence of the through-holes 96, 97 representing plural holding portions, the plural sorts of the loading members for electronic parts 23 of different sorts can be correctly inserted into the associated through-holes 96, 97 without failure in insertion.

The identification symbols 102, provided on the loading member for electronic parts 23, are constituted by numerical figures or letters corresponding to those specifying the arraying sequence of the through-holes 96, 97.

On the other hand, the identification symbols 101 accorded to the loading member holder 91 are constituted by symbols provided in meeting with identification symbols 103 for mounted electronic parts accorded to an electronic part mounting portions 104 of the printed circuit board 21 carrying the electronic parts 22. That is, the same symbols as the identification symbols 103 accorded to the electronic part mounting portions 104 of the printed circuit board 21 carrying the electronic parts 22 are used. The identification symbols 103 provided on the printed circuit board 21 are also constituted by the numerical figures or letters specifying the arraying sequence of the electronic part mounting portions 104.

By providing the associated identification symbols 101, 102 and 103 on the printed circuit board 21, loading member holder 91 and on the loading member for electronic parts 23, respectively, the loading members for electronic parts 23 carrying the electronic parts 22 mounted on the electronic part mounting portions 104 of the printed circuit board 21 can be correctly inserted into and held by the associated through-holes 96, 97.

The loading members for electronic parts 23, each carrying plural electronic parts 22 of a particular sort, to be mounted on the sole printed circuit board 21, using the loading device for electronic parts 31, are combined together as one set.

Figure 19:
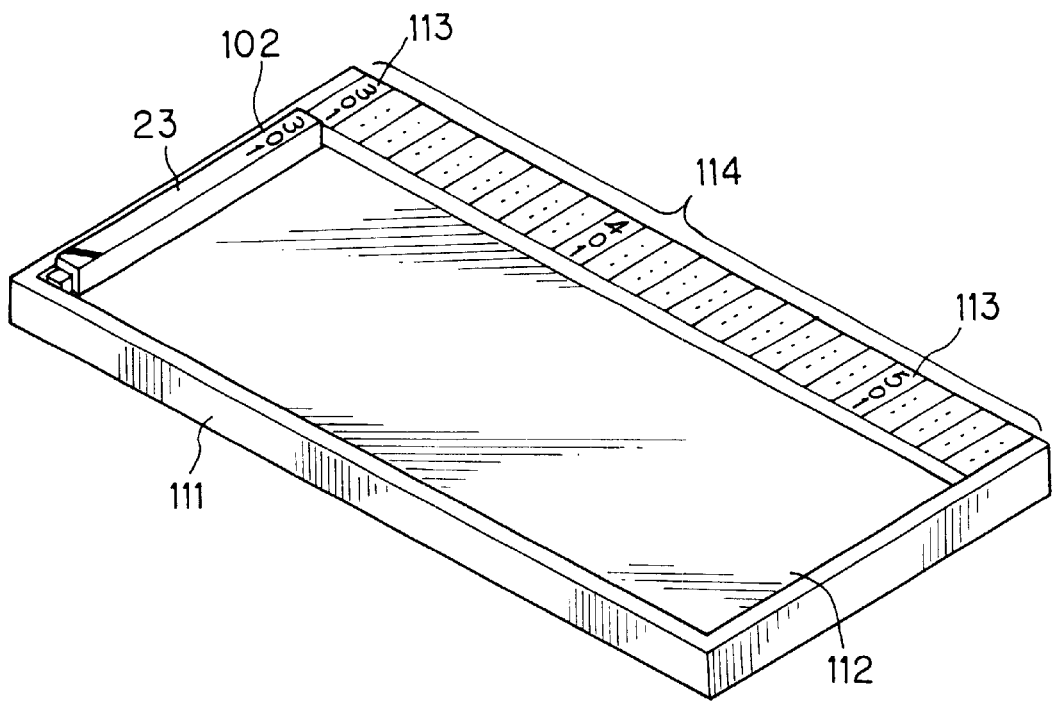
FIG. 19 is a perspective view showing a loading member holding casing.

At least one of the plural sets of the loading members for electronic parts 23, each carrying a single sort of electronic parts, is accommodated and held in a loading member furnishing casing 111 configured as shown in FIG. 19. This loading member furnishing casing 111 holds and stores a set of the loading members for electronic parts 23, carrying a set of electronic parts 22 mounted on the sole printed circuit board 21, and has a container 112 in which to hold side-by-side a set of the loading members for electronic parts 23. On one side of the container 112 is an identification symbol indicating portion 114 having identification symbols 113 corresponding to the identification symbols 102 provided on the loading members for electronic parts 23 in association with the housing positions of the loading members for electronic parts 23 in the arraying direction of the loading members for electronic parts 23. The identification symbols 113, accorded to the identification symbol indicating portion 114, are constituted by symbols corresponding to the numerical figures or letters specifying the arraying sequence of the plural through-holes 96, 97 formed in the loading member for electronic parts 23, and are accorded in agreement with the arraying sequence of the plural through-holes 96, 97 from the left towards the right in FIG. 19. These identification symbols 113 are provided by printing or stamping on the identification symbol indicating portion 114 or by applying a label carrying the identification symbol 101.

The operator accommodates the loading members for electronic parts 23 in trim order in the container 112, as he or she confirms the association of the identification symbols 102 accorded to the loading members for electronic parts 23 and the identification symbols 113 accorded to the identification symbol indicating portion 114 of the loading member furnishing casing 111.

On a lateral side of a main body portion 23a of the loading member for electronic parts 23 is provided a portion 115a of a pattern 115 which is completed on arraying the plural loading members for electronic parts 23 in accordance with a pre-set arraying sequence, as shown in FIG. 3. When the loading members for electronic parts 23 are accommodated and arrayed in the loading member furnishing casing 111, the loading members are arranged so that the portions 115a of the pattern 115 provided on the lateral surfaces of the main body portions 23a face the upper surfaces of the loading member furnishing casing 111.

When the entirety of the loading members for electronic parts 23 is arrayed by the above-described sequence of operations in the container without producing arraying errors, the portions 115a of the pattern 115 of the loading members for electronic parts 23 complete a sole pattern 115, herein a pattern of an inclined straight line, on the entire upper surface formed on side-by-side arraying the set of the loading members for electronic parts 23. If there is any error in the arraying sequence of the loading members for electronic parts 23 in the container 112, there is produced a step in the slanted line pattern 115 in the incorrect arraying point without forming the pattern 115 of a sole slanted line such as is shown in FIG. 20.

By checking the pattern 115 formed by a two-dimensional concatenation of the portions 115a of the pattern 115 provided on the loading member for electronic parts 23, it can be indicated at a glance whether or not the loading members for electronic parts 23 have been arrayed in the correct sequence. On the other hand, the set of the loading members for electronic parts 23, accommodated and arrayed in the loading member furnishing casing 111, are arrayed in the inserting sequence into the loading member holder 91, so that, if the loading members for electronic parts 23 are taken out sequentially from the left side in FIG. 20 at which the loading members for electronic parts 23 have been loaded in the loading member furnishing casing 111, and are inserted into the through-holes 96, 97 in the loading member holder 91, the loading members for electronic parts 23 can be correctly and easily inserted into and held by the associated through-holes 96, 97 on the loading member holder 91.

The loading member for electronic parts 23 from which the electronic parts have been loaded by the loading device for electronic parts 31 and which has become void is accommodated and arrayed so that the identification symbol 102 is in meeting with the identification symbol 113 provided on the loading member holder 91. This ensures that the electronic parts 22 can be loaded in correct order when loading the pre-set electronic parts 22 in the loading member for electronic parts 23 set on the loading device for electronic parts 31.

Figure 20:
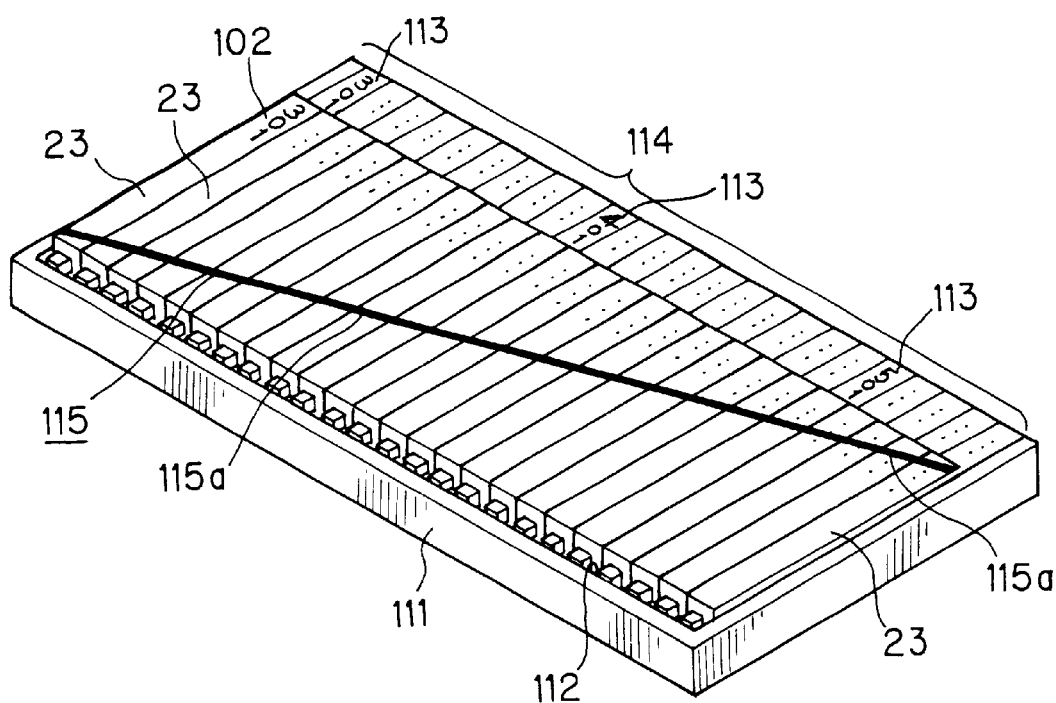
FIG. 20 is a perspective view showing the state m which a set of the electronic parts loaded on a sole printed circuit board have been accommodated in the loading member holding casing in accordance with a pre-set arraying.

In FIG. 20, the pattern for identifying the arraying of the loading members for electronic parts 23 is a geometrical design of a simple slanted line. This, of course, is not limitative insofar as the pattern permits visual confirmation of the arraying sequence and insofar as the pattern is completed by utilizing all of the loading members for electronic parts 23 stored in the loading member furnishing casing 111.

It is also possible for the loading member furnishing casing 111 to accommodate and store not only the set of the loading members for electronic parts 23 carrying a set of the electronic parts 22 mounted on a sole printed circuit board 21, but also plural sets of the loading members for electronic parts 23 simultaneously. In this case, the loading members for electronic parts 23 are accommodated so that the sets of the same types of the loading members for electronic parts 23 will be arranged as separate groups. If partitions are provided for separate containers accommodating and holding the same type of the loading members for electronic parts 23, the loading members for electronic parts 23 of the same type can be housed in trim order without the loading members for electronic parts 23 of different types being arrayed together.

If a number of sets of the loading members for electronic parts 23, carrying a number of sets of the electronic parts 22 to be mounted on a sole printed circuit board 21, are arrayed and accommodated in groups each consisting of the same sort of the loading members, it is possible to use the container as the loading member storage casing, in which case the same set of the loading members for electronic parts 23 are taken out sequentially from the loading member storage casing and arranged in the above-described loading member furnishing casing 111 so as to be inserted into and held by the loading member holder 91.

By employing the loading member furnishing casing 111 in which to accommodate and hold plural sets of the loading members for electronic parts 23 as groups, it becomes possible to carry out the operation of loading the electronic parts 22 into the loading members for electronic parts 23 using the loading device for electronic parts 31, and the operation of inserting into and holding by the loading member holder 91 of the loading members for electronic parts 23 independently of each other in separate places, thus enabling the operation of mounting the electronic parts on the printed circuit board 21 more efficiently.

The loading member storage casing has identification symbols corresponding to the identification symbols 102 provided on the loading members for electronic parts 23 housing pre-set sorts of the electronic parts 22, in register with the housing positions of the loading members for electronic parts 23 housing pre-set sorts of the electronic parts 22. By accommodating the loading members for electronic parts 23 in groups in meeting with these identification symbols, a number of loading members for electronic parts 23 accommodating different types of the electronic parts can be accommodated and controlled correctly.

Meanwhile, since the mounting method and apparatus for electronic parts according to the present invention are designed to mount the electronic parts 22 in the form of chips on the printed circuit board 21, the electronic parts 22 are set on the electronic part mounting portion 104 of the printed circuit board 21 and subsequently secured to the printed circuit board 21 such as by a solder curing oven. Therefore, the electronic parts 22 need to be provisionally secured to the printed circuit board 21 at least until the electronic parts 22 furnished from the loading members for electronic parts 23 are soldered to the printed circuit board 21.

Thus, with the mounting method and apparatus of the electronic parts according to the present invention, a coating step of coating the adhesive for provisionally securing the electronic parts 22 on the printed circuit board 21 and an adhesive applying device 121 is used for coating the printed circuit board 21 with the adhesive.

Figure 21:
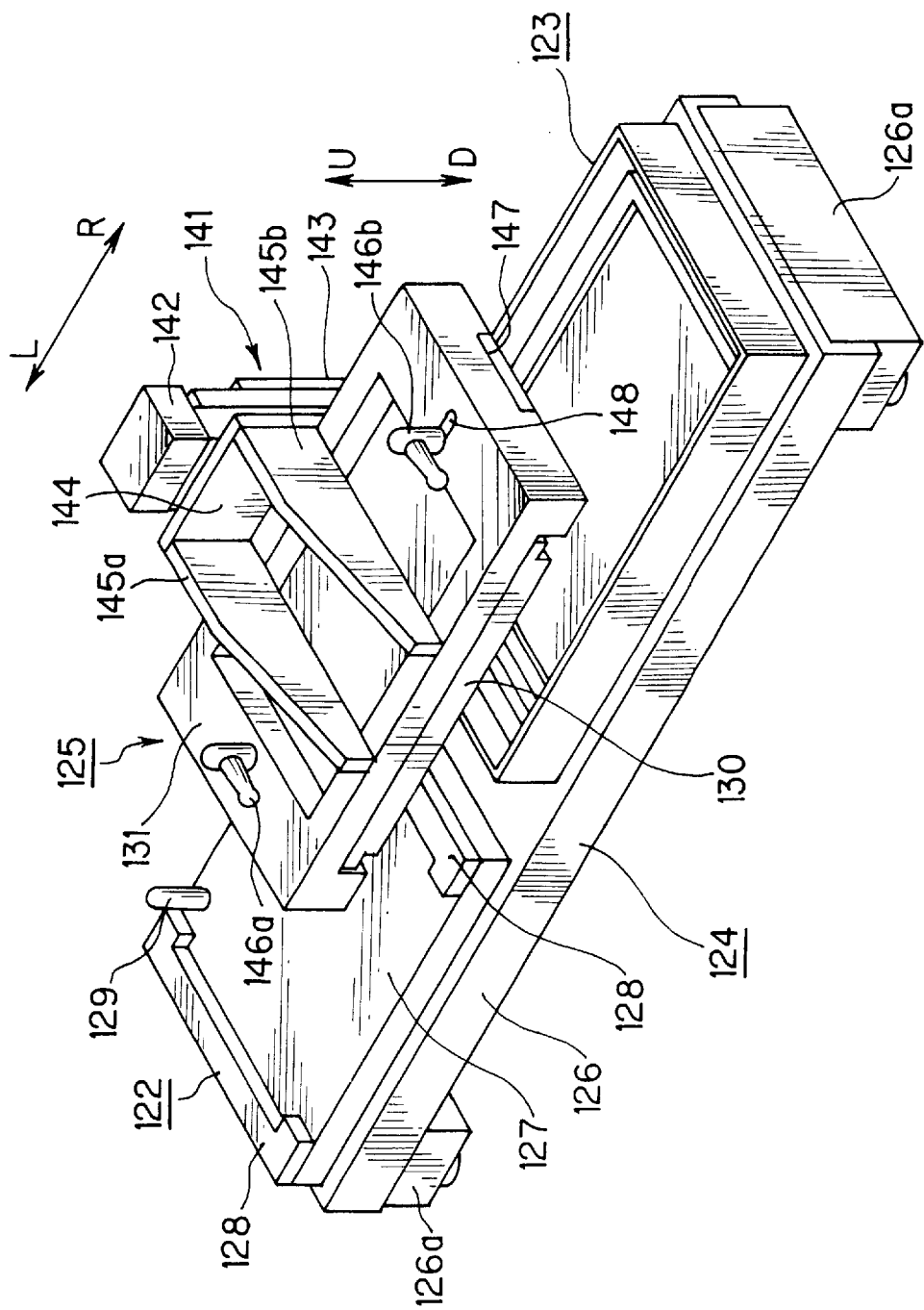
FIG. 21 is a perspective view showing an adhesive coating device.
Figure 22:
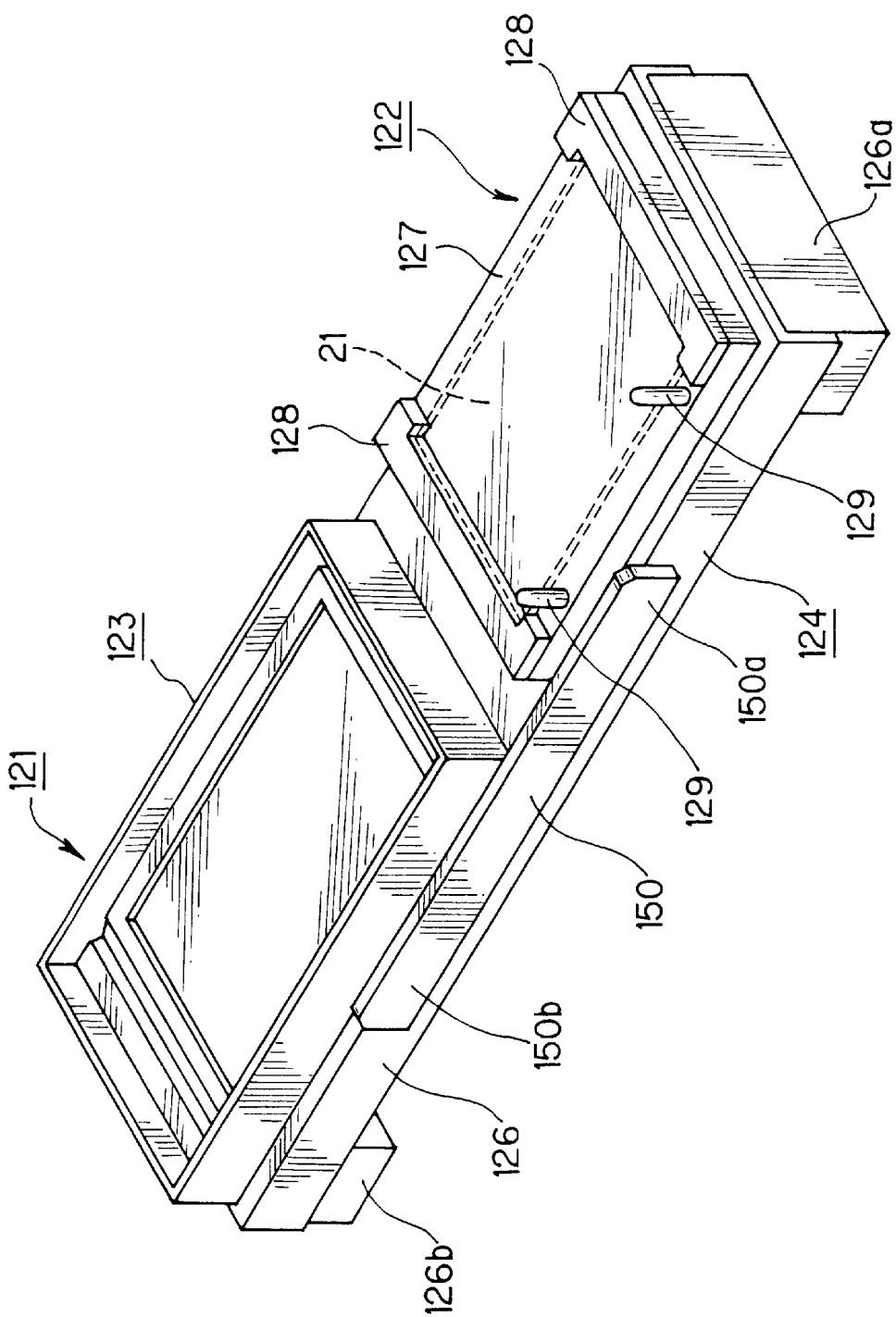
FIG. 22 is a perspective view showing a base unit of the adhesive coating device.

Referring to FIGS. 21 and 22, the adhesive applying device 121 includes a base unit 124, made up of a substrate arraying unit 122 and an adhesive storage vessel 123, arranged side-by-side, and a coating unit 125, which is mounted for sliding in the direction indicated by arrows L and R in FIG. 21 along which the substrate arraying unit 122 and the adhesive storage vessel 123 are arrayed side-by-side on the base unit 124 and for movement in the up-and-down direction relative to the base unit 124.

The components of the base unit 124 are hereinafter explained. A base member 126, constituting the base unit 124, is formed by a substantially U-shaped plate, as shown in FIG. 22, and is supported at its both ends by legs 126*a*, 126*a*. On the back side of the base member 126 is a rail for supporting and sliding the coating unit 125, which is moved along this rail between the substrate arraying unit 122 and the adhesive storage vessel 123.

The substrate arraying unit 122 includes a circuit substrate arraying block 127 on which is arranged the printed circuit board 21 on which to apply an adhesive. On the circuit substrate arraying block 127 is arranged the printed circuit board 21 as indicated by broken line in FIG. 22. The printed circuit board 21, arranged on the circuit substrate arraying block 127, has its arraying position set by fitting on the inner rim sides of a pair of positioning frames 128, 128 provided on opposite ends of the circuit substrate arraying block 127. On the circuit substrate arraying block 127 are set a pair of upstanding projections 129, 129 as an aid for positioning the coating unit 125 when mounting a pin block 130 on a pin block holder 131 or when applying the adhesive to the printed circuit board 21 as later explained.

Figure 23:
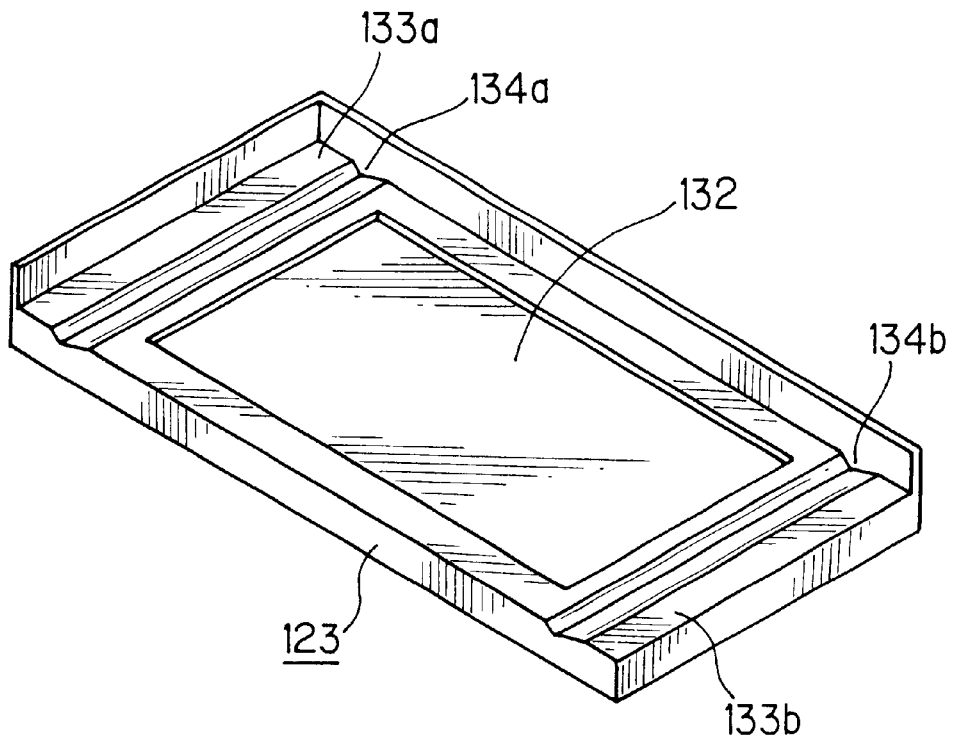
FIG. 23 is a perspective view showing an adhesive storage vessel constituting the adhesive coating device.
Figure 24:
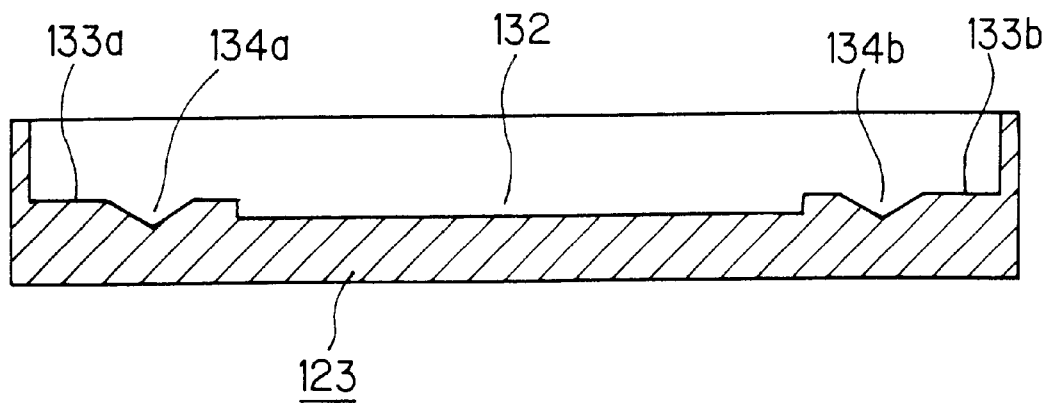
FIG. 24 is a cross-sectional view of the adhesive storage vessel.
Figure 25:
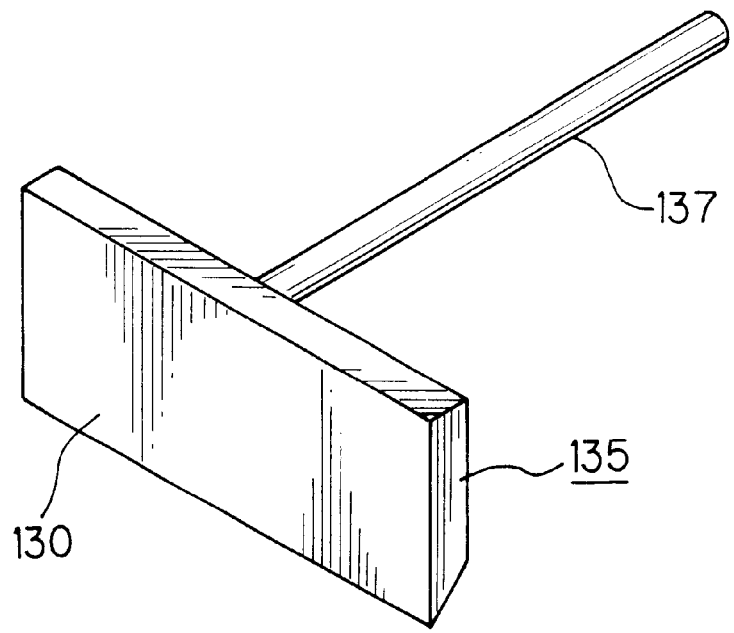
FIG. 25 is a cross-sectional view of the adhesive storage vessel.
Figure 26:
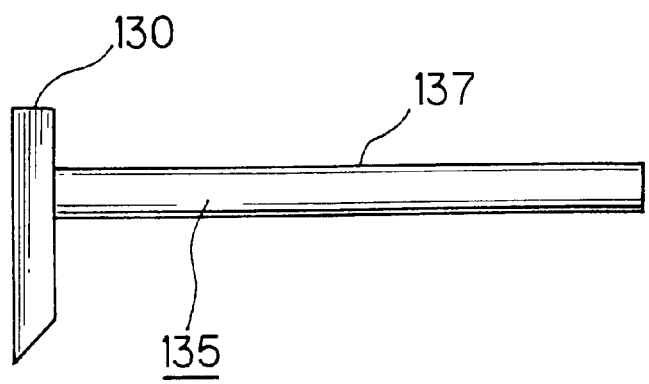
FIG. 26 is a side view thereof.

The adhesive storage vessel 123, arranged side-by-side with respect to the substrate arraying unit 122, is formed at its mid portion with an adhesive storage 132 in the form of a recess with a pre-set depth of, for example, approximately 1 mm, for storage of an adhesive substantially uniformly. On both sides of the adhesive storage 132 are formed adhesive setting shelves 133*a*, 133*b* and vee-shaped grooves 134*a*, 134*b*, as shown in FIGS. 23 and 24. When storing the adhesive in the adhesive storage 132, the adhesive is first set on one of the adhesive setting shelves 133*a*, 133*b* and extended along the length of the adhesive storage vessel 123 using an extender 135 as now explained. Referring to FIGS. 25 and 26, the extender 135 is constituted by a spatula 136 tapered towards its distal end, and a handle 137. Using this extender 135, the adhesive set on the adhesive setting shelves 133a, 133b is extended along the length of the adhesive storage vessel 123. By providing the grooves 134a, 134b, any excess adhesive is accommodated in the grooves 134a, 134b, so that the adhesive supplied to the adhesive storage 132 can be set to moderate amounts to decrease nonuniform storage otherwise caused by partial rising in level of the adhesive supplied to the adhesive storage 132.

Referring to FIG. 21, the coating unit 125 is mounted on the base unit 124 so that the coating unit 125 can be slid in the direction indicated by arrows L or R in FIG. 21 so as to be in register with the substrate arraying unit 122 and with the adhesive storage vessel 123, as shown in FIG. 21. By movement of a lift 142 in the up-and-down direction, a lift unit 141 supports the coating unit 125 in its entirety for movement in the up-and-down direction indicated by arrows U or D in FIG. 21 and has its back side supported by a holding plate 143. The lift unit 141 also holds the pin block holder 131 by a supporting plate 144 and a pair of holder supporting plates 145a, 145b. The pin block holder 131 also supports the pin block holder 131 on its lower side. A pair of levers 146a, 146b are provided as handles used in moving the coating unit 125. The levers 146a, 146b are engaged in a screw mounted on a stationary plate 147 via elongated hole 148 after securing the pin block 130 on the pin block holder 131.

On the back side of the base member 126 is mounted a protection plate 150 controlling the lowering movement of the coating unit 125 as shown in FIG. 22. This protection plate 150 has its upper edge portion abutted against the lower end of the lift 142 of the lift unit 141 for preventing descent of the coating unit 125 in other than a pre-set position. That is, longitudinal ends 150a, 150b of the protection plate 150 are associated with the substrate arraying unit 122 and the adhesive storage vessel 123, respectively.

The sliding movement of the coating unit 125 is now explained.

Figure 27:
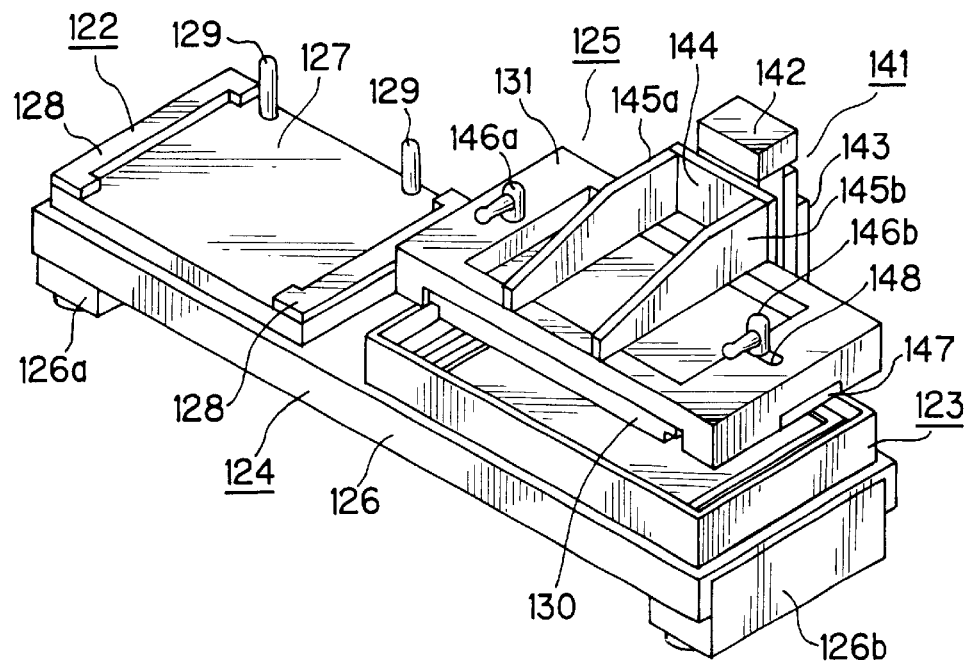
FIGS. 27 and 28 are perspective views showing the sliding operation of a coating unit.
Figure 28:
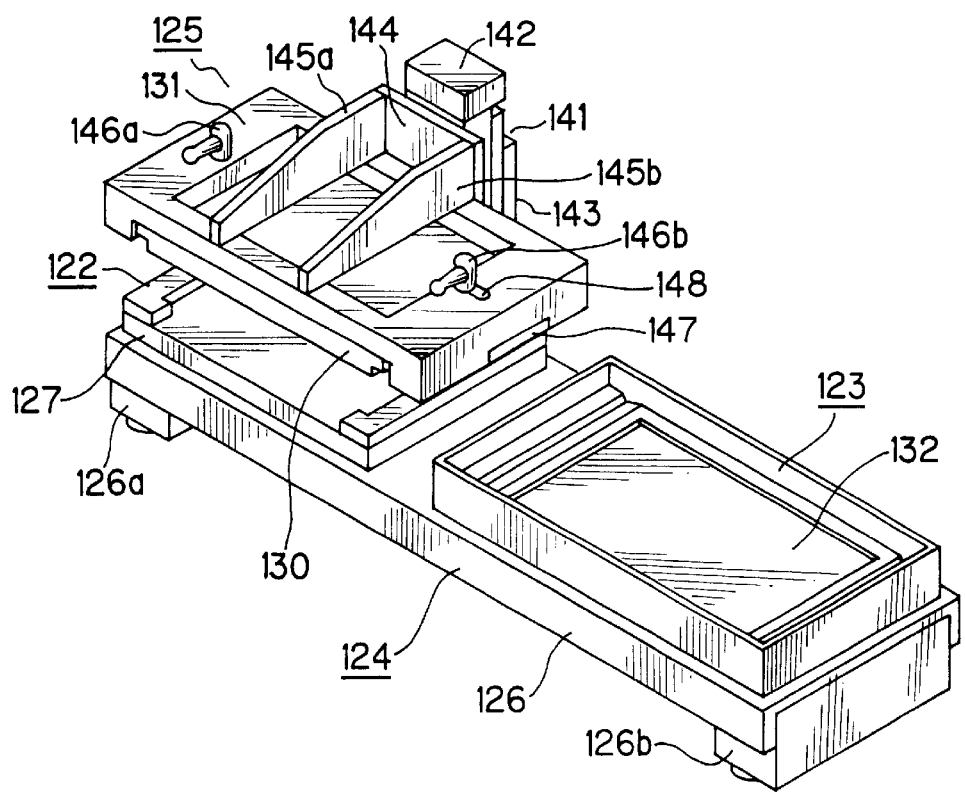

Referring to FIGS. 27 and 28, the coating unit 125 is moved between the position facing the adhesive storage vessel 123 and the position facing the substrate arraying unit 122. The coating unit 125 is first moved above the adhesive storage vessel 123 and subsequently lowered, as shown in FIG. 27, a pre-set amount of the adhesive is applied to the distal end of the pin, not shown, mounted on the pin block 130. By upwardly moving the coating unit 125 to above the substrate arraying unit 122 and lowering the coating unit 125, after applying an adhesive to the pin, the adhesive applied to the distal end of the pin can be applied to a pre-set position of the printed circuit board 21.

Figure 29:
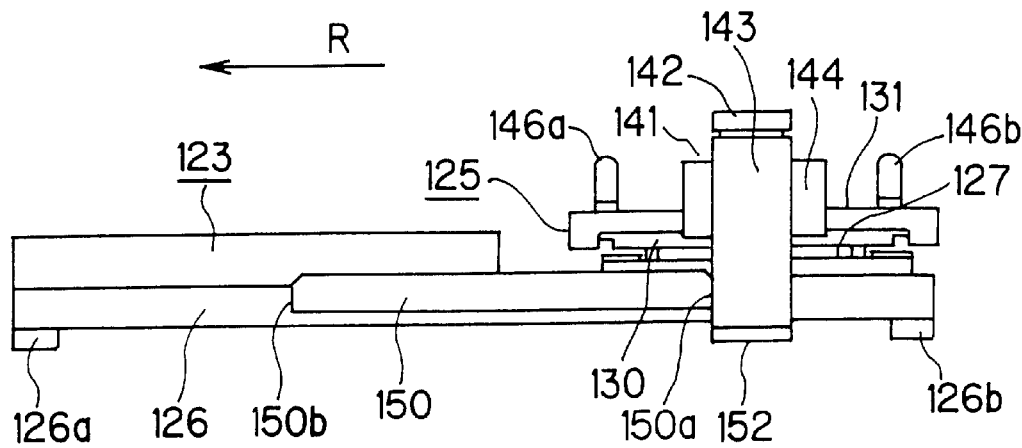
FIGS. 29, 30 and 31 are plan views showing the sliding operation of a coating unit.
Figure 30:
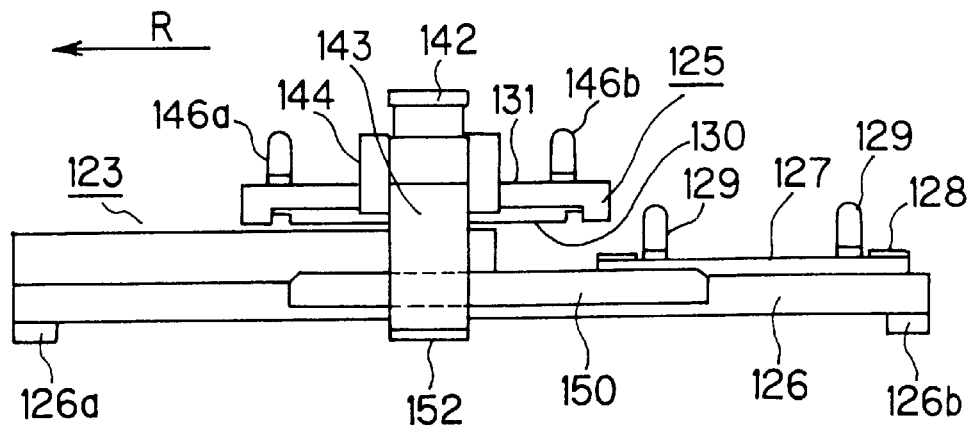
Figure 31:
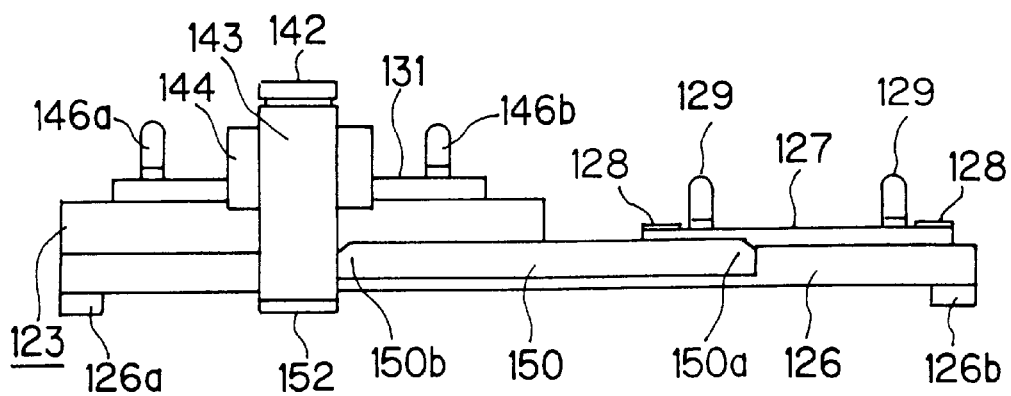

FIGS. 29 to 31 show the sliding operation of the coating unit 125 from the back side of the adhesive applying device 121. Of these, FIG. 29 shows the state n which the coating unit 125 is lowered on the substrate arraying unit 122 to apply the adhesive applied to the end of the pin on the printed circuit board 21. When the coating unit 125 is lowered in meeting with the arraying position of the substrate arraying unit 122, as shown in FIG. 28, the lift 142 is moved outwardly of an end 150a of the protection plate 150 to permit descent of the coating unit 125. If, in this state, the coating unit 125 is raised and slid in the direction indicated by arrow R in FIGS. 29 and 30, the lower end of the lift 142 is slid on the upper side of the protection plate 150, as indicated by a broken line in FIG. 29, in order to limit the descent of the substrate arraying unit 122 such as to inhibit descent of the substrate arraying unit 122 relative to the adhesive storage vessel 123 at other than the pre-set position. If the coating unit 125 is slid in the direction indicated by arrow R in FIG. 30, the lower end of the lift 142 traverses the end 150b of the protection plate 150 to permit the coating unit 125 to be lowered relative to the adhesive storage vessel 123.

The mechanism of sliding the coating unit 125 is now explained. This mechanism includes the lift unit 141 held by a holder plate 143 which is mounted on an end of a slide plate 152. The mid portion of the slide plate 152 has a fitting block 153 which fits on a rail 154 provided at a mid portion of the back surface of the base member 126 for extending along the length of the base member 126. The fitting block 153 is provided with fitting projections 153a, 153b having built-in bearings and which are fitted in fitting grooves 154a, 154b provided on the rail 154, to permit sliding of the coating unit 125 relative to the base member 126.

On both sides of the rail 154 are fitted stops 155a, 155b for controlling the range of sliding movement of the coating unit 125. That is, the ends 150a, 150b of the protection plate 150 are positioned in register with the positions of limitation of the sliding movement by these stops 155a, 155b, as shown in FIGS. 22 and 29 to 31.

The coating unit 125, carried on the slide plate 152, is moved along the length of the base member 126, as described above. However, if, as explained with reference to FIG. 31, the lift unit 141 is disposed more outwardly than the end 150a of the protection plate 150, the lift 142 can be lowered. Thus, the coating unit 125 can be lowered to permit the adhesive to be applied to the printed circuit board 21. Alternatively, if the coating unit 125 is positioned on the adhesive storage vessel 123, the adhesive can be applied to the distal end of the pin.

Figure 33:
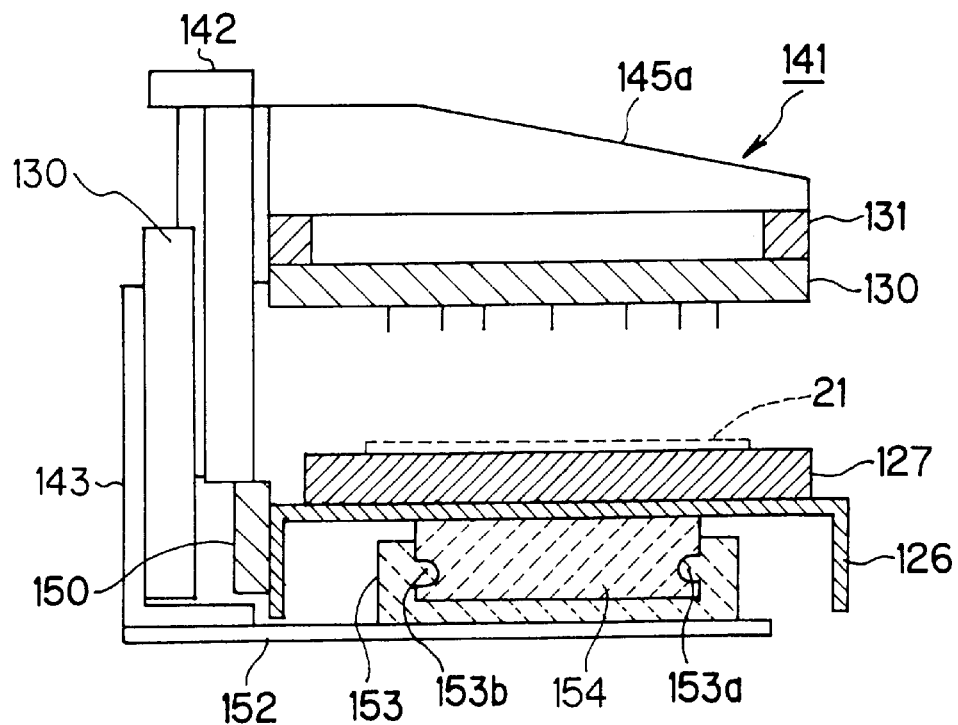
FIG. 33 is a cross-sectional showing the state in which the coating unit has been separated away from the printed circuit board.
Figure 34:
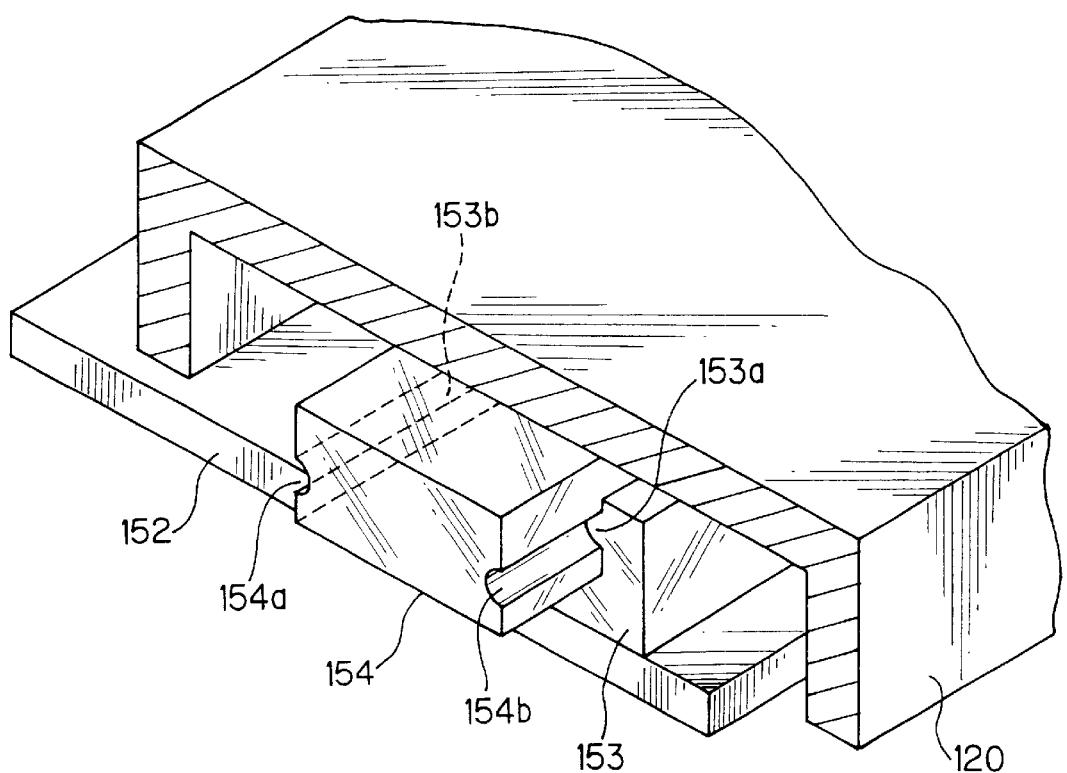
FIG. 34 is a perspective view showing a rail of a base member.
Figure 35:
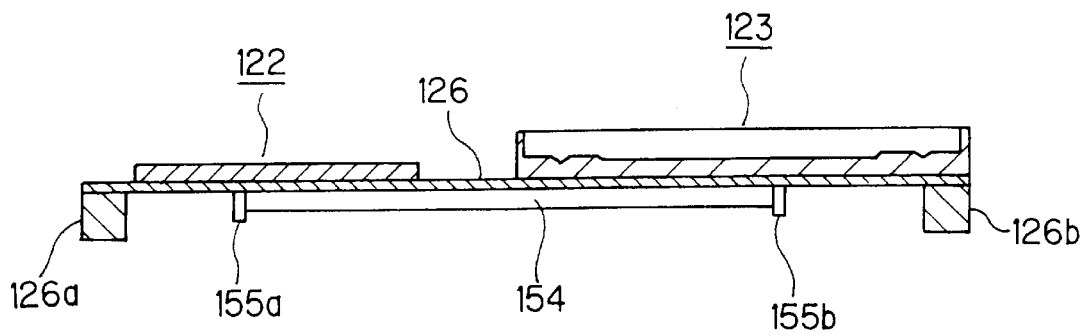
FIG. 35 is a cross-sectional view showing the rail of the base member.

If the lift unit 141 is positioned on the protection plate 150, the lift 142 is uplifted, as shown in FIG. 30, with the lower end thereof sliding on the upper side of the protection plate 150 to maintain the state shown in FIG. 33 until the end is reached to prevent the coating unit 125 to descend by error, as already explained with reference to FIG. 30.

The lift unit 141 may be configured for being lifted and lowered manually, pneumatically or hydraulically. The electric driving may also be used.

The structure of the pin block 130 is now explained.

Referring to FIG. 36, the pin block 130 has, in its mid portion, a pin arraying portion 161 sized to be coextensive as the printed circuit board 21. On this pin arraying portion 161 are mounted plural adhesive applicator pins 162 in register with the adhesive coating positions on the printed circuit board 21. On the ends of the pin arraying portion 161 are formed positioning holes 163, 163 engaged in the positioning projections 129, 129 shown in FIG. 22 for positioning at the time of application of an adhesive or at the time of mounting the pin block 130 on the pin block holder 131.

On both ends of the pin arraying portion 161 are formed a pair of flanges 164, 164 operating as stationary portions for securing to the pin block holder 131. The ends of the stationary plates 147, 147 provided on the pin block holder 131 are fitted on these flanges 164, 164 for securing the pin block 130 itself to the pin block holder 131. The cut-outs 165, 165 formed in the flanges 164, 164 serve as clearances for screws mounted on the stationary plates 147, 147.

The adhesive applicator pin 162 includes a sleeve portion 166, a rod portion 167 arranged in the sleeve portion 166, and a spring 168, as shown in FIGS. 37A, 37B. The spring 168 has its one end and its opposite end connected to the bottom of the sleeve portion 166 and to the end of the rod portion 167, respectively. The adhesive applicator pins 162 are mounted on the pin arraying portion 161 by being fitted in a fitting hole formed in the pin arraying portion 161.

Figure 32:
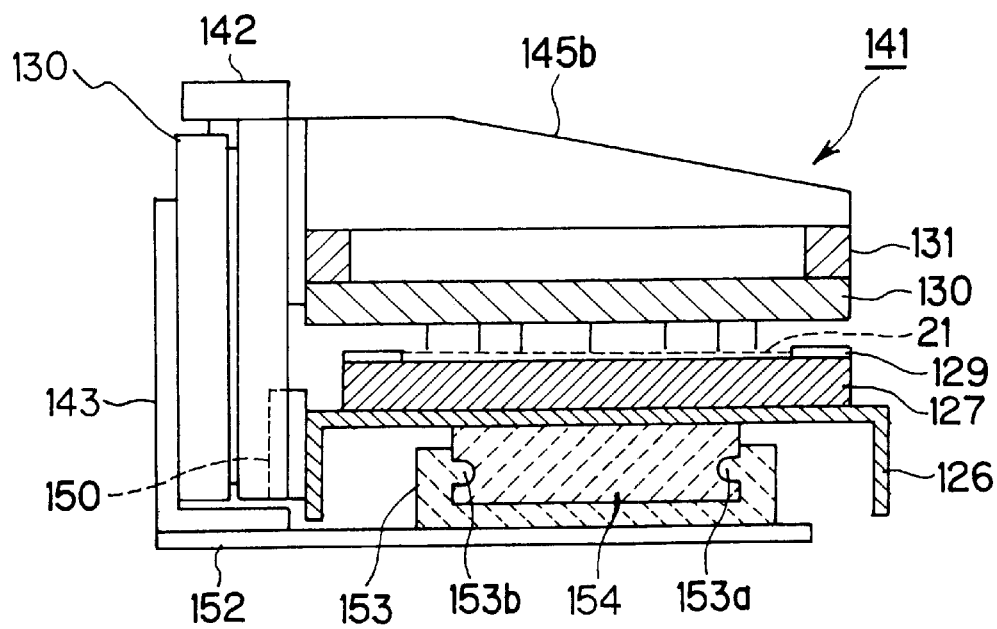
FIG. 32 is a cross-sectional view showing the uplifting/lowering operation of the coating unit and the state of coating an adhesive on a printed circuit board.

When the coating unit 125 is moved to its lower position as shown in FIG. 32 so that the pin 162 is thrust against the printed circuit board 21, the rod portion 167 is thrust by the printed circuit board 21. When the rod portion 167 is thrust, the adhesive applicator pin 162 is pushed into the sleeve portion 166, against the bias of the spring 168, as shown in FIG. 37A, from the state in which the pin 162 is projected from the distal end of the sleeve portion 166, as shown in FIG. 37A. At this time, the rod portion 167 is thrust against the printed circuit board 21 under the bias of the spring 168.

The pin block holder 131 is now explained.

Figure 38:
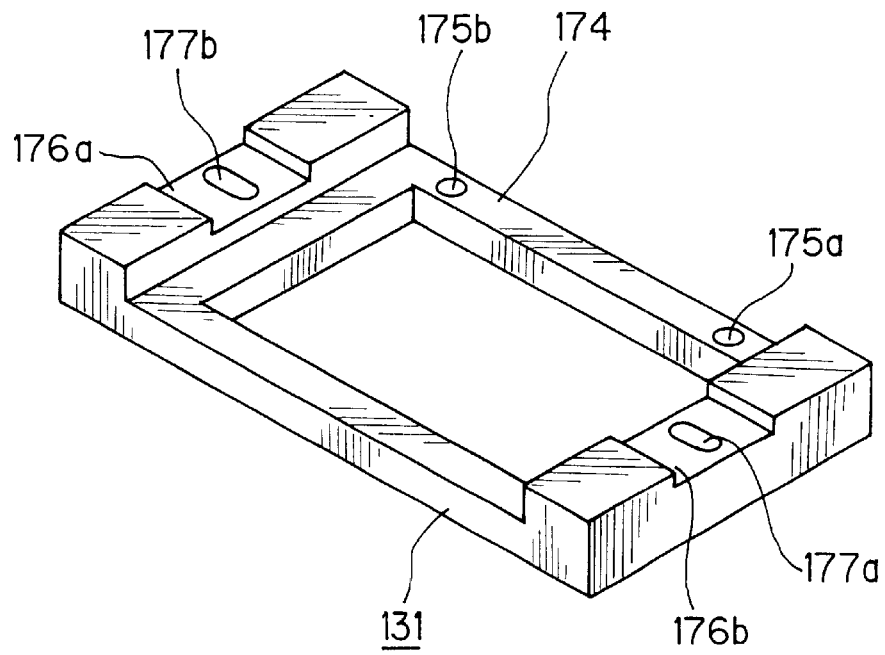
FIG. 38 is a perspective view showing a pin block holder.

Referring to FIG. 38, the pin block holder 131 includes a pin block locating member 174, having a center recess. In the pin block locating member 174 are formed fitting holes 175a, 175b in register with positioning holes 163a, 163b formed in the pin block 130. For applying the adhesive or mounting the pin block 130, the pin block 130 is mounted in position relative to the circuit substrate arraying block 127 by having the distal ends of the positioning projections 129, 129 traversing the positioning holes 163a, 163b fitted in the fitting holes 175a, 175b.

Figure 39:
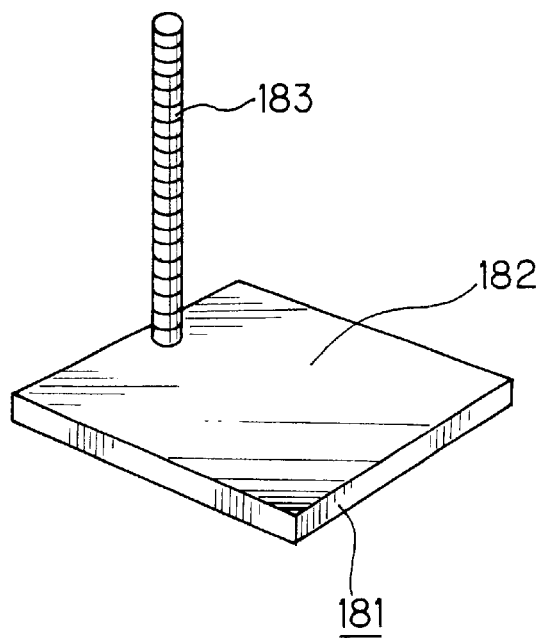
FIG. 39 is a perspective view showing a stationary plate.

Referring to FIG. 39, a stationary plate 181 has a shaft-like screw 183 mounted on an end of a flat plate portion 182 which is fitted in fitting grooves 176a, 176b formed in the pin block holder 131. When the flat plate portion 182 is fitted in the fitting grooves 176a, 176b, the screw 183 is passed through an elongated hole as later explained so that its distal end is threadedly engaged with the levers 146a, 146b. The fitting grooves 176a, 176b are formed so that the flat plate portion 182 of the stationary plate 181 is fitted therein, as shown in FIG. 38. When the flat plate portion 182 is fitted in the fitting grooves 176a, 176b, the screw 183 is passed through elongated holes 177a, 177b formed in the fitting grooves 176a, 176b to permit the stationary plates 181a, 181b to be moved in the fitting grooves 176a, 176b along the length of the elongated holes 177a, 177b.

Figure 40:
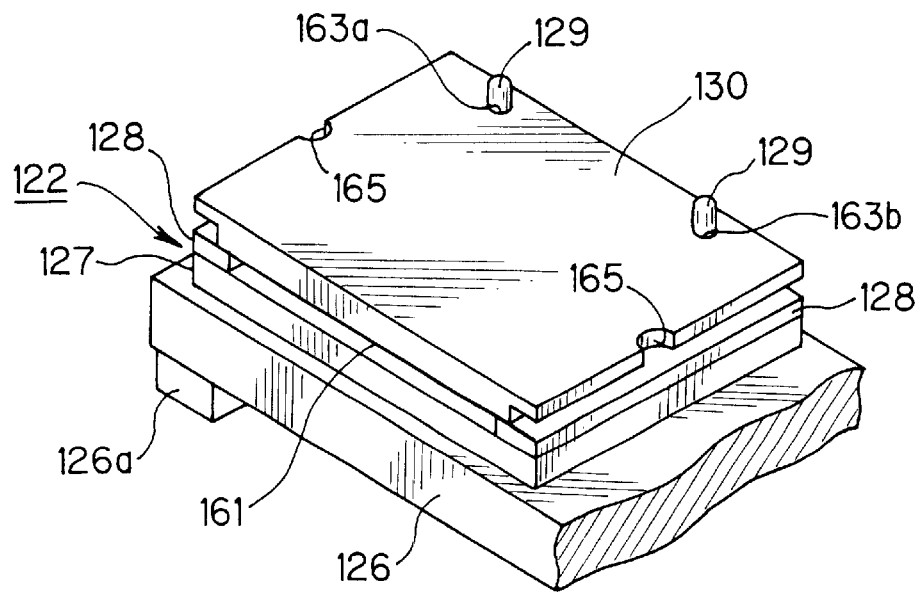
FIG. 40 is a perspective view showing the state in which the pin block has been mounted on the base member.
Figure 41:
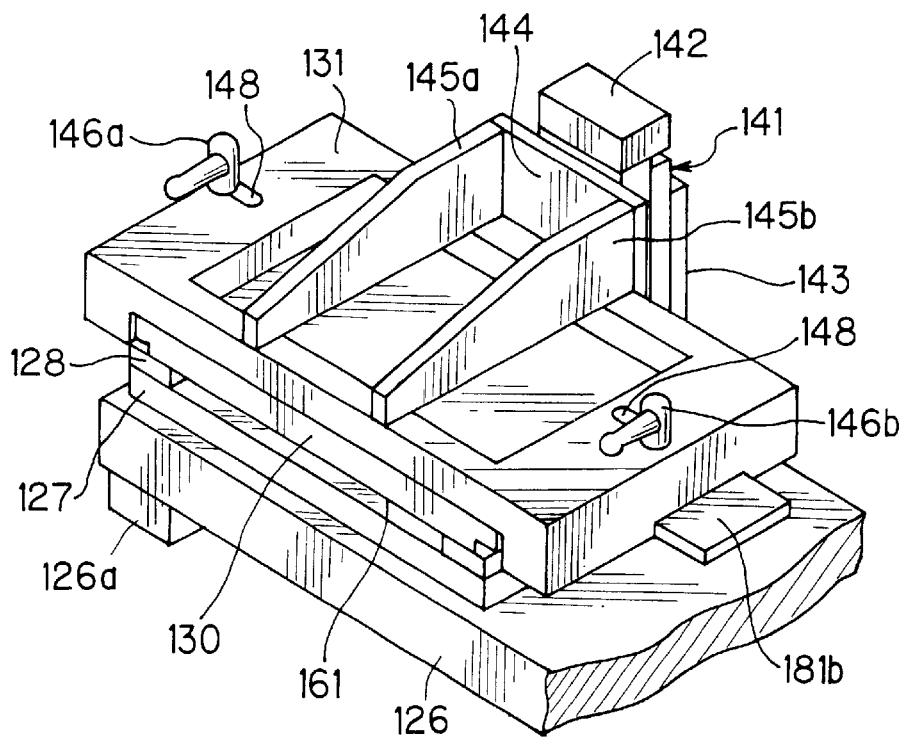
FIG. 41 is a perspective view showing the state in which the pin block holder has been mounted on the base member.

For mounting the pin block 130 on the pin block holder 131, the pin block 130 is arranged on the substrate arraying unit 122 so that the positioning projections 129, 129 are passed through the positioning holes 163a, 163b, as shown in FIG. 40. This arrays the pin block 130 at all times at a required position prescribed relative to the substrate arraying unit 122. After arranging the pin block 130 on the substrate arraying unit 122, the coating unit 125 inclusive of the pin block holder 131 is moved on the pin block 130, as shown in FIG. 41. If now the coating unit 125 is lowered in such a position that its movement is restricted by the stop 155a provided on the rail 154, the pin block 130 is arranged within the pin block locating member 174. At this time, the stationary plates 181a, 181b are in slacked state and loosely fitted in the fitting grooves 176a, 176b, with the opposite ends being protruded towards the lateral sides of the pin block holder 131. In this state, the levers 90a, 90b can be moved along the elongated holes 148, 148.

Figure 42:
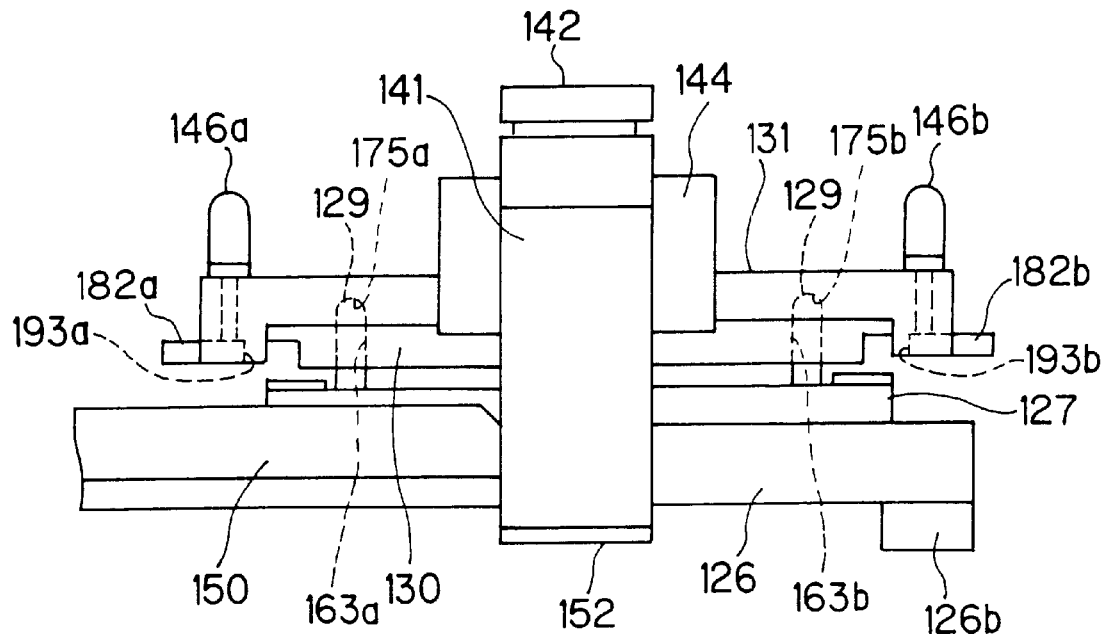
FIGS. 42 and 43 are back-side views showing the state in which the pin block holder has been mounted on the base member.
Figure 43:
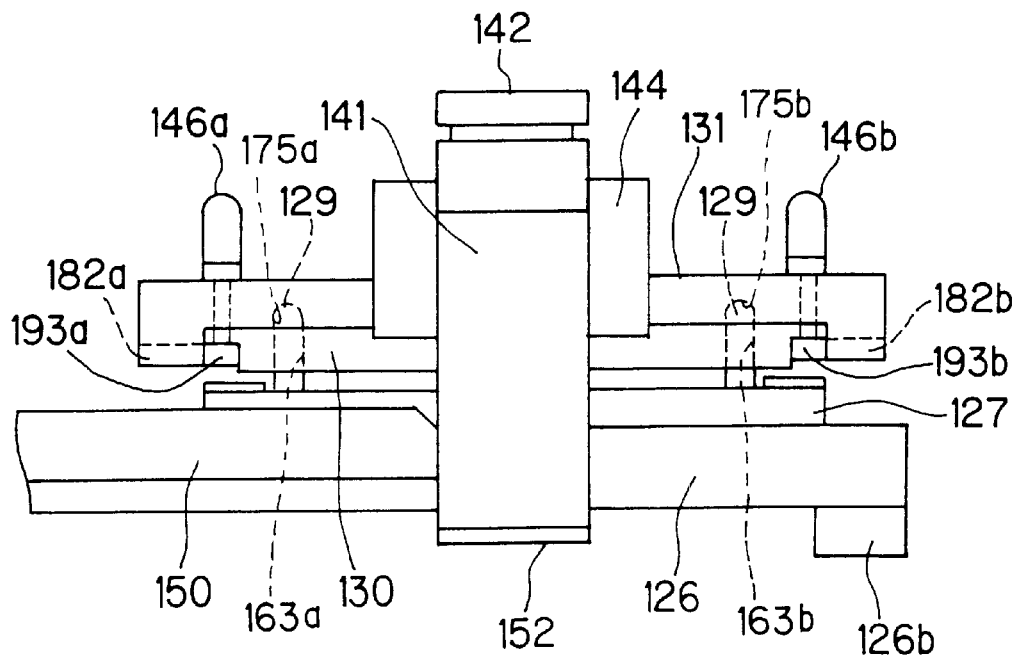

FIGS. 42, 43 show the state in which a pin block 130 arranged in the pin block locating member 174 is secured by the stationary plates 181a, 181b. The positioning projections 129, 129 provided on the circuit substrate arraying block 127 are passed through the positioning holes 163a, 163b of the pin block 130 so that the distal ends thereof are engaged in the fitting holes 175a, 175b of the pin block holder 131 to enable high-precision positioning in mounting the pin block 130.

When the pin block holder 131 is arranged above the pin block 130, the flat plate portions 182a, 182b are loosely fitted in the fitting grooves 176a, 176b, as shown in FIGS. 41 and 42. If the flat plate portions 182a, 182b are moved towards the inside of the pin block holder 131 along the fitting grooves 176a, 176b, as shown in FIG. 43, the flat plate portions 182a, 182b are engaged at retention ends 193a, 193b with flange plate portions 164a, 164b of the pin block 130. If, in this state, the levers 146a, 146b are rotated to tighten the screws, the flat plate portions 182a, 182b are fixed, with the retention ends 193a, 193b engaging with the flange portions 164a, 164b to enable the pin block 130 to be secured at a pre-set position of the pin block locating member 174 provided on the pin block holder 131.

Since the pin block 130 can be easily mounted at pre-set positions by the positioning projections 129, 129, protection plate 150 or stops 155a, 155b of the rail 154, the adhesive can be applied to the printed circuit board 21 solely by the linear movement which is the sliding movement and the up-and down movement of the coating unit 125. Thus, there is no necessity of effectuating positioning for each coating operation to enable a smooth operation of adhesive application.

In the above-described embodiment, the base unit 124 is fixed, whilst the coating unit 125 is movable relative to the base unit 124. Alternatively, the coating unit 125 may be fixed and the base unit 124 may be movable relative to the coating unit 125. In this case, the substrate arraying unit 122 or the adhesive storage vessel 123 is movable relative to the arraying position of the coating unit 125.

Also, in the above-described embodiment, the coating unit 125 is adapted to be moved in the up-and-down direction. Alternatively, the base unit 124 may be moved in the up-and-down direction, with the coating unit 125 remaining stationary.

An electronic part loading device 201 in which electronic parts loaded on a set of loading members for electronic parts 23, inserted into and held by the loading member holder 91 and into which have been loaded plural sorts of the electronic parts to be loaded on a sole printed circuit board 21, are loaded on the printed circuit board 21, is hereinafter explained.

Figure 44:
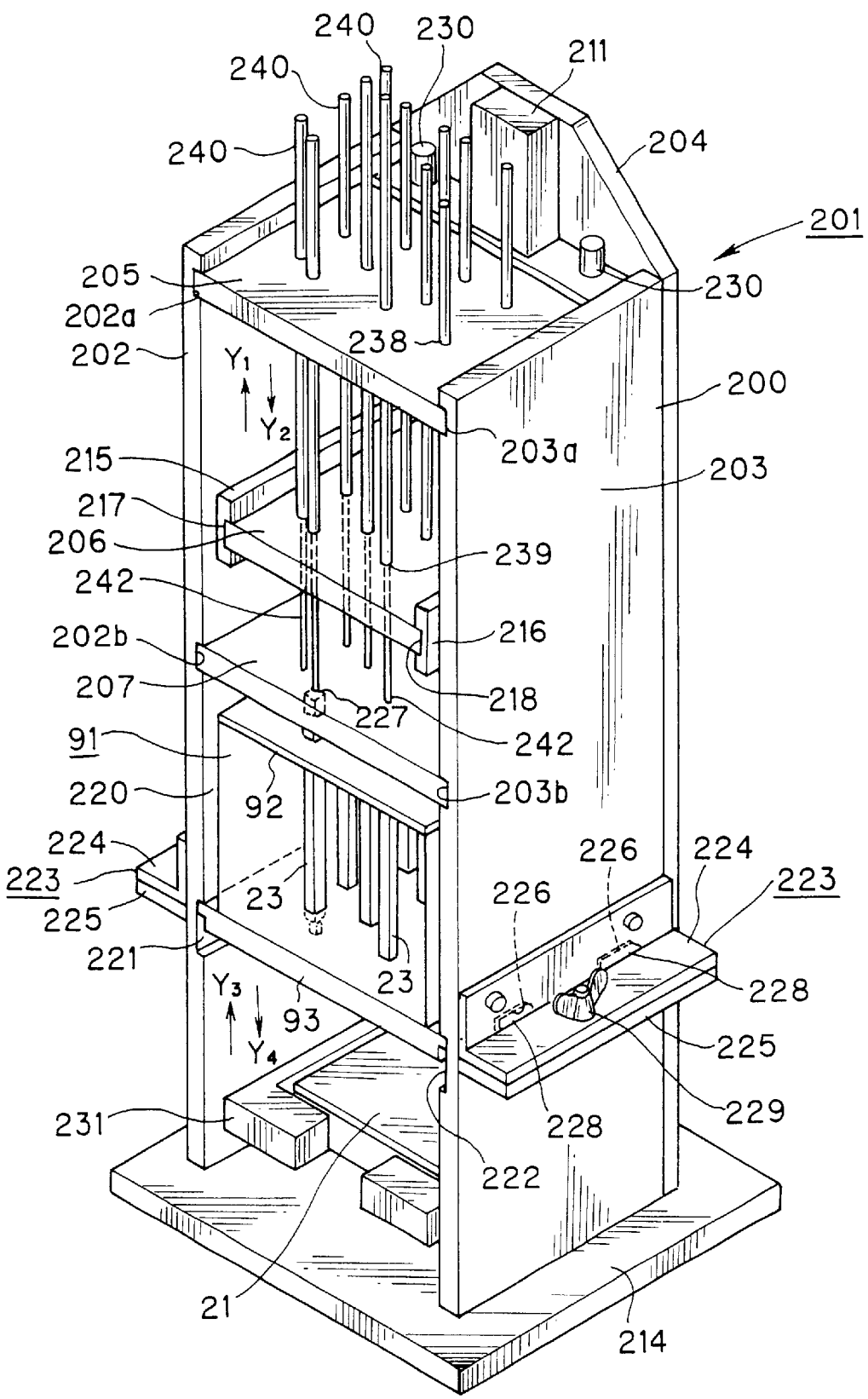
FIG. 44 is a perspective view showing a loading device for electronic parts.
Figure 45:
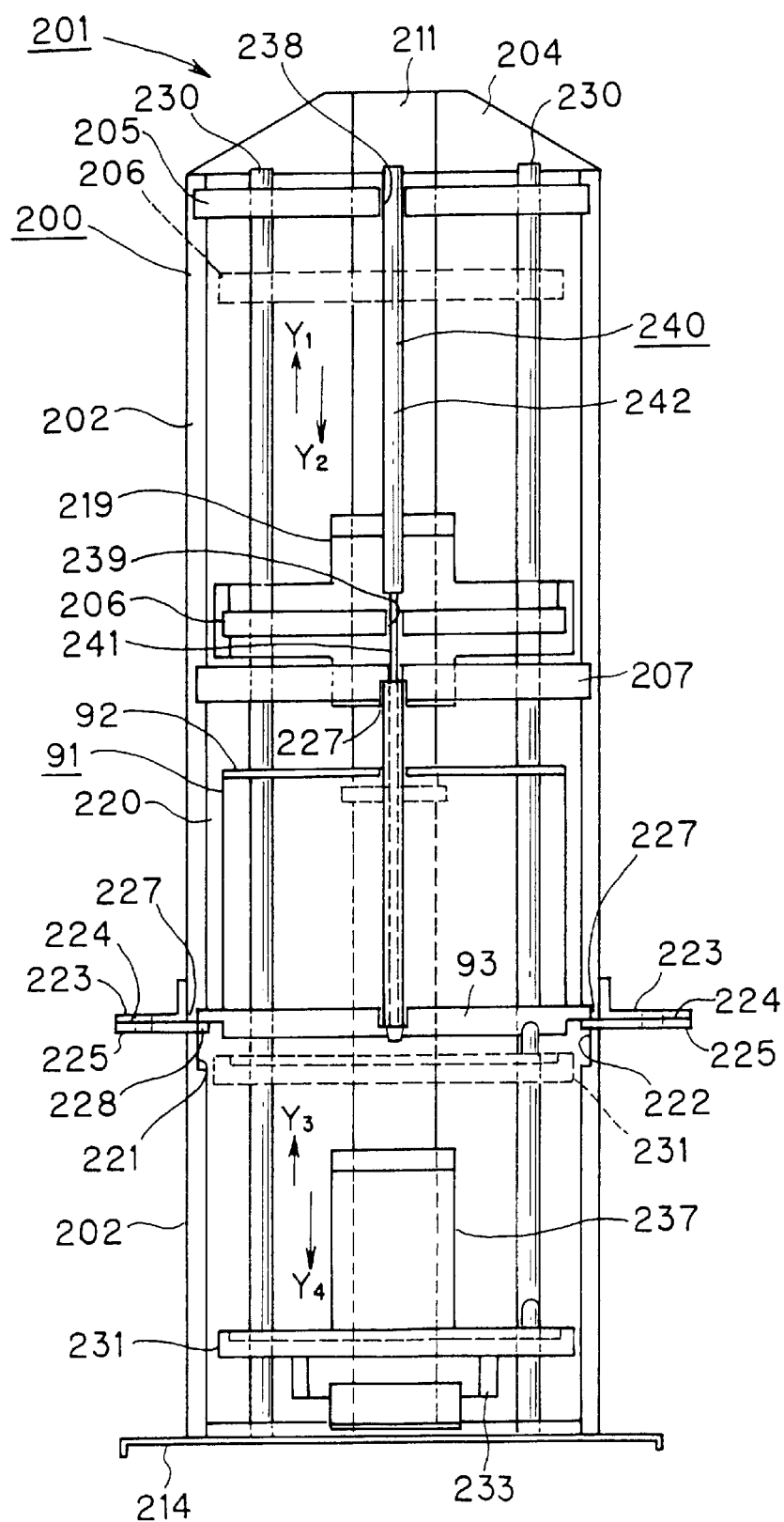
FIG. 45 is a front view showing the loading device for electronic parts.
Figure 46:
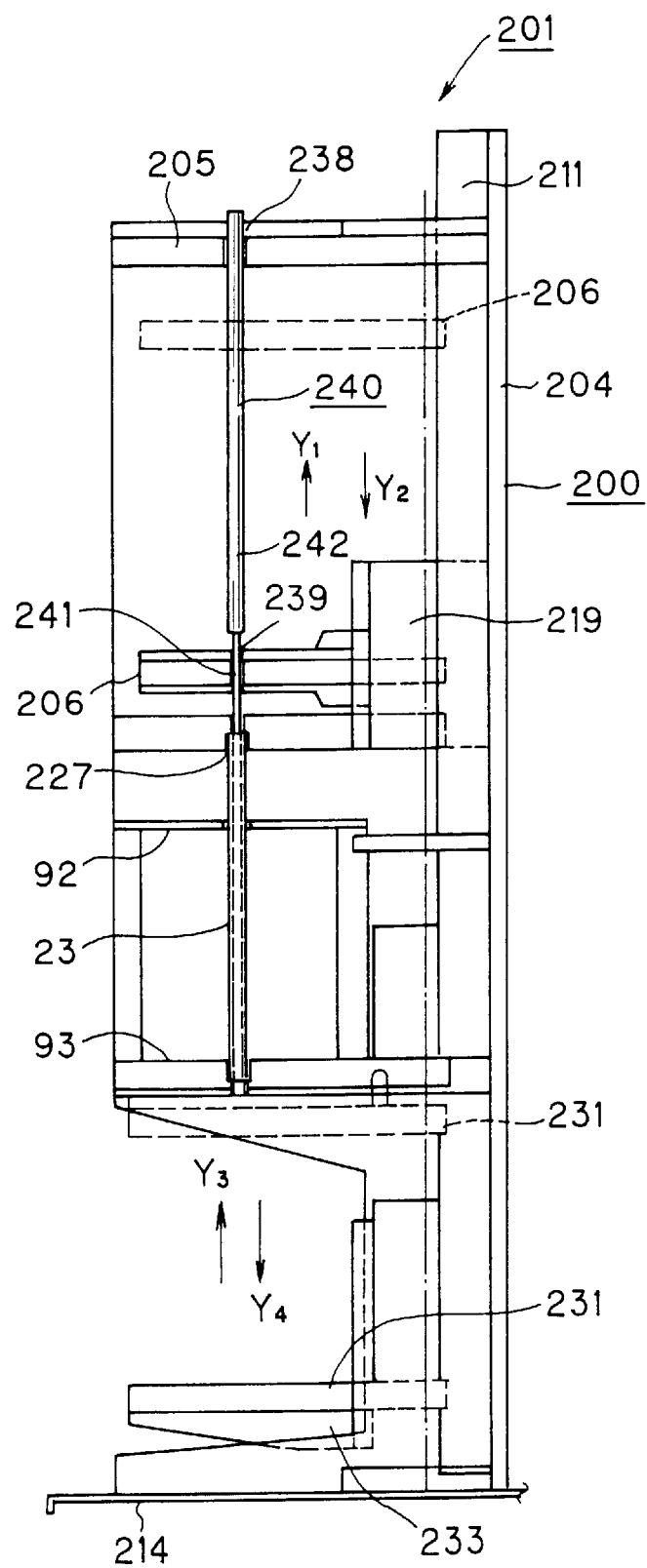
FIG. 46 is a side view showing the loading device for electronic parts.

This electronic part loading device 201 includes a substantially U-shaped main body unit 200 in plan, which is combined from a pair of side plates 202, 203 and a back plate 204, as shown in FIGS. 44 to 46. The back plate 204, constituting the main body unit 200, includes a cylinder unit 211 having enclosed therein a cylinder mechanism for vertically moving a pusher plate 206 as later explained and a substrate mounting plate 231 in the up-and-down direction.

The main body unit 200 carries a top plate 205 a mid plate 207 and a bottom plate 214, as shown in FIGS. 44 to 46. The top plate 205 is mounted on the main body unit 200 by having its both sides engaged in engagement grooves 202a, 203a formed in the inner surfaces of the facing side plates 202, 203. Similarly, the mid plate 207 is mounted on the main body unit 200 by having its both sides engaged in the engagement grooves 202b, 203b of the facing side plates 202, 203. The mounting position of the top plate 205 and the mid plate 207 to the main body unit 200 and the spacing between the top plate 205 and the mid plate 207 along the height of the main body unit 200 are fixedly set depending on the positions of the groves 202a, 203a and the grooves 202b, 203b in the side plates 202, 203. The bottom plate 214 is mounted on the lower end faces of the side plates 202, 203 by set screws, not shown.

The grooves 202a, 203a and 202b, 203b, in which are engaged the top plate 205 and the mid plate 207, are formed in the side plates 202, 203 by opening the front surface of the main body unit 200. The top plate 205 and the mid plate 207 are detachably mounted on the main body unit 200. That is, the top plate 205 and the mid plate 207 are suitably exchanged in meeting with the printed circuit board 21 on which are loaded the electronic parts.

Referring to FIG. 44, the push-up plate 206 is loaded on the main body unit 200 so as to be parallel to the mid plate 207 and the bottom plate 214 by having its both sides engaged in engagement grooves 217, 218 formed in plate holders 215, 216 arranged on the inner surfaces of the side plates 202, 203. The push-up plate 206 is mounted on the plate holders 215, 216 by inserting both sides of the push-up plate 206 into the engagement grooves 217, 218 from the front side of the main body unit 200. The push-up plate 206 is exchangeably mounted on the main body unit 200 by engagement or disengagement relative to the main body unit 200 and is suitably exchanged in meeting with the printed circuit board 21 on which are loaded the electronic parts 22.

The plate holders 215, 216 supporting the push-up plate 206 are mounted on a cylinder plate 219, as shown in FIGS. 45 and 46. The cylinder plate 219 is supported by a cylinder rod, operating as a movable part, not shown, of the cylinder portion 211, and is movable in the up-and-down direction of the main body unit 200 as indicated by arrows Y1 and Y2 in FIGS. 45 and 46 within the range of movement of the cylinder rod under driving by the cylinder portion 211. By the cylinder plate 219 being moved in the direction indicated by arrows Y1 or Y2 in FIGS. 45 and 46 under driving by the cylinder unit 211, the push-up plate 206 is moved between the lowermost position indicated by a solid line and the uppermost position indicated by a broken line in FIGS. 45 and 46.

The main body unit 200 of the electronic part loading device 201 includes a holder housing unit 220 housing the loading member holder 91 holding a set of loading members for electronic parts 23. The holder housing unit 220 is defined by a spacing facing the lower side of the mid plate 207 within the main body unit 200, as shown in FIG. 44. The holder housing unit 220 is formed with engagement grooves 221, 222 engaged by both sides formed with cut-out shoulders 98, 99 of the bottom plate 93 of the loading member holder 91. These engagement grooves 221, 222 are formed horizontally along the width of the side plates 202, 203 constituting the main body unit 200, as shown in FIG. 44. The engagement grooves 221, 222 are broader in width than the thickness of the bottom plate 93 of the loading member holder 91 and are formed in the side plates 202, 203 by opening the front side of the main body unit 200.

The loading member holder 91 is loaded in the main body unit 200, by engaging both sides of the bottom plate 93 in the engagement grooves 221, 222 from the, front side of the main body unit 200 and inserting the loading member holder 91 into the inside of the main body unit 200, as shown in FIG. 44. At this time, the loading member holder 91 is inserted into the inside of the holder housing unit 220 so that both sides of the bottom plate 93 are moved along the lower sides of the engagement grooves 221, 222. In this manner, the loading member holder 91 may be loaded on the main body unit 200 without the upper end of the loading member for electronic parts 23 projected from the upper surface of the top plate 92 abutting against the mid plate 207.

The loading member holder 91, housed in the holder housing unit 220 with the lower surface of the bottom plate 93 supported by the lower surfaces of the engagement grooves 221, 222, is uplifted towards the upper part of the main body unit 200 in the direction indicated by arrow Y1 in FIG. 44 within the extent of the gap produced by the difference between the thickness of the bottom plate 93 and the widths of the engagement grooves 221, 222. If the loading member holder 91 is lifted in the direction indicated by arrow Y1 in FIG. 44, the upper end of the loading member for electronic parts 23 projected from the upper surface of the top plate 92 is engaged in a through-hole 227 formed in the mid plate 207, as shown in FIG. 44. The through-hole 227 is formed in the mid plate 207 in register with the loading member for electronic parts 23 held by the loading member holder 91.

The main body unit 200 is provided with a holder supporting mechanism 223 for supporting the loading member holder 91, uplifted for engaging the upper end of the loading member for electronic parts 23 in the through-hole 227 of the mid plate 207, in the uplifted position. The holder supporting mechanism 223 includes supporting plate 225 slidably supported by an L-shaped mounting plate 224 mounted on the outer lateral surfaces of the side plates 202, 203, as shown in FIGS. 44 and 45. The holder supporting mechanism 223 includes supporting lugs 228 formed at its distal end so as to be protruded into engagement grooves 221, 222 formed in the inner surfaces of the side plates 202, 203 via inserting holes 226, 226 bored in the side plates 202, 203. The supporting plate 225 is formed with an elongated opening into which is inserted a set screw 229 passed through the mounting plate 224. The supporting plate 225 is slid within the extent of the elongated hole in a direction of moving the supporting lugs 228, 228 into and out of the engagement grooves 221, 222. When the loading member holder 91 is moved to the uplifted position, the supporting plate 225 is slid along the mounting plate 224 for protruding the supporting lugs 228, 228 into the engagement grooves 221, 222 in order to support the lower surface of the bottom plate 93 of the loading member holder 91. The supporting plate 225 is secured to the mounting plate 224 by a set screw 229, while the loading member holder 91 is supported by the supporting lugs 228, 228, in order to hold the state of supporting the loading member holder 91 in its uplifted position.

For dismounting the loading member holder 91 from the holder housing unit 220, the set screw 229 is slackened and the supporting plate 225 is moved in a direction of extricating the supporting lugs 228, 228 from the engagement grooves 221, 222, such that the loading member holder 91 ceases to be supported by the supporting plate 225 to permit the loading member holder 91 to be moved in the up-and-down direction within the extent of the widths of the engagement grooves 221, 222. The loading member holder 91 then is moved downwards in the direction indicated by arrow Y2 in FIG. 44 to disengage the loading member for electronic parts 23 from the through-hole 227 of the mid plate 207 to pull out the loading member holder 91 towards the front side of the main body unit 200.

Figure 47A:
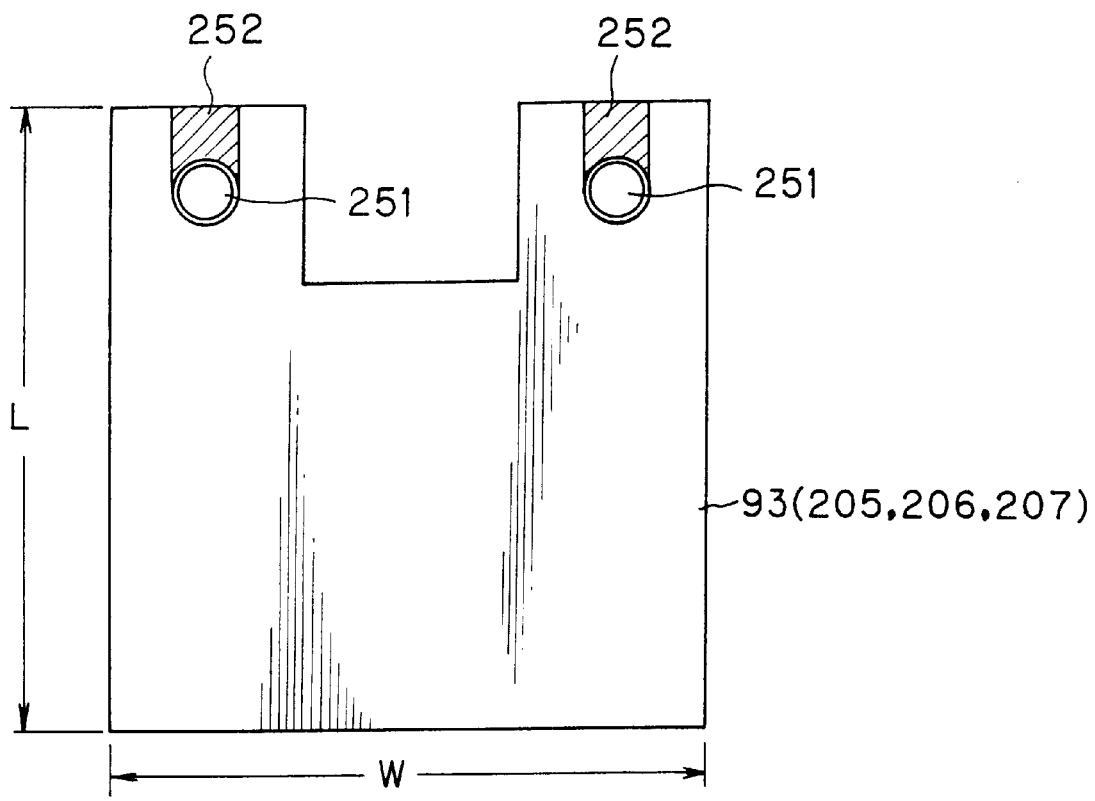
FIG. 47A is a plan view showing each plate arranged in the loading device for electronic parts and FIG. 47B is a front view thereof
Figure 47B:

The top plate 205, push-up plate 206 and the mid plate 207 constituting the electronic part loading device 201 and the bottom plate 93 constituting the bottom surface of the loading member holder 91, can be optionally changed in length L, width W or in thickness T, as shown in FIGS. 47A and 47B. The through-holes are formed in a number and positions corresponding to the number and the positions of the electronic parts 22 mounted on the printed circuit board 21. The above plates may optionally be formed of metal or synthetic resin.

Meanwhile, the top plate 205, push-up plate 206 and the mid plate 207 and the bottom plate 93 of the loading member holder 91 are formed with a pair of common through-holes 251, 251 for a positioning rod 230 provided on the electronic part loading device 201, as shown in FIG. 47A. In particular, in view of facilitated attachment/removal of the loading member holder 91, the bottom plate 93 is formed with cut-outs 252, 252, so that the through-holes 251, 251 are U-shaped to open an end on its back side.

The electronic part loading device 201 includes, on the lower side of the loading member holder 91 housed in the holder housing unit 220, the substrate mounting plate 231 for holding in position the printed circuit board 21 for mounting the electronic parts 22, as shown in FIGS. 44 to 46. The substrate mounting plate 231 is supported as being set on a plate holder 233 mounted on a cylinder plate 237, as shown in FIGS. 45 and 46, and is moved from the lowermost solid-line position as far as the uppermost broken-line position shown in FIGS. 45 and 46 in the up-and-down direction as indicated by arrows Y3 and Y4 in FIGS. 44 and 45.

Figures 48A, 48B, 49:
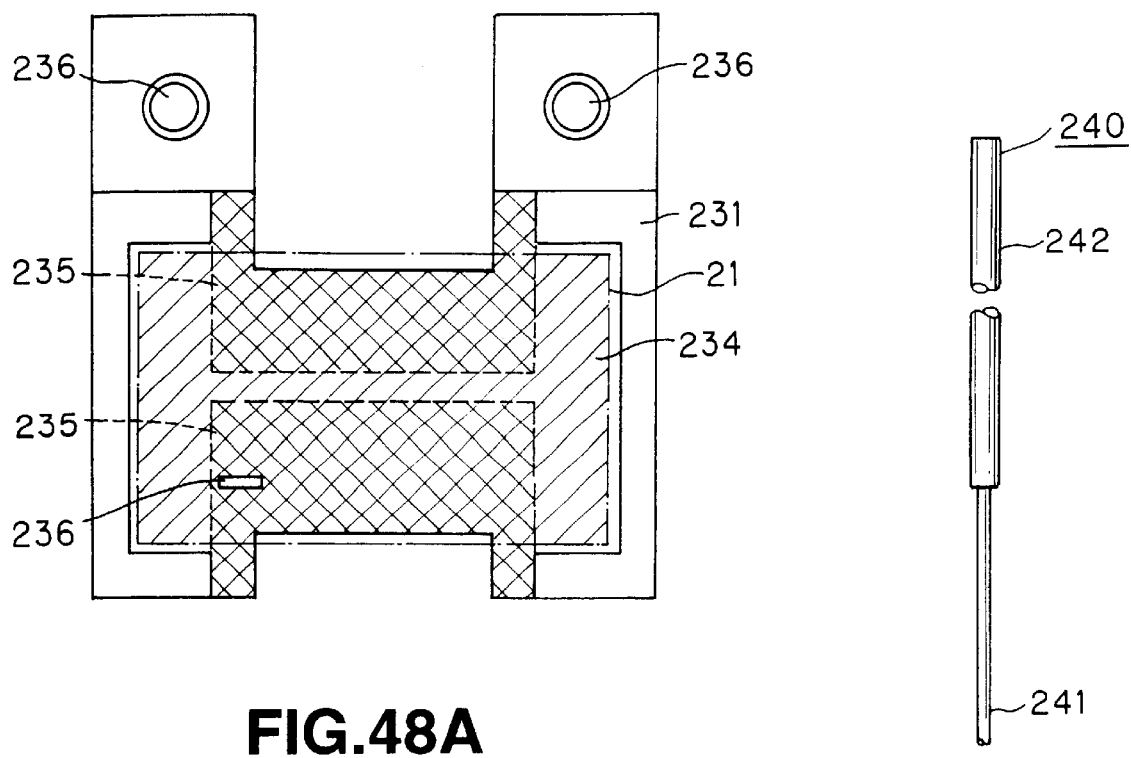
FIG. 48A is a plan view showing a base plate setting plate and FIG. 48B is a front view thereof.
FIG. 49 is a perspective view showing an extruder rod as an extruding member used in the loading device for electronic parts.

The substrate mounting plate 231 includes a recess 234 conforming in profile to the printed circuit board 21 mounted on its upper surface, as shown in FIGS. 48A and 48B. In this recess 234 is housed the printed circuit board 21. The mid portion of the substrate mounting plate 231 has its forward and rear portions cut and is formed with a recess 235 of a larger depth than the recess 234 to facilitate mounting and dismounting of the printed circuit board 21. The portion of the substrate mounting plate 231 in which to set the printed circuit board 21 are formed with plural positioning lugs 236. In the printed circuit board 21 are formed positioning holes, not shown, so as to be engaged by the positioning lugs 236, in order to permit the printed circuit board 21 to be mounted in position. In particular, the positioning lugs 236 are formed asymmetrically to prevent the printed circuit board 21 from being inadvertently mounted in the reverse direction on the substrate mounting plate 231.

The top plate 205, push-up plate 206 and the mid plate. 207 are formed with through-holes 238, 239, 227, respectively. In these through-holes 238, 239, 227 are inserted pre-set portions of an extruder rod 240 adapted for extruding the electronic parts loaded on the loading member for electronic parts 23 towards the printed circuit board 21. The relation between these plates and the extruder rod is hereinafter explained.

The extruder rod 240, inserted into the top plate 205, push-up plate 206 and the mid plate 207, is adapted for ejecting the electronic parts 22 loaded in the loading member for electronic parts 23 via lower opening end of the loading member for electronic parts 23, by their gravity, as will be explained subsequently. The extruder rod 240 is made up of a shaft portion 241 and a weighed portion 242 attached to one end of the shaft portion 241, as shown in FIG. 49.

The extruder rod 240 is formed of metal having specific gravity which gives a required weight for a given size.

The length of the weighed portion 242 of the extruder rod 240, which may be changed depending on the weight required of the extruder rod 240, is selected such that, when the shaft portion 241 of the extruder rod 240 is inserted into the loading member for electronic parts 23 depleted of the electronic parts 22 and when the push-up plate 206 is at its lowermost position, with the extruder rod 240 being then in the lowermost operating state, the weighed portion 242 is inserted into the through-hole 238 of the top plate 205. On the other hand, the shaft portion 241 needs to be of a length such that, when the push-up plate 206 is at its uppermost position, with the extruder rod 240 being then in its uppermost position, the shaft portion 241 remains intruded into the through-hole 227 of the mid plate 207.

The through-hole 238 of the top plate 205 is formed so as to permit insertion of the weighed portion 242 of the extruder rod 240, so that the diameter of the through-hole 238 is desirably set to a value having a certain allowance with respect to the diameter of the weighed portion 242 of the extruder rod 240 so that the weighed portion 242 can be passed smoothly in the up-and-down direction without meeting any noteworthy resistance.

The through-hole 239 of the push-up plate 206 is selected to permit the shaft portion 241 of the extruder 240 to be passed smoothly therethrough without permitting its weighted portion 242 to be inserted therethrough.

On the other hand, the upper half portion of the through-hole 227 formed in the mid plate 207 is equivalent in diameter to the through-hole 239 of the push-up plate 206 through which the shaft portion 241 of the extruder rod 240 can be passed smoothly, while the lower half portion thereof is contoured so as to be engaged with the upper end of the loading member for electronic parts 23.

The manner in which the extruder rod 240 is mounted on the electronic part loading device 201 is now explained.

With the loading member holder 91 mounted on the electronic part loading device 201, the shaft portion 241 of the extruder rod 240 is inserted into the through-hole 238 from the upper surface side of the top plate 205, in an orientation such that the distal end of the shaft portion 241 of the extruder rod 240 is directed downwards. The extruder rod 240 is further inserted so that the distal end of the shaft portion 241 is inserted via the through-hole 239 formed in the top plate 206 into the through-hole 227 formed in the mid plate 207, until the distal end of the shaft portion 241 is inserted into the loading through-hole 24 of the loading member for electronic parts 23 positioned on the lower surface side of the mid plate 207, as shown in FIGS. 44 to 46.

If, with the extruder rod 240 inserted into the electronic part loading device 201, the cylinder is driven for moving the push-up plate 206 from the lowermost solid-line position shown in FIGS. 45 and 46 towards the upper position as shown by arrow Y1 in FIGS. 45 and 46, the lower end of the large-diameter weighted portion 242 is engaged with the upper surface of the through-hole 239 of the push-up plate 206, so that the extruder rod 240 is moved upwards along with the push-up plate 206. If the push-up plate 206 is moved from the uppermost broken-line position in FIGS. 45 and 46 towards the lower side as indicated by arrow Y2 in FIGS. 45 and 46, the extruder rod 240 is lowered as it is supported by the through-hole 239 in the push-up plate 206.

The operation of loading the electronic parts 22 on the printed circuit board 21 by the above-described electronic part loading device 201 is now explained in the sequence of the operational steps.

Prior to loading the electronic parts 22, the top plate 205, push-up plate 206 and the mid plate 207, formed with through-holes depending on the sort of the printed circuit board 21, are readied, and are mounted on the main body unit 200 of the electronic part loading device 201, as shown in FIGS. 44 to 46. Using the electronic part loading device 201, the substrate mounting plate 231, formed to suit to the size and shape of the printed circuit board 21 on which to mount the electronic parts 22, is mounted by the pre-set mounting method.

The positioning rod 230 is inserted in the common through-holes 251 formed in these plates for mounting the top plate 205, push-up plate 206, mid plate 207 and the substrate mounting plate 231 in position on the main body unit 200.

The loading member holder 91, in which is inserted and held a set of the loading members for electronic parts 23, each carrying a set of electronic parts to be loaded on the printed circuit board 21, is loaded on the holder housing unit 220 provided on the main body unit 200, as shown in FIGS. 44 and 45.

With the top plate 205, push-up plate 206, mid plate 207, substrate mounting plate 231 and the loading member holder 91 mounted in position on the main body unit 200 of the electronic part loading device 201, the operator inserts the extruder rod 240 through the through-hole 238 of the top plate, through-hole 239 of the push-up plate 206 and through the through-hole 227 of the mid plate 207, respectively. During this operation, the push-up plate 206 is kept at substantially the uppermost position.

The above-described operations are preparatory operations, and the sequence of operations now explained represents the operations of loading the electronic parts on the printed circuit board 21.

First, with the substrate mounting plate 231 lowered to substantially the lowermost position of the main body unit 200 shown by a solid-line in FIGS. 45 and 46, an operator sets a sole printed circuit board 21 in position on the substrate mounting plate 231. After confining that the printed circuit board 21 has been set in a proper state on the substrate mounting plate 231, the operator drives the cylinder mechanism to shift the substrate mounting plate 231 in the direction indicated by arrow Y3 in FIGS. 45 and 46 to uplift the substrate mounting plate 231 up to the uppermost broken-line position in FIGS. 45 and 46.

It suffices if the above-described uplifting/lowering of the substrate mounting plate 231 is effectuated by actuation by the operator of the switches, buttons or keys by the operator if the cylinder mechanism is adapted to be driven by, for example, a driving motor, in which case the operational efficiency can be improved further. The substrate mounting plate 231 can also be uplifted/lowered by a manual operation of the operator. In this case, the cylinder driving mechanism can be omitted to promote further cost reduction. This applies for the uplifting mechanism for the push-up plate 206 which will be explained subsequently.

Figure 50:
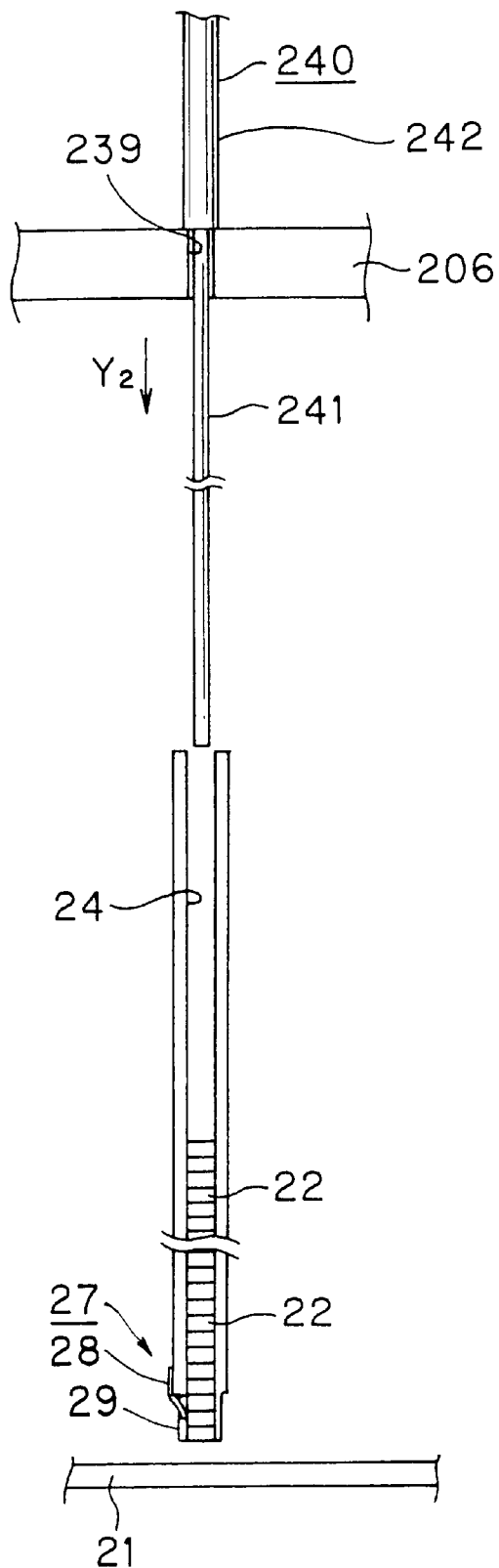
FIG. 50 is a cross-sectional view showing the state of extruding the electronic parts loaded on the loading member for electronic parts by the extruder rod.

For loading the electronic parts 22 on the printed circuit board 21, the operator lowers the push-up plate 206 from the uppermost position as shown in FIG. 50 to a lower position in the direction indicated by arrow Y2 in FIG. 50.

Meanwhile, in the state shown in FIG. 50, the push-up plate 206 has been moved to the uppermost position of the main body unit 200, with the extruder rod 240 being in such a state in which the weighed portion 242 of a larger diameter than the shaft portion 241 has its lower end retained by the through-hole 239 of the push-up plate 206 against incidental descent. The shaft portion 241 of the extruder rod 240 has its length set so that, if the loading through-hole 24 of the loading member for electronic parts 23 has been charged with the electronic parts to its full capacity, the distal end of the shaft portion 241 is not abutted against the electronic parts 22 at the uppermost position of the loading through-hole 24.

The printed circuit board 21 is positioned so that the printed circuit board 21 faces the lower opening end of the loading member for electronic parts 23 at a pre-set separation therefrom when the substrate mounting plate 231 is at the uppermost position.

The state of FIG. 50 is the stand-by state in readiness for loading the electronic parts 22 from the loading member for electronic parts 23 onto the printed circuit board 21. For loading the electronic parts 22 from the standby state shown in FIG. 50 on the printed circuit board 21, the operator performs the operation of lowering the push-up plate 206. When the push-up plate 206 is lowered towards the descent position in the direction indicated by arrow Y2 in FIG. 50, the extruder rod 240 supported by the push-up plate 206 is lowered along with the push-up plate 206 in the direction indicated by arrow Y2 in FIG. 50, so that the shaft portion 241 is inserted into the loading through-hole 24 of the loading member for electronic parts 23.

When the push-up plate 206 is further lowered in the direction indicated by arrow Y2 in FIG. 50, the distal end of the shaft portion 241 of the extruder rod 240 is supported by the uppermost one of the electronic parts 22 loaded in the loading member for electronic parts 23 to cancel the state of supporting of the extruder rod 240 by the push-up plate 206.

When the supporting state for the extruder rod 240 is cancelled, the extruder rod 240 operates, by its own gravity, for extruding the electronic parts 22 stacked in the loading through-hole 24.

Since the electronic parts 22 loaded in the loading member for electronic parts 23 are thrust and supported by the detachment preventative piece 28 of the mechanism for prohibiting incidental descent of electronic parts 27, as shown in FIG. 4, the electronic parts are prohibited against incidental descent from the loading through-hole 24. If the total weight of the extruder rod 240 is applied on the electronic parts loaded in the loading member for electronic parts 23, the detachment preventative piece 28 subjected to the gravity of the extruder rod 240 is elastically displaced to cancel the force of supporting the electronic parts 22. Thus, a sole electronic part 22 is ejected via the lower opening end of the loading through-hole 24 and set on the electronic part mounting portion 104 on the printed circuit board 21. At this time, the electronic part 22 is thrust against the printed circuit board 21 under the gravity of the extruder rod 240.

Since the electronic part mounting portion 104 of the printed circuit board 21 has been coated with the adhesive by the above-described adhesive applying device 121, the electronic part 22 ejected from the loading member for electronic parts 23 is bonded to the electronic part mounting portion 104 via the adhesive.

Figure 51:
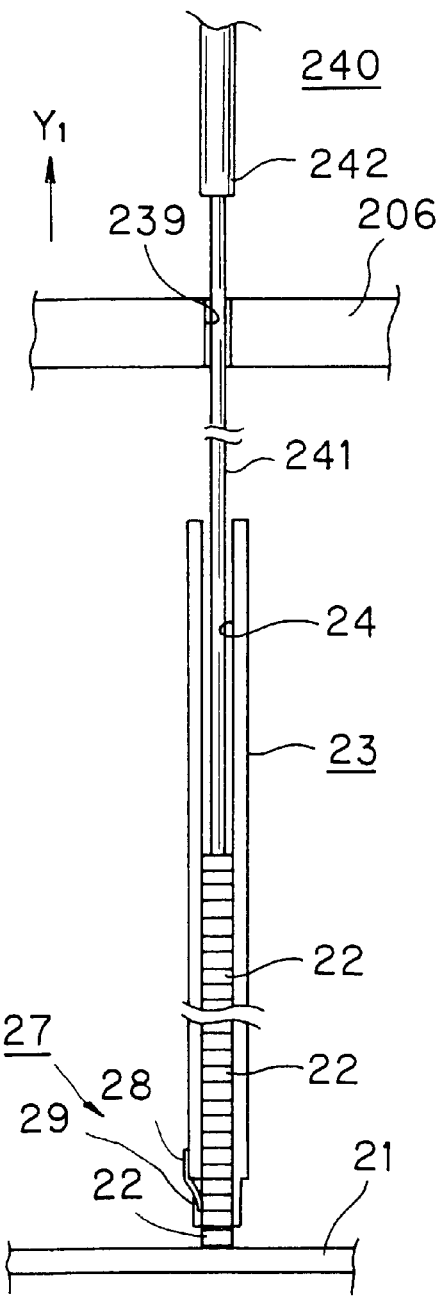
FIG. 51 is a cross-sectional view showing the state in which electronic parts loaded on the loading member for electronic parts by the extruder rod for setting the electronic parts on the printed circuit board.

When the push-up plate 206 has been lowered to its lowermost position, as shown in FIG. 51, the electronic parts 22 loaded in the totality of the loading members for electronic parts 23 inserted into and held by the loading member holder 91 are thrust by the extruder rod 240 and loaded one-by-one on the printed circuit board 21. That is, a set of the electronic parts 22 to be mounted on sole printed circuit board 21 can be loaded simultaneously by a sole uplifting/lowering operation of the push-up plate 206.

For optimally loading a set of electronic parts 22 to be loaded on the printed circuit board 21 one-by-one from the set of loading members for electronic parts 23, such a weight is set as the weight of the extruder rod 240 which is sufficient to extrude the electronic part 22 against the resilient force of the detachment preventative piece 28 of the mechanism for prohibiting incidental descent of electronic parts 27 provided on the loading member for electronic parts 23 and against the weight of the electronic parts 22 stacked in the loading through-hole 24. This weight can be adjusted by changing the length of the weighted portion 242 or, alternatively, by changing its diameter.

After the push-up plate 206 has descended to its lowermost position shown in FIG. 51 and the mounting of the set of electronic parts 22 to be mounted on the printed circuit board 21 has come to a close, the push-up plate 206 is again moved in the direction indicated by arrow Y2 in FIG. 51 and elevated to its uppermost position shown in FIG. 50 to support the extruder rod 240 at a position spaced apart from the loading member for electronic parts 23 to prevent the weight from being applied to the set of electronic parts 22 loaded in the loading through-hole 24 of the loading member for electronic parts 23.

The operator then lowers the substrate mounting plate 231 to substantially its lowermost position, dismounts the printed circuit board 21 carrying the set of electronic parts 22 and arrays on the substrate mounting plate 231 the same sort of the printed circuit board 21 as that on which to mount the electronic parts 22 newly.

Since the lowermost one of the electronic parts 22 loaded in the loading through-hole 24 of the loading member for electronic parts 23 is thrust at this time by the detachment preventative piece 28 of the mechanism for prohibiting incidental descent of electronic parts 27, the electronic parts 22 loaded in the loading through-hole 24 can be prohibited from incidental detachment from the loading through-hole 24 to prevent descent of the electronic parts 22 even if the printed circuit board 21 has been moved in a direction away from the lower opening end of the loading member for electronic parts 23.

If once the printed circuit board 21 is arranged on the substrate mounting plate 231 as described above, the above-described sequence of operations is repeated so that the set of the electronic parts 22 are sequentially mounted on this printed circuit board 21 for the given same set of the electronic parts 22.

It should be noted that, as the operation of loading the electronic parts 22 on the printed circuit board 21 is performed repeatedly, there is produced disparity in the height of the electronic parts 22 stacked in the loading through-hole 24 of the loading members for electronic parts 23. However, since the electronic parts 22 are extruded for each loading member for electronic parts 23 by the extruder rod 240 associated with each loading member for electronic parts 23, the electronic parts 22 can be extruded under uniform the constant gravity regardless of the disparity in the stacking width of the electronic parts 22 to absorb the disparity of the stacking width to enable the electronic parts 22 to be optimally loaded on the printed circuit board 21 at all times.

If the electronic parts are loaded on a large number of the printed circuit boards 21 of the same sort by the above-described electronic part loading device 201, it is desirable to provide a plurality of the loading member holders 91 of the same structure associated with the type of the printed circuit board 21. If, in the course of the repeated loading operations on the printed circuit board 21, the residual electronic parts 22 in the loading member for electronic parts 23 loaded on the electronic part loading device 201 are nearly depleted, the loading member holder 91 holding the loading members for electronic parts 23 carrying a sufficient number of electronic parts 22 is substituted for the loading member holder 91 being used after which the loading operation is re-initiated.

The above-described electronic part loading device 201 can cope with a large number of different types of the printed circuit boards instead of only with printed circuit board 21 of the same sort. It suffices if the top plate 205, push-up plate 206, mid plate 207 and the substrate mounting plate 231 formed with through-holes in register with the mounting positions of the electronic parts mounted on the printed circuit boards of different types are readied and mounted in the main body unit 200 of the electronic part loading device 201 by the above-described sequence of operations in an exchanging manner, and if the loading member holder 91 constructed for use for the printed circuit boards of different types is also used.

If an extremely large number of electronic parts need to be loaded on the printed circuit boards of the same sort, plural sorts of the top plate 205, push-up plate 206, mid plate 207, substrate mounting plate 231 and the loading member holders 91 having different loading positions for the electronic parts are readied for the sole sort of the printed circuit board, and the types of the top plate 205, push-up plate 206, mid plate 207, substrate mounting plate 231 and the loading member holders 91 are changed from one group of a fairly large number of printed circuit boards to another for performing the loading operations.

The above-described electronic part loading device 201 is not limited to the above-described embodiment, and may be modified depending on the actual using states. For example, the various parts of the electronic part loading device 201 may be varied in shape appropriately, while the number of the plates supporting the extruder rods 240 or the loading members for electronic parts 23 can also be varied appropriately while controlling the positions thereof In addition, the mounting mechanism of the respective plates on the main body unit 200 of the electronic part loading device 201 or the loading/unloading mechanism for the loading member holder 91 may also be varied appropriately.

When the electronic parts 22 loaded on a set of loading members for electronic parts 23 inserted in and held by the loading member holder 91 are to be mounted on the printed circuit board 21, an electronic part loading device 301 as now explained can be used in place of the above-described electronic part loading device 201.

Figure 52:
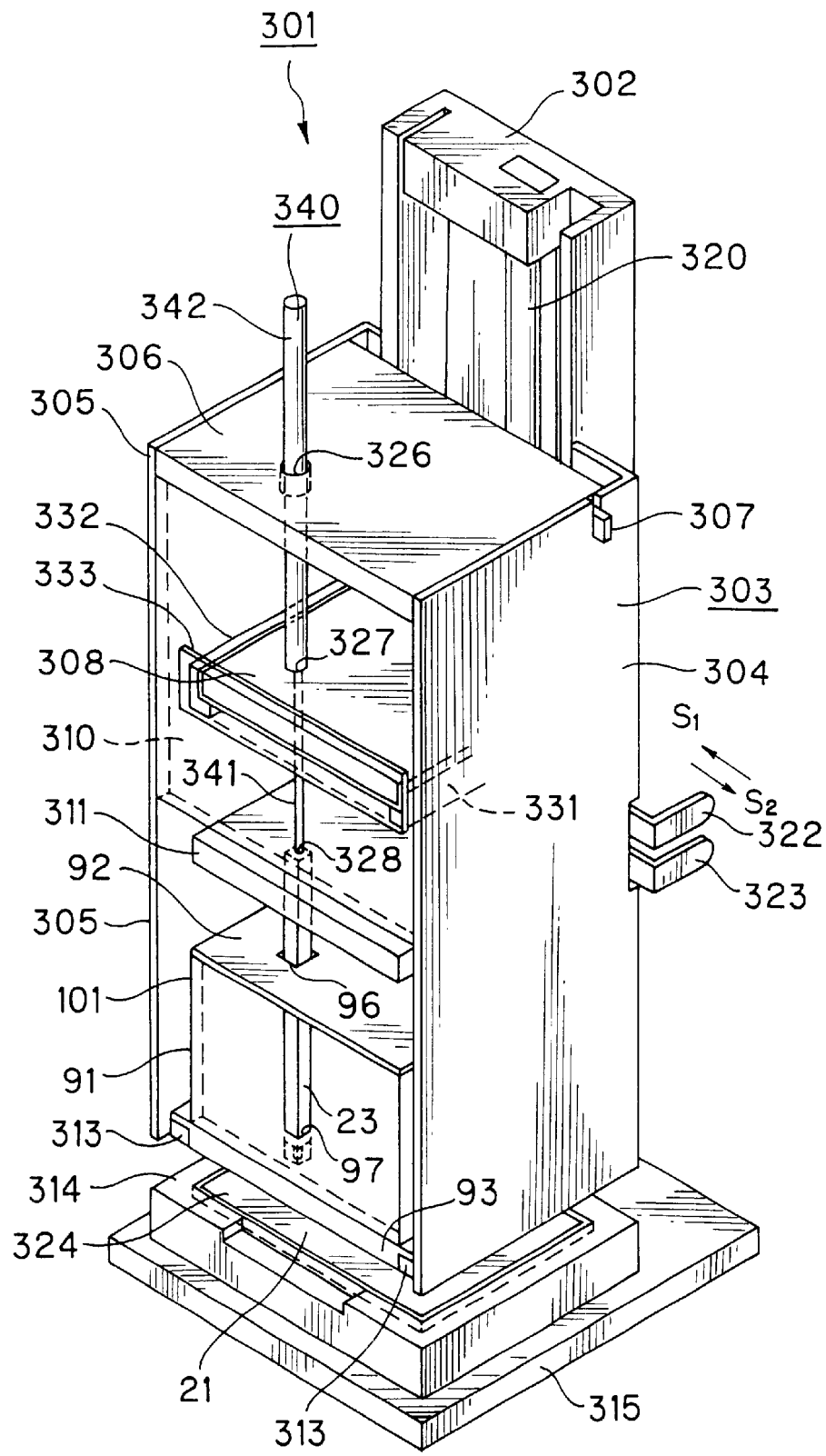
FIG. 52 is a perspective view showing another embodiment of the loading device for electronic parts.
Figure 53:
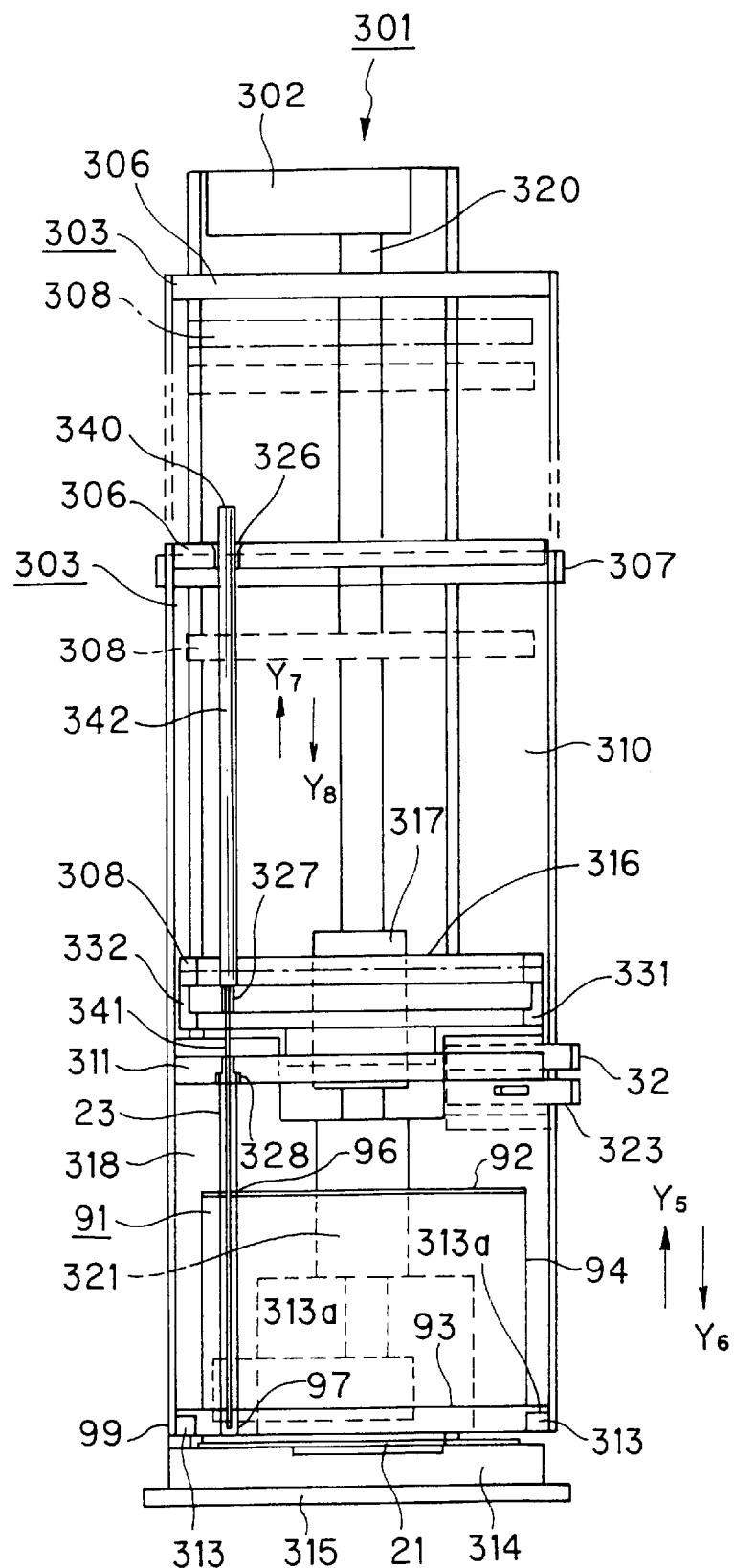
FIG. 53 is a front view showing the embodiment of the loading device for electronic parts.
Figure 54:
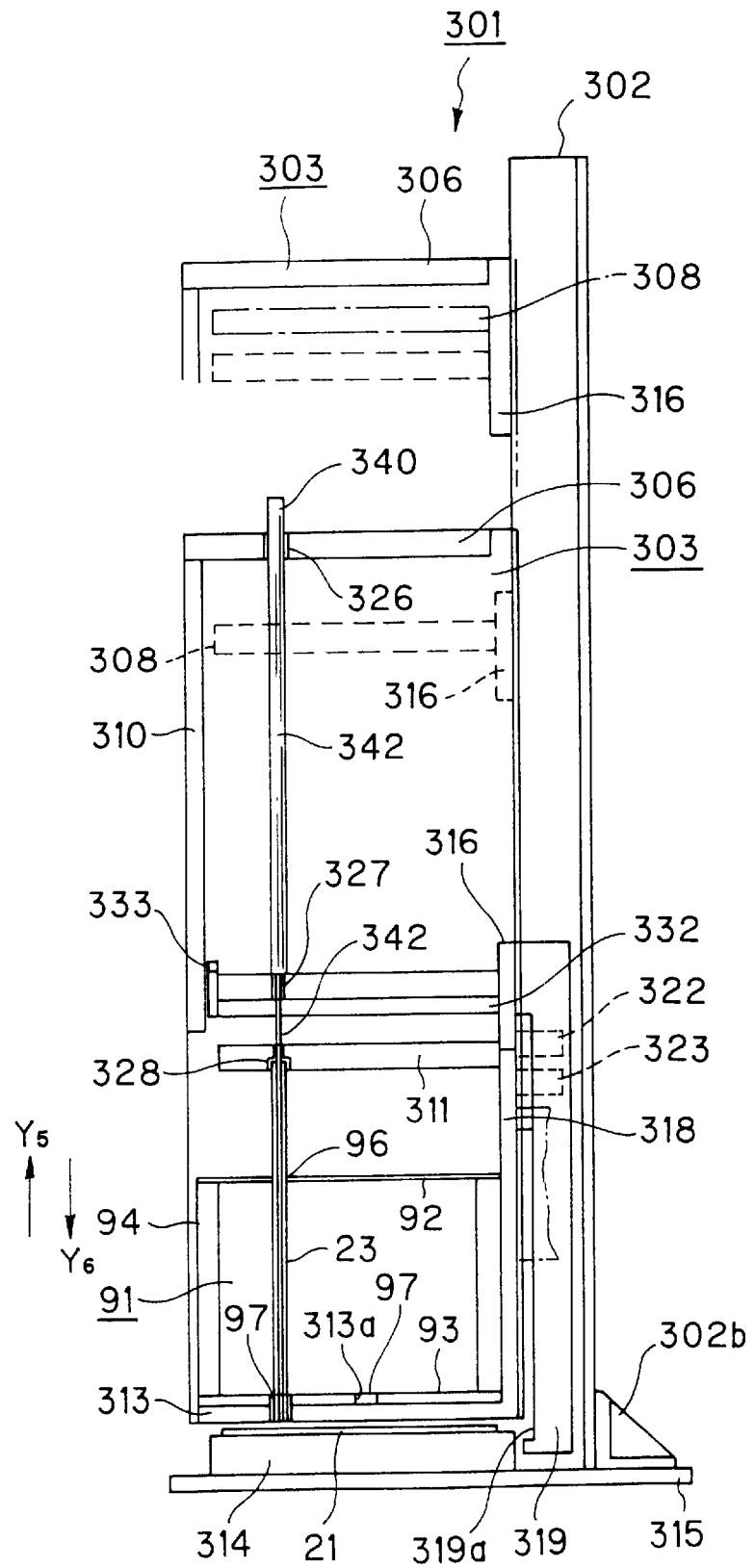
FIG. 54 is a side view showing the embodiment of the loading device for electronic parts.

The electronic part loading device 301 includes a bottom plate 315 on which is set upright a supporting column 302, as shown in FIGS. 52 to 54. The supporting column 302 is mounted on the bottom plate 315 by having its lower back side portion supported by a reinforcement block 302b, as shown in FIG. 54. Although not shown in detail, a cylinder mechanism driven by pneumatic or hydraulic means is provided on the inner wall surface of the supporting column 302. The cylinder mechanism shifts the push-up plate 308 in the up-and-down direction, as will be explained subsequently.

This electronic part loading device 301 includes a movable cabinet 303. The movable cabinet 303, having the shape of a rectangular paralellepiped, is made up of a pair of facing side plates 304, 305, a front plate 310 provided above the front side, a holder supporting plate 318 for supporting the loading member holder 91 arranged on the back side and a holder supporting frame 313 arranged on the bottom side, as shown in FIGS. 53 and 54. On the further back side of the holder supporting plate 318 is mounted a rail block 321 for up-and-down movement on a cylindrical rail 320 provided on the supporting column 302. The movable cabinet 303 is moved in the up-and-down direction as indicated by arrows Y5 and Y6 in FIGS. 53 and 54, under the guidance of the cylindrical rail 320, by having the rail block 321 of the holder supporting plate 318 mounted on the cylindrical rail 320.

On the right side in FIG. 52 of the holder supporting frame 313 arranged on the back side of the movable cabinet 303 are inserted two stop members, that is an upper stop member 322 and a lower stop member 323. The upper stop member 322 and lower stop member 323 are retained by a retainer 319a formed at the lower end of a holder supporting piece 319 fixedly mounted relative to a cylindrical plate 316 movable in the up-and-down direction as will be explained subsequently, so that, if the cylindrical plate 316 is above the lowermost position, the upper stop member 322 and a lower stop member 323 support the movable cabinet 303 against the force of gravity. The functions of the upper stop member 322 and the lower stop member 323 will be explained subsequently.

With the above-described structure of the movable cabinet 303, three plates, namely the top plate 306, push-up plate 308 and the mid plate 311, are arranged parallel to one another, as shown in FIGS. 52 to 54. The top plate 306 is supported by the movable cabinet 303 by being positioned by the upper end of the front plate 310 and a top plate supporting plate 307 arranged between the paired side plates 304,305. The top plate 306 is formed with a through-hole 326 sized to permit insertion therethrough of a large-diameter weighted portion 342 of an extruder rod 340 which will be explained subsequently.

In FIGS. 52 to 54, only one each of the extruder rod 340 and the loading member for electronic parts 23 is shown for convenience in illustration. However, the number of these members is selected in keeping with the number of the electronic parts 22 of the set mounted on the printed circuit board 21. Therefore, a large number of the through-holes 326 are formed depending on the actually required number of the electronic parts 22 mounted on the sole printed circuit board 21 and the mounting positions. This applies for the through-holes 327 of the push-up plate 308, through-holes 328 of the mid plate 311 and the through-holes 96, 97 formed in the top plate 92 and the bottom plate 93 of the loading member holder 91.

The push-up plate 308 is moved directly in the up-and-down direction by a cylinder mechanism, not shown. On the back side of the push-up plate 308 is mounted a cylinder block 317 mounted vertically movably relative to the cylindrical rail 320 and which is directly driven for vertical movement by the cylinder mechanism. On the cylinder block 317 are mounted a right plate holder 331 and a left plate holder 332, whilst a front plate holder 333 is mounted on the forward ends of the right plate holder 331 and the left plate holder 332. By arranging the push-up plate 308 in a frame delimited by the plate holders 331,321, 333, the push-up plate 308 is positioned and held as shown in FIGS. 52 to 54. Thus, during the normal plate loading operation, the push-up plate 308 is supported for movement in a range from the lowermost solid-line position up to the uppermost position shown in FIGS. 53 and 54 by movement of the cylinder block 317 in the up-and-down direction indicated by arrows Y7 and Y8 in FIGS. 53 and 54.

The push-up plate 308 is formed with a through-hole 327 sized to control and permit the insertion of the weighted portion 342 and to permit passage of the shaft portion 341 of the extruder rod 340.

The mid plate 311 has plural through-holes 328 at pre-set positions. These through-holes 328 are formed so that first portions through which can be passed the shaft portion 341 of the extruder rod 340 and second portions communicating with the first portions and into which are inserted the upper ends of the loading members for electronic parts 23 as will be explained subsequently. The mid plate 311 is supported on the upper ends of a large number of loading members for electronic parts 23 projected to above the top plate 92 of the loading member holder 91.

On the above-described electronic part loading device 301 is loaded the loading member holder 91 holding a set of the loading members for electronic parts 23 each loaded with electronic parts 22 to be mounted on the sole printed circuit board 21.

For loading the loading member holder 91 on the electronic part loading device 301, the mid plate 311 is first set on the upper ends of the loading members for electronic parts 23 projected above the top plate 92 of the loading member holder 91. The mid plate 311 is formed with plural through-holes 328 corresponding in number and arraying positions to the loading members for electronic parts 23 held on the loading member holder 91. In the optimal setting state of the mid plate 311, the upper ends of the loading members for electronic parts 23 are engaged in the through-holes 328 of the mid plate 311.

The push-up plate 308 is uplifted sufficiently upwards from the position of mounting the electronic parts 22 on the printed circuit board 21 so that the lower ends of the shaft portions 341 of the extruder rods 340 are abutted against the loading members for electronic parts 23 or the loading member holder 91. The loading member holder 91 is inserted into the holder supporting frame 313 with the loading member holder 91 and the mid plate 311 remaining combined together.

Figure 55A:
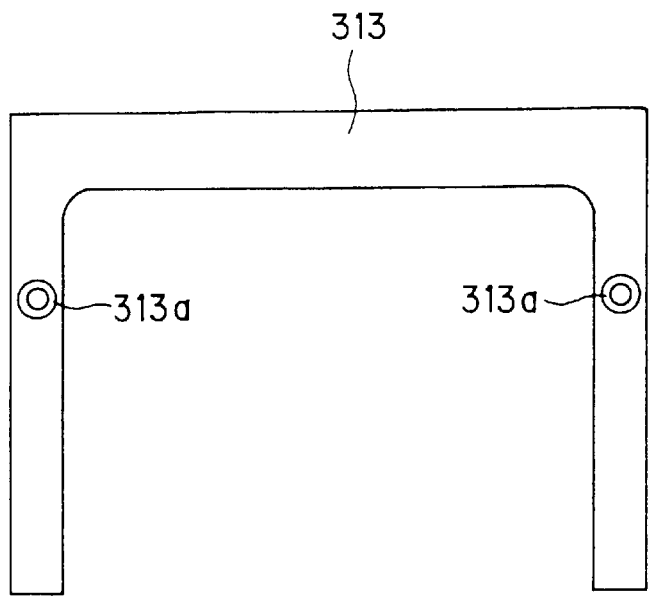
FIG. 55A is a plan view showing a holder supporting frame and FIG. 55B is a front view thereof.
Figure 55B:
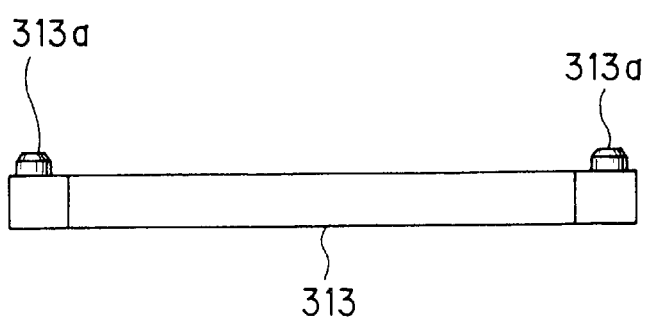

The holder supporting frame 313 is substantially U-shaped and forms the bottom surface of the movable cabinet 303 with the opening end of the U-shape operating as the front surface, as shown in FIGS. 55A and 55B. On both sides of the holder supporting frame 313 are set upright positioning lugs 313a, 313a. The loading member holder 91 is set optimally relative to the holder supporting frame 313 for engaging the positioning lugs 313a, 313a of the holder supporting frame 313 in the positioning holes 99, 99 formed in the bottom plate 93 of the loading member holder 91 in order to hold the loading member holder 91 in position relative to the holder supporting frame 313.

On the lower surface of the electronic part loading device 301 carrying the loading member holder 91 is arranged a substrate supporting frame 314 in which is arranged the printed circuit board 21 on which to mount the electronic parts 22, as shown in FIGS. 52 to 54. This substrate supporting frame 314 is mounted on the bottom plate 315. On the substrate supporting frame 314 is formed a substrate supporting portion 324 which is recessed for setting the printed circuit board 21 therein in position.

Although not shown, a positioning lug may be provided at a pre-set position of the substrate supporting portion 324 and a positioning hole may be formed in the corresponding position of the printed circuit board 21 for being engaged by the positioning lug. This prohibits the printed circuit board 21 from being loaded in an inverted loading position on the substrate supporting portion 324 to render it possible to mount the printed circuit board 21 more accurately in position on the substrate supporting portion 324.

The top plate 306, push-up plate 308 and the mid plate 311 are formed with through-holes 326, 327, 328, respectively, so as to be passed through by pre-set portions of the extruder rod 340. The relation between these plates and the extruder rod is hereinafter explained.

Figure 56:
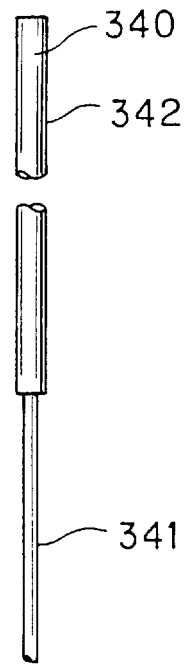
FIG. 56 is a perspective view showing an extruder rod used in the loading device for electronic parts showing in FIG. 52

The extruder rod 340 traversing the above plates is used for ejecting the electronic parts loaded in the loading member for electronic parts 23 via the lower opening end of the loading member for electronic parts 23 under its own gravity and the force of inertia brought about by the descent caused by the push-up plate. The extruder rod 340 is made up of an elongated columnar-shaped weighted portion 342 and a columnar-shaped shaft portion 341 finer in diameter than the weighted portion 342, as shown in FIG. 56. The shaft portion 341 and the weighted portion 342 are each of a pre-set length and co-axial relative to each other. The extruder rod 340 is formed of metal of a specific gravity such that a pre-set weight can be realized for an actual size.

The length of the weighted portion 342 of the extruder rod 340 is varied depending on the weight required of the extruder rod 340. For example, the weighted portion 342 needs to be of a length such that, when the shaft portion 341 of the extruder rod 340 is inserted into the loading member for electronic parts 23 depleted of the electronic parts 22, with the push-up plate 308 being at the lowermost position, that is when the extruder rod 340 is at its lowermost position, the weighted portion 342 can remain inserted in the through-hole 326 of the top plate 306. On the other hand, the length of the shaft portion 341 is set so that, when the push-up plate 308 is at its uppermost position, with the extruder rod 340 remaining at the uppermost position, the shaft portion 341 remains inserted in the upper profile portion in the through-hole 328 of the mid plate 311.

The manner in which the extruder rod 340 is loaded on the electronic part loading device 301 is as follows:

With the loading member holder 91 loaded on the electronic part loading device 301, the extruder rod 340 is inserted into the through-hole 326 from the top side of the top plate 306 in such direction that the distal end of the shaft portion 341 is directed downwards. The extruder rod 340 is inserted so that the distal end of the shaft portion 341 is passed through the through-hole 328 of the mid plate 311 from the through-hole 327 in the push-up plate 308. Thus, the distal end of the shaft portion 341 is inserted into the loading through-hole 24 of the loading member for electronic parts 23 positioned below the through-hole 328 to realize the state shown in FIGS. 52 to 54.

The state of loading the electronic parts 22 on the printed circuit board 21 using the above-described electronic part loading device 301 is hereinafter explained.

Figure 57:
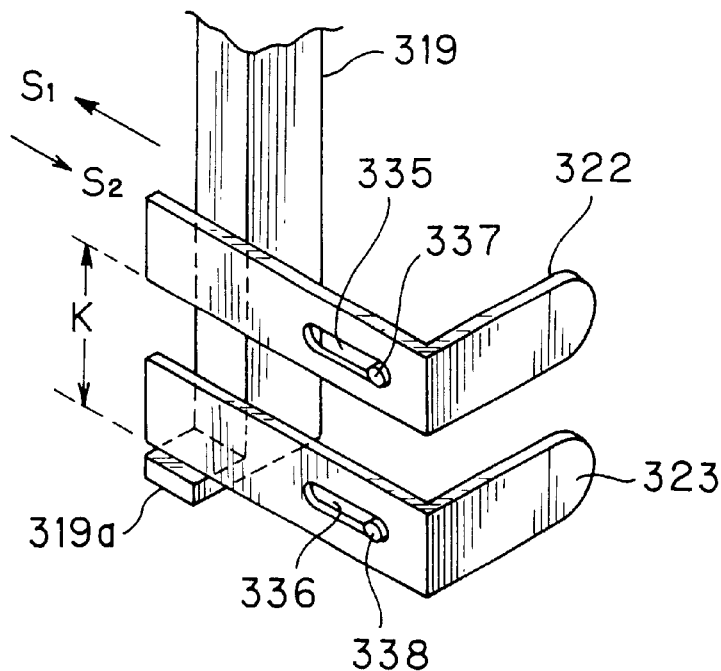
FIG. 57 is a perspective view showing upper and lower stoppers supporting a holder retention member.

First, the upper stop member 322 and the lower stop member 323 for holding the movable cabinet 303 in position are explained. Referring to FIG. 57, the upper stop member 322 and the lower stop member 323 are mounted on a cartridge holding plate 318 at a pre-set separation K from each other in the up-and-down direction, and are movable in the left-and-right direction indicated by arrows S1 and S2 in FIGS. 57 and 58, by engagement of guide pins 337, 338 in elongated holes 335, 336, within a range of the elongated holes 335, 336.

In order for the electronic part loading device 301 to mount the electronic parts 22 on the printed circuit board 21, the lower stop member 323 is positioned as shown in FIG. 57 so that the retainer 319a of the holder supporting piece 319 can be abutted against the lower end of the lower stop member 323.

Figure 58:
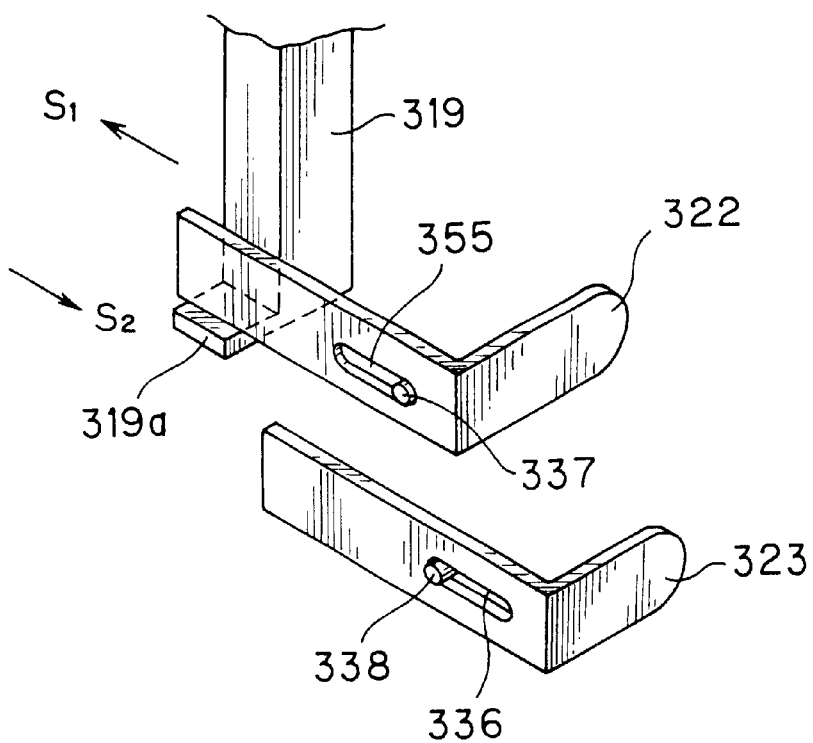
FIG. 58 is a perspective view showing the state of supporting the holder retention member.

In the mounting state, as later explained, that is when the push-up plate 308 is to be positioned in the mounting position shown in FIG. 52, only the lower stop member 323 is slid in the direction indicated by arrow S1 in FIG. 58, as shown in FIG. 58, to a position out of contact with the retainer 319a of the holder supporting piece 319, so that the retainer 319a can be abutted against the lower end of the upper stop member 322.

In the state in which the upper stop member 322 and the lower stop member 323 have been slid to positions out of contact with the retainer 319a, the movable cabinet 303 ceases to be operatively linked with the movement of the push-up plate 308, whilst the push-up plate 308 can be moved to a position above the mounting position shown in FIG. 52 to enable the push-up plate 308 and the top plate 306 to be exchanged, as will be explained subsequently.

Referring to FIGS. 59 to 67, the loading operation of the electronic parts by the electronic part loading device 301 will be explained on the basis of the relative positions of the upper stop member 322, lower stop member 323 and the holder supporting piece 319.

Figure 59:
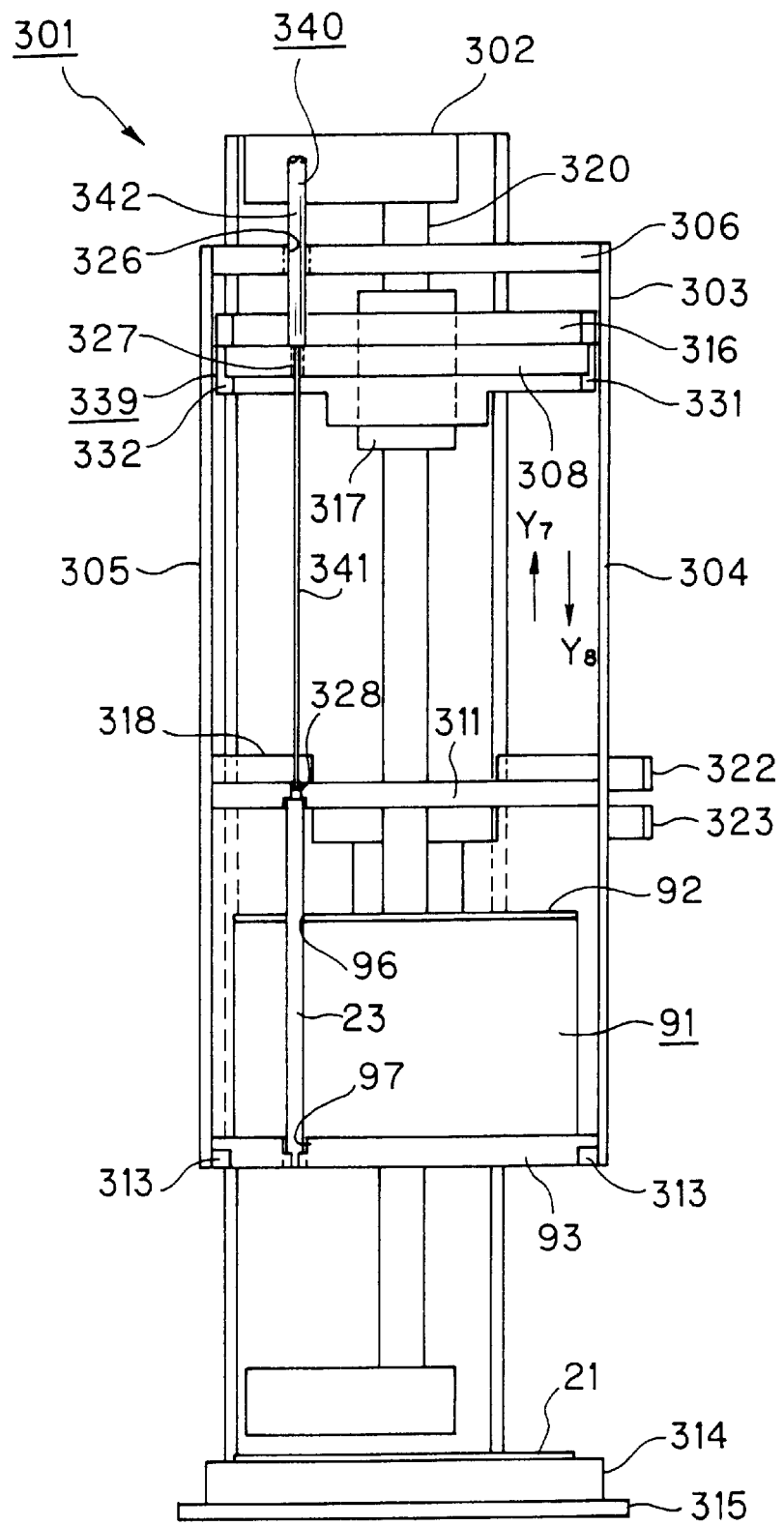
FIG. 59 is a front view showing the state in which the extruder rod enters an upper opening end of the loading member for electronic parts held by the loading member holder.
Figure 60:
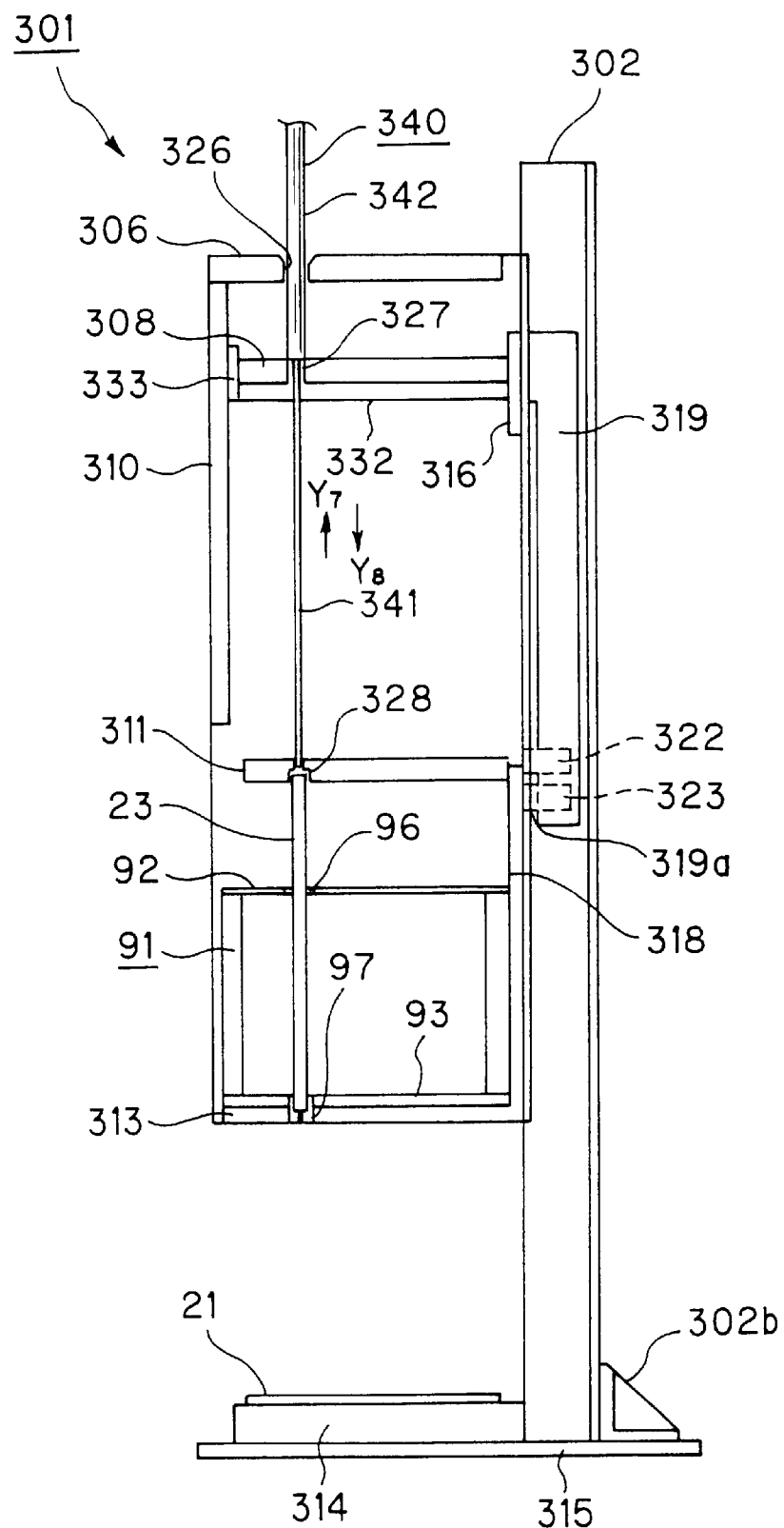
FIG. 60 is a side view thereof.

FIGS. 59 and 60 are a front view and a side view, respectively, showing the initial operating state (referred to hereinafter as the operating state 1) as the operation of loading the electronic parts 22 on the printed circuit board 21.

In the operating state 1, the push-up plate 308, supported by a plate holder 339, is positioned at the uppermost position, with respect to the cylindrical plate 316 moved in the up-and-down direction indicated by arrows Y7 and Y8 in FIGS. 59 and 60. It is noted that, when the operation of loading the electronic parts is performed, the retainer 319a of the holder supporting piece 319 can be abutted from the lower side against the lower stop member 323, as shown in FIG. 58. The holder supporting piece 319 is mounted on the cylindrical plate 316 and can be moved in the up-and-down direction along with the cylindrical plate 316. Thus, if the push-up plate 308 is at the uppermost position, the retainer 319a uplifts the 1323 from the lower side so that the movable cabinet 303 itself is also uplifted. The movable cabinet 303 also is uplifted to its uppermost position, as shown in FIGS. 59 and 60.

Figure 66:
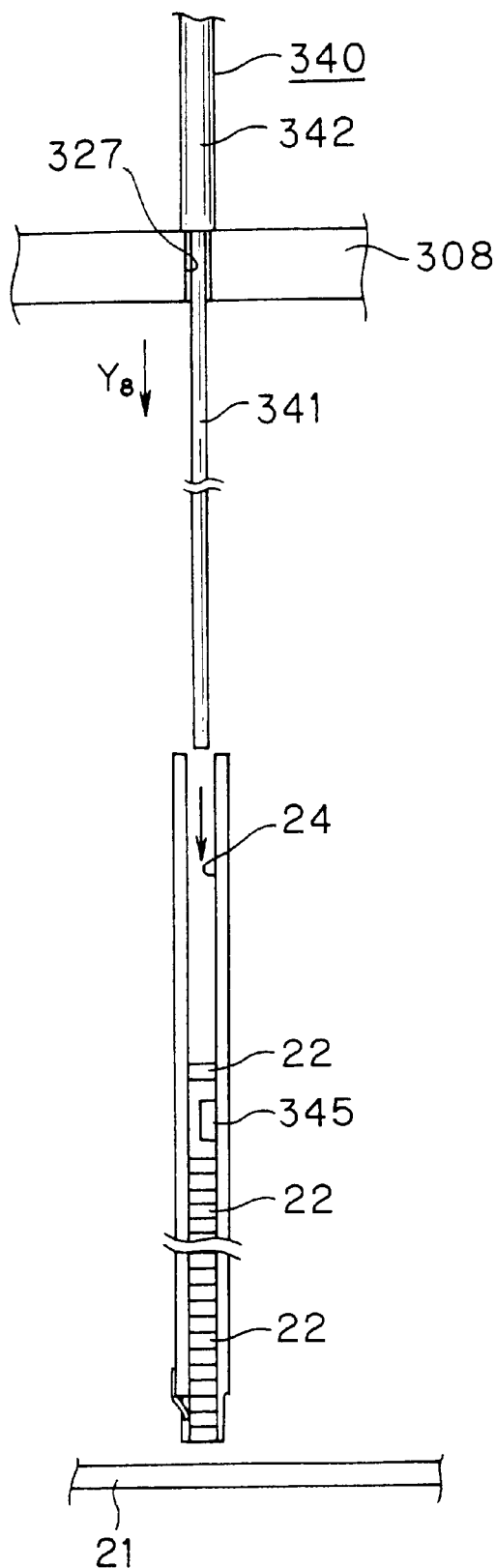
FIG. 66 is a cross-sectional view showing the state of extruding the electronic parts loaded on the loading member for electronic parts.

In the operating state 1, the push-up plate 308 is substantially at its uppermost position, so that the relative position between the extruder rod 340 and the loading member for electronic parts 23 is as shown in FIG. 66.

In FIG. 66, the state in which a large number of electronic parts 22 are loaded in a stacked state in the loading through-hole 24 of the loading member for electronic parts 23 is shown. In the stage in which the loading member for electronic parts 23 has been held first by the loading member holder 91, the number of the loaded electronic parts is larger than that shown in FIG. 66, such that the loading through-hole 24 of the loading member for electronic parts 23 is substantially filled with the electronic parts 22.

In the loading through-hole 24 of the loading member for electronic parts 23 are charged the electronic parts 22 and a detachment preventative member 345 for electronic parts 22. The detachment preventative member 345 is provided above the loaded electronic parts 22. The detachment preventative member 345 is formed of, for example, synthetic resin, and is sized to be lightly fitted into the loading through-hole 24. By the loading of the detachment preventative member 345 in the loading through-hole 24, it is supported by the electronic parts 22 loaded in the loading through-hole 24 to prevent the electronic parts 22 from incidental descent from the upper end opening of the loading through-hole 24.

On the lower end side of the loading member for electronic parts 23 is mounted the mechanism for prohibiting incidental descent of electronic parts 27 as described above. Since the electronic parts 22 in the lowermost position are supported by the mechanism for prohibiting incidental descent of electronic parts 27, the electronic parts 22 loaded in a stacked state in the loading through-hole 24 are prohibited from incidental descent from the loading through-hole 24.

Since the electronic parts 22 loaded in a stacked condition in the loading member for electronic parts 23 are supported by the mechanism for prohibiting incidental descent of electronic parts 27 and the detachment preventative member 345, the electronic parts are prohibited from incidental descent from the loading through-hole 24, even if the loading member for electronic parts 23 is tilted, while there is no risk of the arraying state from being dismayed in the loading through-hole 24.

Meanwhile, since the loading member for electronic parts 23 is handled in the upstanding state as shown in FIG. 66, the electronic parts 22 can be prevented from incidental descent from the upper opening end of the loading through-hole 24, so that there is no necessity of loading the detachment preventative member 345 in the loading through-hole 24 as in the case of the above-described electronic part loading device 201.

In the operating state 1 representing the initial state of loading the electronic parts 22 from the loading member for electronic parts 23 to the printed circuit board 21, the extruder rod 340 is retained by the upper peripheral edge of the through-hole 327 of the push-up plate 308, as shown in FIG. 66, with the shaft portion 341 being supported for facing the upper opening end of the loading through-hole 24.

Meanwhile, in the above-described operating state 1, the relative position between the lower end of the loading member for electronic parts 23 and the printed circuit board 21 is not that shown in FIG. 66. This relative position is obtained at the operating state 2 as now explained.

In the operating state 1, shown in FIGS. 59 and 60, the operator sets the printed circuit board 21, on which to load the electronic parts 22, on the substrate supporting portion 324 of the substrate supporting frame 314 arranged on the bottom plate 315. That is, the operating state I is that for mounting and exchange of the printed circuit board 21.

From the stand-by state, shown in FIGS. 59 and 60, the operator effectuates a first button actuating operation. By this button actuation, the cylinder mechanism is driven, so that the cylinder block 317 is actuated for moving the push-up plate 308 at a pre-set speed in the sequence of the uppermost position→(descent)→lowermost position (uplifting)→uppermost position.

Figure 61:
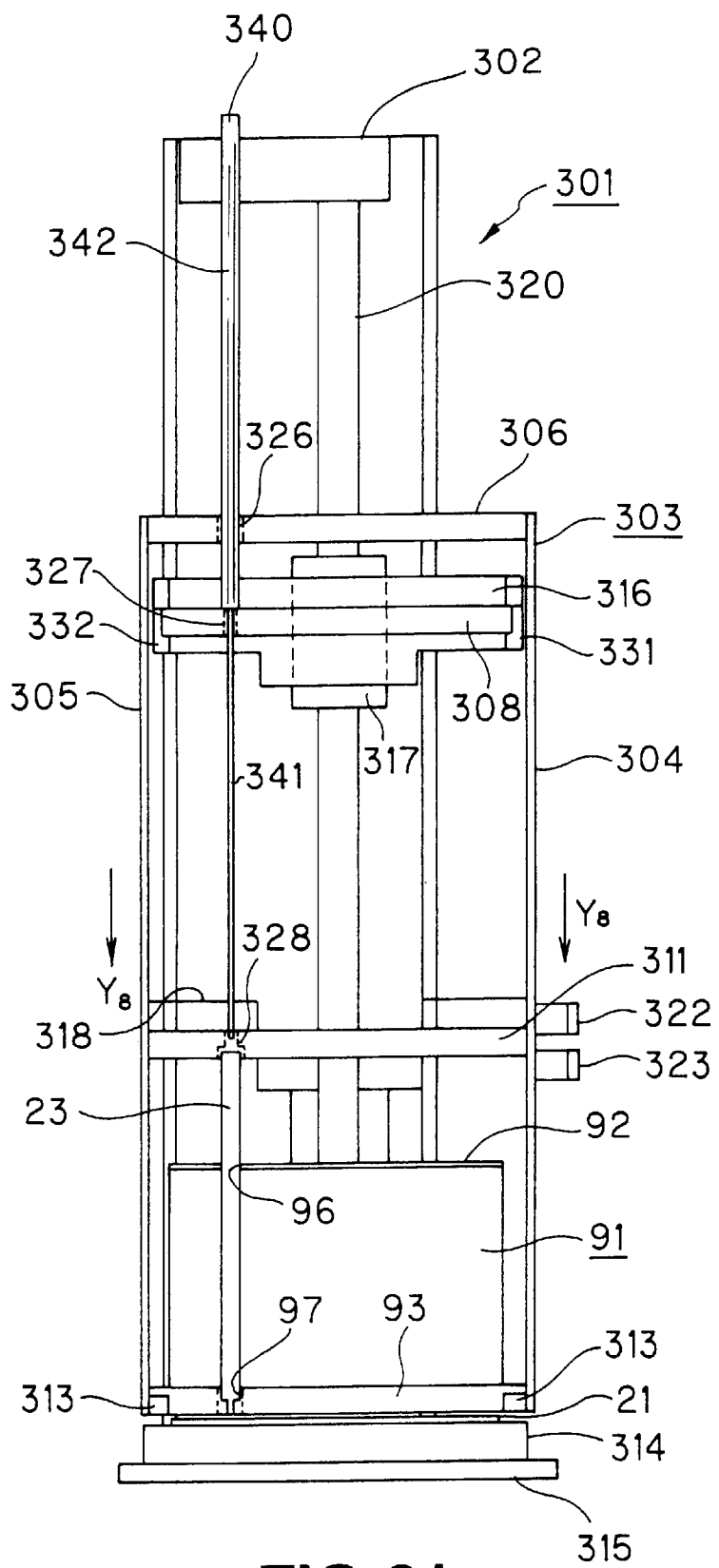
FIG. 61 is a front view showing the state in which the loading member holder has been secured to the printed circuit board and FIG. 62 is a side view thereof
Figure 62:
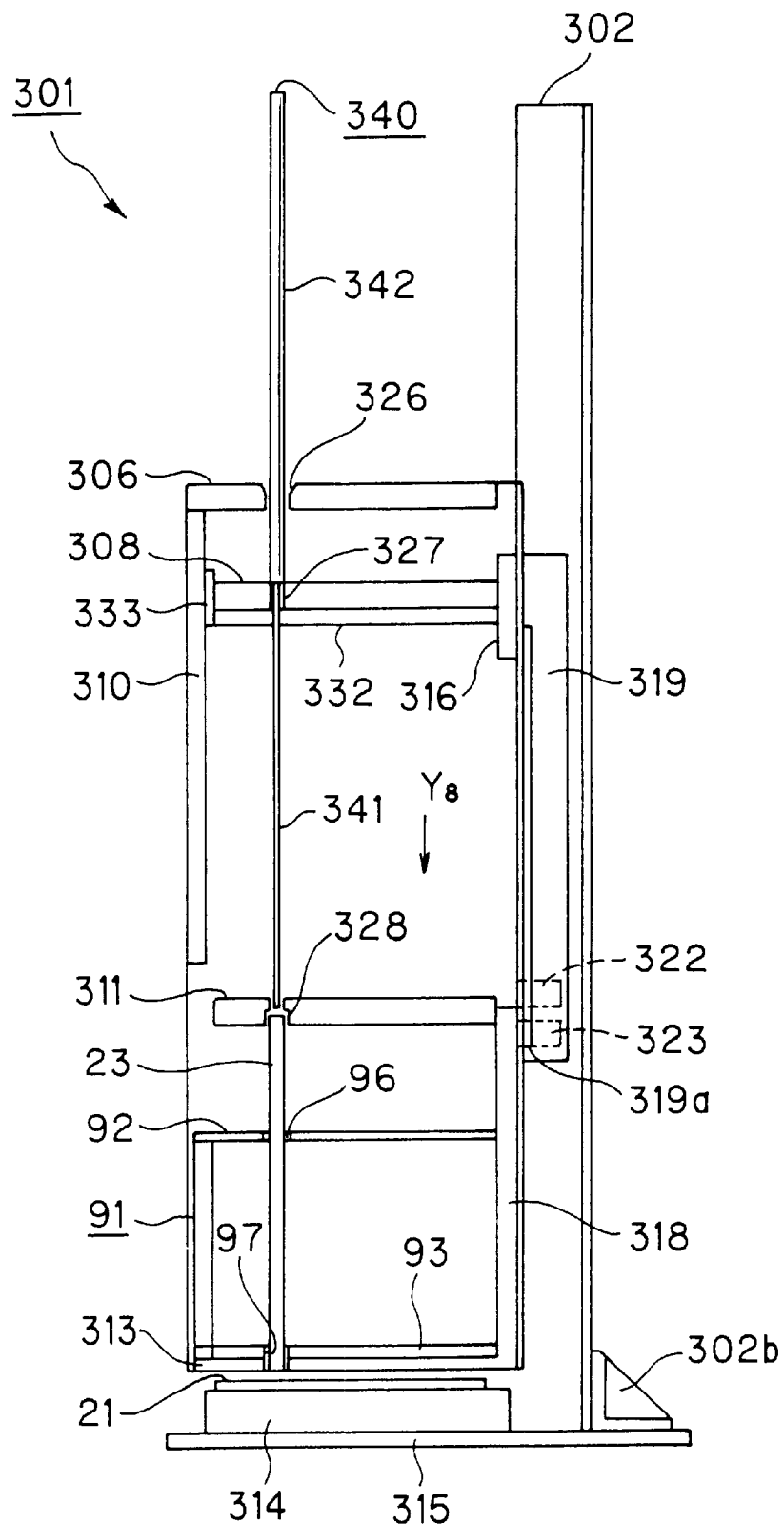

In the course of the movement by the driving of the cylinder mechanism from the above-described operating state 1 in the direction indicated by arrow Y8 in FIGS. 59 and 69, the 'operating state 2' shown in FIGS. 61 and 62 is reached.

The state shown in FIGS. 61 and 62 is such a state at a time juncture in which, with the lower stop 323 remaining supported by the holder supporting piece 319, the movable cabinet 303, lowered in an interlinked relation with the push-up plate 308, reaches the lowermost position, at the same time as the uplifting movement corresponding to the supporting state of the lower stop 323 by the holder supporting piece 319 has been cancelled.

In this state, the position of the push-up plate 308 with respect to the movable cabinet 303 is the uppermost position in the movable cabinet 303, so that the same state as that explained with reference to FIG. 66 is maintained. Also, in the operating state 2, the printed circuit board 21 faces the lower opening end of the loading member for electronic parts 23 at a pre-set separation therefrom, as shown in FIG. 66.

Figure 63:
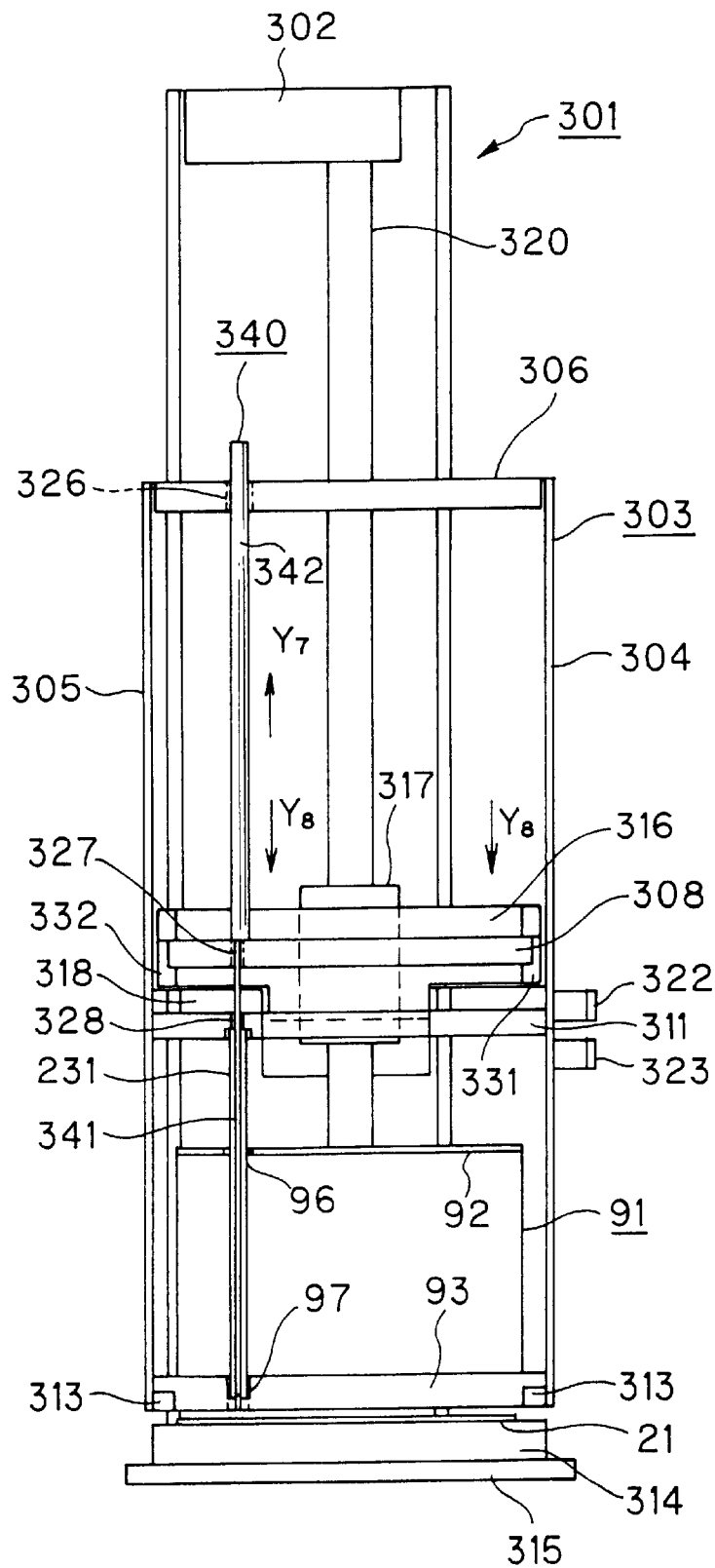
FIG. 63 is a front view showing the state n which the extruder rod has been inserted into the loading member for electronic parts for ejecting the electronic parts loaded on the loading member onto the printed circuit board and FIG. 64 is a side view thereof.
Figure 64:
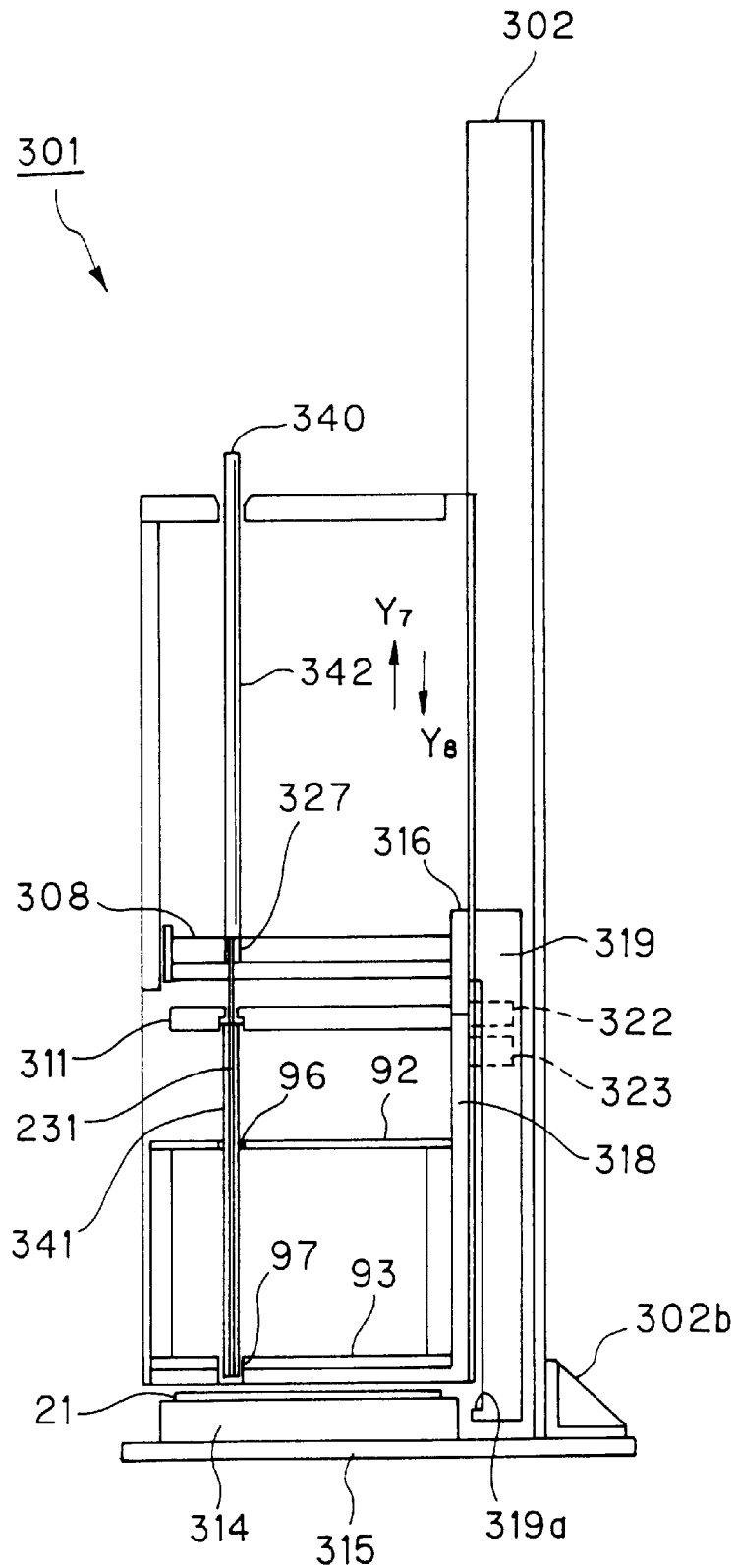
Figure 67:
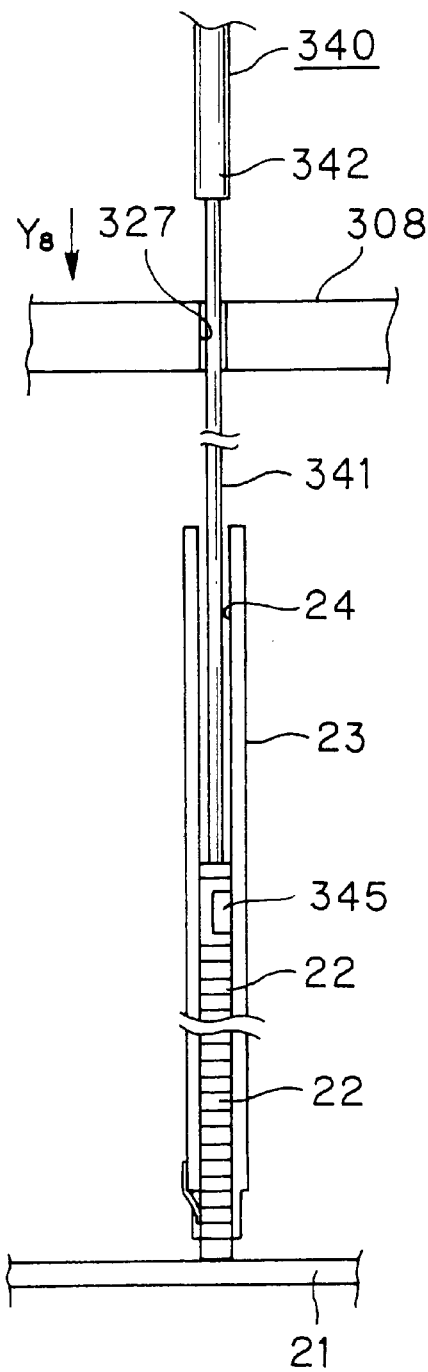
FIG. 67 is a cross-sectional showing the state of extruding the electronic parts loaded on the loading member for electronic parts by the extruder rod for setting the extruded electronic parts on the printed circuit board.

If the cylinder is further lowered in the direction indicated by arrow Y8 in FIGS. 61 and 62, only the push-up plate 308 is lowered in the direction indicated by arrow Y8 in FIGS. 63 and 64, while the movement of the movable cabinet 303 already at the lowermost position is controlled. If the push-up plate 308 is lowered, the extruder rod 340 is also lowered along with the push-up plate 308, so that the shaft portion 341 of the extruder rod 340 is inserted into the loading through-hole 24 of the loading member for electronic parts 23. If the push-up plate 308 is lowered, the distal end of the shaft portion 341 of the extruder rod 340 is abutted against the detachment preventative member 345 loaded at the uppermost position in the loading through-hole 24, as shown in FIG. 67. The push-up plate 308 is lowered further from the above state in the direction indicated by arrow Y8 in FIGS. 63 and 64. Since the distal end of the shaft portion 341 of the extruder rod 340 is abutted against the detachment preventative member 345, as shown in FIG. 67, the supporting state of the extruder rod 340 by the push-up plate 308 is annulled.

When the supporting state for the extruder rod 340 is annulled, the extruder rod 340 operates, under its own gravity and the force of inertia of the directly previous downward movement, for extruding the electronic parts stacked in the loading member for electronic parts 23 and the detachment preventative member 345 from the loading through-hole 24. When the extruder rod 340 thrusts the electronic parts 22, the sole electronic part 22 at the lowermost position of the loading through-hole 24 of the loading member for electronic parts 23 is ejected via the lower opening end of the loading through-hole 24 onto the printed circuit board 21. At this time, the electronic part 22 is thrust by the extruder rod 340 onto the printed circuit board 21.

Since the adhesive is coated by the above-described adhesive applying device 121 on the electronic part mounting portion 104 of the printed circuit board 21, the electronic part 22 ejected from the loading member for electronic parts 23 is bonded by the adhesive to the electronic part mounting portion 104.

When the push-up plate 308 has been lowered to its lowermost position, as shown in FIG. 67, the electronic parts 22 loaded in the totality of the loading members for electronic parts 23 inserted into and held by the loading member holder 91 are thrust by the extruder rod 340 and loaded one-by-one on the printed circuit board 21. That is, the set of the electronic parts 22 mounted on the sole printed circuit board 21 can be loaded simultaneously by a sole uplifting/lowering operation of the push-up plate 308.

For optimally loading the electronic parts 22, loaded on the loading member for electronic parts 23, on the printed circuit board 21, the weight of the extruder rod 340 is set taking into account the frictional force when the detachment preventative member 345 loaded in the loading through-hole 24 descends in the loading through-hole 24, weight of the electronic parts 22 that can be loaded in the loading member for electronic parts 23, and the elastic force of the detachment preventative piece 28 of the mechanism for prohibiting incidental descent of electronic parts 27. This weight can be adjusted by modifying the length or diameter of the weighted portion 342 as described above.

When the push-up plate 308 has descended to its lowermost position, the set of electronic parts 22 mounted on the sole printed circuit board 21 is arranged on each electronic part mounting portion 104 of the printed circuit board 21. These electronic parts 22, mounted on the electronic part mounting portion 104, are bonded and provisionally secured in position by the adhesive applied to the electronic part mounting portion 104. The state in which the push-up plate 308 is lowered to its lowermost position is referred to herein as 'operating state 3' and shown in FIGS. 63 and 64.

Although no electronic parts are loaded on the loading member for electronic parts 23 in FIGS. 63 and 64 for convenience of illustration, the extruder rod 340 is at a correspondingly higher position than that shown in FIGS. 63 and 64 if there is left any electronic part(s) in the loading member for electronic parts 23.

After the above-described operating state 3, the push-up plate 308 is automatically moved to its uppermost position as indicated by arrow Y7 in FIGS. 63 and 64. That is, the up-and down reciprocating movement of the push-up plate 308 by the cylinder accompanying the sole loading operation for the electronic parts 22 comes to a close when the operating state 1 is entered after shifting from the operating state 3 to the operating state 2. During this process, the extruder rod 340 is supported by the push-up plate 308 to annul the state of thrusting of the electronic parts 22 loaded in the loading through-hole 24 of the loading member for electronic parts 23.

When the sole loading operation of the electronic parts 22 on the printed circuit board 21 comes to a close and the electronic part loading device 301 reaches the above-described operating state 1, the operator dismounts the printed circuit board 21, now loaded with the electronic parts 22, from the substrate supporting frame 314, and arrays the printed circuit board 21 of the same sort, on which to load the electronic parts 22 newly, on the substrate supporting frame 314. After arranging the printed circuit board 21 newly on the substrate supporting frame 314, the series of operations of loading the electronic parts 22 on the next printed circuit board 21 of the same sort are carried out automatically, subject to the sole button actuation, as explained previously. The electronic parts 22 can then be loaded sequentially on the printed circuit board 21 by the repetition of the above-described operations.

Meanwhile, as the loading operations of the electronic parts 22 on the printed circuit board 21 are repeated, there is produced disparity in the stacking width of the electronic parts 22 loaded on the respective loading members for electronic parts 23 due to difference in thickness of the electronic parts 22. With the present electronic part loading device 301, since the extruder rods 340 are arranged independently for the respective loading members for electronic parts 23 for extruding the electronic parts 22, the electronic parts 22 can be thrust and scanned at a constant force at all times regardless of the degree of disparity in the stacking width of the electronic parts 22 to render it possible to absorb the disparity in the stacking width of the electronic parts 22 to load the electronic parts 22 optimally on the printed circuit board 21 at all times.

In the present electronic part loading device 301, there occur the movement of approaching the loading member holder 91 to the mounting surface of the electronic parts 22 on the printed circuit board 21 to such an extent as to enable loading of the electronic parts 22 and the movement of approaching the push-up plate 308 towards the upper surface of the loading member holder 91 in succession to the first-stated movement for inserting the electronic parts 22 in the loading through-hole 24 of the loading member for electronic parts 23 by the shaft portion 341 of the extruder rod 340. These two movement operations are effectuated in a sole-action process of the sole cylinder mechanism moving from above towards below without using a cylinder mechanism comprised of two independent driving units.

This eliminates the necessity of performing the operation of turning on the operation of the driving mechanism responsive to each of the two movement operations, or the control operation. Instead, it suffices to actuate the cylinder mechanism for a sole reciprocating movement, in which the movement from the lowermost position to the uppermost position is an operation of restoring the cylinder mechanism to its initial state. Also, since a sole driving mechanism suffices, the apparatus itself is simplified, whilst there is no necessity of controlling the driving timing of plural cylinders.

If the electronic parts 22 are loaded on a number of the printed circuit boards 21 of the same sort, it is desirable to provide plural loading member holders 91 associated with the type of the printed circuit board 21. That is, if, in the course of the repeated loading operations for the electronic parts 22 on the printed circuit board 21, the electronic parts 22 in the loading members for electronic parts 23 loaded on the electronic part loading device 301 are well-nigh depleted, the loading member holder 91 in which the electronic parts 22 are well-nigh depleted is relaced by the loading member holder 91 having the loading members for electronic parts 23 carrying a sufficient number of the electronic parts 22 in order to re-initiate the loading operation. With the present electronic part loading device 301, this exchanging operation can be performed for each of the loading member holders 91 holding a set of the loading members for electronic parts 23, each carrying a set of electronic parts 22 to be mounted on the sole printed circuit board 21, and hence the replenishing operation can be carried out efficiently.

The exchanging operation of the electronic part loading device 301 carrying the loading member holders 91 is hereinafter explained.

For loading the loading member holders 91 on the electronic part loading device 301, the lower stop member 323 is slid out of the engagement position with the retainer 319a so that the retainer 319a of the holder supporting piece 319 can be abutted against the upper stop member 322, as shown in FIG. 58. In this state, shown in FIG. 58, the push-up plate 308 is moved to substantially the uppermost position so that the movable cabinet 303 is uplifted by engagement of the upper stop member 322 with the retainer 319a.

In this case, since the movable cabinet 303 is supported and uplifted at a position higher than that at the time of loading the electronic parts 22 on the printed circuit board 21, the push-up plate 308 is positioned in the movable cabinet 303 at a point higher by the distance K, see FIG. 57, than that for the usual operation. Therefore, the separation between the push-up plate 308 and the mid plate 311 is also separated by the above-mentioned distance K. This shifts the distal end of the shaft portion 341 of the extruder rod 340 well above the through-hole 328 of the mid plate 311.

Figure 65:
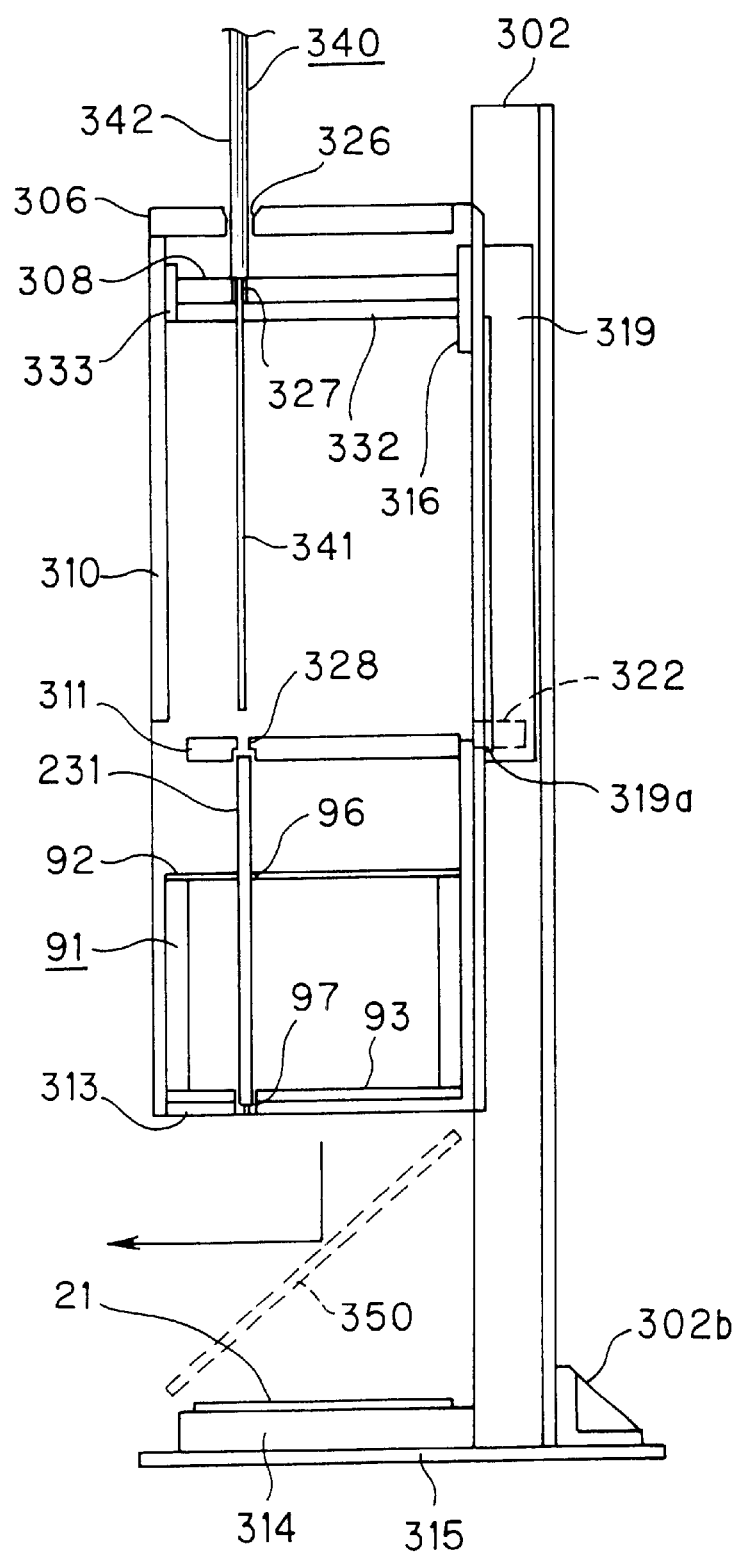
FIG. 65 is a side view showing the state of loading the loading member holder on the loading device for electronic parts.

In this state, shown in FIG. 65, the operator dismounts the loading member holder 91, so far loaded in the electronic part loading device 301, along with the mid plate 311 mounted thereabove, and puts the loading member holder 91, newly carrying the mid plate 311, on the holder supporting frame 313.

If both the upper stop member 322 and the lower stop member 323 have been dismounted from the engagement positions with the retainer 319a of the holder supporting piece 319, the retainer is completely disengaged, so that the movable cabinet 303 is set free in its supported state and is at the uppermost position. Conversely, the push-up plate 308 can keep its uppermost position, as shown in FIG. 65, so that the push-up plate 308 can be dismounted from the movable cabinet 303 such as by uplifting the top plate 306 from its lower side. In this state, the push-up plate 308 and the top plate 306 can be exchanged, if need be.

If the operator desires to view the lower side of the loading member holder 91, a mirror 350 is set at substantially an angle of 45°, between the substrate supporting frame 314 and the loading member holder 91, with the movable cabinet 303 being set to substantially its uppermost position, as indicated by a broken line in FIG. 65. In this case, the operator can perform visual check easily because he or she is not compelled to take a forced attitude for directly viewing the lower surface of the loading member holder 91 and, in addition, an image on the mirror 350 is reversed in orientation with respect to the object, and hence the image permits visual position association with the actual printed circuit board.

The uplifting/lowering of the push-up plate may be designed to be manually carried out by the operator, in which case the cylinder driving mechanism can be omitted thus correspondingly simplifying the device structure.

The above-described electronic part loading device 301 can cope not only with printed circuit boards 21 of the specified sort, but also with printed circuit boards of different sorts. That is, it suffices if the top plate 306, push-up plate 308, mid plate 311 and the substrate supporting frame 314, having through-holes in register with the mounting positions o the electronic parts to be mounted on the printed circuit boards of different sorts, are readied, and are exchangeably mounted in the electronic part loading device 301 by the above-described procedure, and if the loading member holders 91 used are constructed for different sorts of the printed circuit boards.

If it is necessary to have an extremely large number of electronic parts loaded on the printed circuit boards of the sole type, it suffices if plural top plates 306, push-up plates 308, mid plates 311 and the substrate supporting frames 314, having different mounting positions for the electronic parts, are readied for the printed circuit boards of the sole type, and the sorts of the top plates 306, push-up plates 308, mid plates 311 and the substrate supporting frames 314 are exchanged for each group of a fairly large number of the printed circuit boards, in the course of the operation of loading the electronic parts 22 on the printed circuit boards 21. That is, it suffices if the top plates 306, push-up plates 308, mid plates 311 and the substrate supporting frames 314, having through-holes formed in association with the printed circuit boards of different types, are readied, and mounted in an exchanging fashion on the electronic part loading device 301 by the above-described procedure, and the loading member holders 91 used are constructed in association with the printed circuit boards of different types.

If it is necessary to have an extremely large number of electronic parts loaded on the printed circuit boards of the sole type, it suffices if plural top plates 306, push-up plates 308, mid plates 311 and the substrate supporting frames 314, having different mounting positions for the electronic parts, are readied for the printed circuit boards of the sole type, and the sorts of the top plates 306, push-up plates 308, mid plates 311 and the substrate supporting frames 314 are exchanged for each group of a fairly large number of the printed circuit boards, in the course of the operation of loading the electronic parts 22 on the printed circuit boards 21.

The push-up plate 308 may be fixed in the movable cabinet 303 while the unit of the loading member holder 91 and the mid plate 311 and the substrate supporting frame 314 may be movable by a cylinder. For example, the substrate supporting frame 314 may be driven by the cylinder and the unit of the loading member holder 91 and the mid plate 311 may be uplifted from the lower side to approach the unit towards the fixed push-up plate 308.

With this structure, the operation shown in FIGS. 66 and 67 is relatively realized to effect the loading of the electronic parts 22 on the printed circuit board 21.

The electronic parts 22, loaded by the electronic part loading device 201 or 301 on the printed circuit board 21, are provisionally secured by an adhesive applied to the printed circuit board. The electronic parts 22, provisionally secured to the printed circuit board 21, are electrically and mechanically connected to the printed circuit board 21 using a curing oven. If the printed circuit board 21 carrying the electronic parts 22, is charged into the curing oven, the solder previously coated on the electronic parts 22 is fused so that the electronic parts 22 are electrically and mechanically connected to the electronic part mounting portion 104 of the printed circuit board 21. The series of operations of mounting the electronic parts comes to a close when the electronic parts 22 are connected by the solder to the printed circuit board 21.

Although the preferred embodiments of the present invention have been explained with reference to the drawings, the present invention is not limited to the specific embodiments disclosed and may be broadly modified on the basis of the technical concept of the invention.

Industrial Applicability

In the method and apparatus for loading electronic parts according to the present invention, plural electronic parts to be mounted on a printed circuit board are arranged as a set and loaded in a loading member for electronic parts. A set of such loading members for electronic parts, each carrying a set of electronic parts of the same type, are arrayed in a loading member furnishing casing. This set of the loading members for electronic parts, arrayed and held in the loading member furnishing casing, is inserted and held by a loading member holder by which the set of the loading members for electronic parts can be held in register with an electronic part mounting portion of the printed circuit board. The loading member holder holding the set of the loading members for electronic parts is loaded on an electronic part loading device. The set of the electronic parts held by the loading member holder is loaded at a time on the sole printed circuit board by the electronic part loading device. Plural sorts of plural electronic parts can be loaded correctly without error at the mounting positions on the sole printed circuit board.

Also, in the method and apparatus for loading electronic parts according to the present invention, a loading member holder suited to the shape of the printed circuit board for mounting the electronic parts is readied, and the loading device of electronic parts is modified in structure to suit to the loading member holder in order to mount the electronic parts on plural sorts of the printed circuit boards, thus simplifying the control of the operation of the mounting apparatus for electronic parts to enable the electronic parts to be mounted on the printed circuit boards of different types without employing a large-sized control device.

What is claimed is:

1. A loading apparatus for electronic parts comprising:
  a loading member holding unit for holding a plurality of loading members for electronic parts, each of said plurality of loading members having a loading through-hole extending in the up-and-down direction for loading a plurality of electronic parts to be mounted on a printed circuit board and each having a detachment preventative unit for prohibiting incidental descent of the electronic parts from the loading through-hole, said plurality of electronic parts being loaded in a stacked state in groups of the same kind, said loading member holding unit also for holding an electronic part storage unit in which are stored a plurality of electronic parts of specified types to be loaded on said loading members for electronic parts in a pre-set configuration, so that a pre-set relative position will be maintained therebetween;

an electronic part loading unit for loading the plurality of electronic parts taken out from the electronic part storage unit in said loading members for electronic parts by inserting the electronic parts into said loading through-holes; and an electronic part supporting unit for supporting at least one electronic part previously inserted by the electronic part loading unit into the loading through-hole of the loading member for electronic parts and positioned at a loading position in the vicinity of an inlet end of the loading through-hole.

2. The loading apparatus for electronic parts as recited in claim 1 wherein a part holder holding the electronic parts stored in said electronic part storage unit carries identification symbols associated with identification symbols applied to the plurality of loading members for electronic parts loaded with electronic parts.

3. The loading apparatus for electronic parts as recited in claim 1 further comprising:

a guide unit for guiding the electronic parts held by said electronic part loading unit to an opening end of the loading through-hole of the loading member for electronic parts.

* * * * *